(12) United States Patent
Hidaka et al.

(10) Patent No.: US 7,554,795 B2
(45) Date of Patent: Jun. 30, 2009

(54) ELECTRONIC COMPONENT

(75) Inventors: Akio Hidaka, Miyazaki (JP); Shouichi Ikebe, Miyazaki (JP); Yuuichi Murano, Miyazaki (JP); Hirozumi Kazitani, Miyazaki (JP); Mika Ikeda, Miyazaki (JP); Yoshitaka Mizoguchi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 248 days.

(21) Appl. No.: 11/597,880

(22) PCT Filed: Jun. 3, 2005

(86) PCT No.: PCT/JP2005/010622

§ 371 (c)(1),
(2), (4) Date: Nov. 29, 2006

(87) PCT Pub. No.: WO2005/120143

PCT Pub. Date: Dec. 15, 2005

(65) Prior Publication Data

US 2008/0024960 A1    Jan. 31, 2008

(30) Foreign Application Priority Data

Jun. 3, 2004 (JP) .............................. 2004-165279
Jun. 23, 2004 (JP) .............................. 2004-184737
Jun. 23, 2004 (JP) .............................. 2004-184738

(51) Int. Cl.
*H01G 9/15* (2006.01)

(52) U.S. Cl. .................... 361/529; 361/306.1; 361/523; 361/525; 361/528; 361/534

(58) Field of Classification Search ............. 361/306.3, 361/306.1, 302–305, 321.1, 321.2, 523–525, 361/528–534; 29/25.01, 25.03
See application file for complete search history.

(56) References Cited

U.S. PATENT DOCUMENTS

| | | | | |
|---|---|---|---|---|
| 5,349,496 A | * | 9/1994 | Taniguchi et al. | 361/528 |
| 6,307,735 B1 | * | 10/2001 | Saito et al. | 361/517 |
| 6,411,498 B2 | * | 6/2002 | Nakamura | 361/523 |
| 6,477,030 B2 | * | 11/2002 | Hidaka et al. | 361/301.3 |
| 2005/0117278 A1 | | 6/2005 | Suenaga et al. | |

FOREIGN PATENT DOCUMENTS

| | | |
|---|---|---|
| EP | 1081761 | 3/2001 |
| JP | 2001110691 | 4/2001 |
| JP | 2001250746 | 9/2001 |
| JP | 2002043170 | 2/2002 |
| JP | 2003272962 | 9/2003 |

OTHER PUBLICATIONS

PCT International Search Report dated Sep. 23, 2005.

* cited by examiner

*Primary Examiner*—Nguyen T Ha
(74) *Attorney, Agent, or Firm*—Dickinson Wright, PLLC

(57) ABSTRACT

An electronic component has an element, a pair of terminal portions which are disposed on the element, and an external covering material which covers a part of the terminal portions and the element. The electronic component is configured such that inclined portions are disposed on corner portions of a bottom surface and side surfaces of the external covering material, and the terminal portions are protruded from corner portions where the inclined portions and the bottom surface of the external covering material intersect.

24 Claims, 62 Drawing Sheets

ELECTRONIC COMPONENT

TECHNICAL FIELD

This invention relates to an electronic component which is suitably used for an electronic device such as a modem, a power supply circuit, a power supply for liquid crystal, a DC-DC converter, and an electric power line communication device.

BACKGROUND ART

In an electronic device such as a modem and a power supply circuit, a number of electronic components are mounted. For example, there are many cases in which a capacitor is used for the purpose of noise removal, cut of a direct current component, and so on.

Here, miniaturization, realization of low cost are requested for electronic devices, and along with this, also as to electronic components, miniaturization, realization of low cost are requested. Furthermore, there are many cases in which surface mounting electronic components are desired for the purpose of reduction of mounting cost due to automatic mounting and reduction of a mounting area. On one hand, there occurs many cases in which conflicting specifications such as realization of high performance, reduction of characteristic fluctuation, and what is more, improvement of endurance are requested, in concert with miniaturization.

Furthermore, along with realization of multiple pins for LSI etc. and an increase of bit number of a signal line, there arises the need of high-density mounting for mounting a plurality of electronic components in such a place that a line interval is very narrow.

In particular, there are many cases in which two lines for data input and data output are paired in a modem etc., and there is need to surely mount two electronic components on a line.

In order to satisfy these, electronic components, which were worked out variously, have been proposed (e.g., see, JP-A-2001-110691 publication, JP-A-2002-43170 publication).

In particular, as descried in the above-described patent documents, it was carried out to raise breakdown voltage by covering an element with an external covering material such as resin in order to respond to high breakdown voltage, and to improve endurance, heat resistance, and moisture resistance, and so on, in electronic components.

However, in this case, there is need to form the external covering material by use of a metal mold etc., and there are many cases taking such a configuration that two pieces of the formed external covering materials are bonded, and lead terminals are protruded from a laminated surface thereof, and so on. However, in the suchlike configuration, there were many cases in which the number of man-hours for production thereof becomes large, and cost becomes expensive. In addition, terminal portions and lead terminals are to be protruded from a midstream portion of a side surface of the external covering material, and therefore, there was such a case that it takes cost for fine adjustment thereof, and so on.

In order to respond to this, an electronic component, which is manufactured by putting a thing which is in such a state that terminal portions, or lead terminals were connected to an element, in a frame, pouring resin etc. in this frame, and sealing it as an external covering material, has been proposed.

FIGS. 41 and 42 are side views of an electronic component in relevant art, and it is of a shape as a result of taking a manufacturing method as described above, and there is such a merit that it can be manufactured at low cost.

1100 designates an electronic component, and 1101 designates an element which includes various things such as a capacitor (single plate capacitor, multilayered capacitor etc.), a resistor, a coil, a filter, and other electronic devices. 1102 designates an internal electrode in case that the element is the multilayered capacitor, and 1103 designates an external electrode, and 1104 designates a lead terminal, and 1105 designates an external covering material. Meanwhile, the lead terminals 1104 which are connected to the element 1101 and protruded from the external covering member 1105, are called as terminal portions in case that they are directly connected to the element, and terminals, which are further connected to the terminal portions directly connected to the element, are called as lead terminals, but there is no rigid distinction there, and they are similar things.

As apparent from FIG. 41, in the electronic component 1100 which was externally covered by pouring resin in a frame in order to realize low cost as described above, the lead terminals 1104 thereof become of such a shape that they are protruded from corner portions of a bottom surface and side surfaces of the external covering material 1105 to an outside.

However, in electronic components in relevant art as represented in FIG. 41, terminal portions and the lead terminals 1104 are protruded from the corner portions of the bottom surface and the side surfaces of the external covering material 1105, and therefore, there is no allowance (margin) between the external covering material 1105 and the lead terminals 1104 etc., and there was such a problem that flexure resistance against vibration and shock from an outside after mounting is weak.

In addition, as a matter of course, there is no capacity to deal with shock etc., and therefore, the shock is concentrated on the external covering material 1105, a mounting solder portion etc., and there was such a problem that endurance etc. are weak such as there occurring damage such as cracks, and so on.

In addition, as shown in FIG. 42, it becomes easy for warpage and bending to be generated on the lead terminal 1104 which was protruded to an outside, and there occurred such a problem that mounting to a substrate becomes difficult, and mounting reliability becomes low.

In addition, in order to manufacture at low cost, such a thing that the lead terminals 1104 were connected to the element 1101 is placed in a metal mold etc., and melted resin etc. is poured into an inside of this metal mold, and thereby, it is molded, but in the suchlike manufacturing method, there is need to place it in a metal mold in such a state that the lead terminals 1104, which are protruded, were raised upwardly, i.e., in such a state that it was reversed, and to pour resin etc. therein. On this account, it is difficult to have the lead terminals 1104 protruded from side surfaces. Alternatively, in order to have them protruded from side surfaces and further to make allowance (margin) hold between the protruded lead terminals 1104 and the external covering material 1105, there is need to fold back the lead terminals 1104 intricately in advance, and therefore, there was also such a problem that adjustment etc. become complex, and low cost is not realized.

As above, in a method of pouring resin in the element 1101 and the lead terminals 1104 which were placed in a frame to realize external covering, for electronic components in relevant art, reduction of the number of man-hours, fine adjustment after the fact etc. are unnecessary, and therefore, it is possible to realize low cost, but there was such problems that capacity to deal with flexure of lead terminals becomes weak, and endurance and shock resistance become low, and mounting reliability and shape holding performance at the time of transport become low, and so on. On this account, there was such a problem that electronic components are insufficient from the view point of actual practical use.

Further, in electronic components in relevant art as represented in FIG. 41, it becomes very high temperature on the occasion of pouring melted resin, and therefore, there was such a problem that the internal electrode 1102 of the multi-layered capacitor 1106 is melted, damaged and so on. Also in case of automatically mounting the electronic component 1100 by re-flow etc., it becomes high temperature in the same manner, and therefore, melt and damage of the internal electrode 1102 became a problem. On this account, it was requested to use the internal electrode 1102 to which high temperature countermeasure is applicable.

In addition, in the electronic component represented in FIG. 41 in relevant art, unlike a case of sealing with the external covering material by a method of transfer mold etc., the lead terminal 1104 is not protruded from a side surface of the external covering material 1105 and a protruded portion of the side surface to an outside, and therefore, there was such a problem that shock resistance and endurance, flexure resistance of the lead terminal 1104 are weak.

On this account, there is such a problem that reliability at the time of manufacture, transport and mounting, and after mounting is weak, and there was such a problem that electronic components are insufficient from the view point of actual practical use.

DISCLOSURE OF THE INVENTION

The invention of claim 1 is an electronic component, Comprising, an element, a pair of terminal portions which are disposed on the element and folded back so as to enable surface mounting, and an exterior covering member which covers a part of the terminal portions, wherein the pair of terminal portions are protruded from a bottom surface of the external covering material, respectively.

The invention can realize an electric component in which breakdown voltage, shock resistance, endurance, moisture resistance were improved by sealing an element with an external covering material.

In addition, a terminal portion and a lead terminal are protruded from a bottom surface of an external covering material, and thereby, there occurs allowance (margin) between the external covering material and the terminal portion (lead terminal), and it is possible to improve flexure resistance after mounting.

An invention, which is described in the claim 24 of the invention, is a manufacturing method of an electronic component, characterized by having a process of placing an element, a process of connecting the element to a pair of terminal portions, a process of placing the element to which the terminal portions were connected, in a metal mold, a process of pouring a melted external covering material into the metal mold, up to such level that the terminal portions are protruded from a bottom surface of the external covering material, and a process of solidifying the poured external covering material, and it is possible to manufacture an electronic component which has strong flexure resistance easily at low cost.

BEST MODE FOR CARRYING OUT THE INVENTION

Hereinafter, embodiments of the invention will be described by use of drawings.

FIGS. 1, 2, 3, 4, 5, 6, 7, 8, 9, 10, 11, 12, 13, 18, 19, 20, 21, 22, 23, 24, 25, 26, 27, 28, 29, 30, 31, 32, 33, 38, 39, and 40 are side views of electronic components in embodiments of the invention, and FIGS. 14, 15, 16, 17, 34, 35, 36, and 37 are top views of the electronic components in the embodiments of the invention.

FIGS. 1 through 20 represent such a configuration that terminal portions are connected to an element which is various electronic devices such as a capacitor (single plate, stacked, electrolytic etc.), a resistor, an inductor, a filter, and IC, and they are molded with an external covering material, and a part of the terminal portions are protruded to an outside of the external covering material, and various reinforcing materials are disposed.

On one hand, FIGS. 21 through 41 represents such a configuration that, as an internal element, a multilayered capacitor is mainly represented as one example of the element, and terminal portions are connected to the multilayered capacitor, and a pair of lead terminals are connected to the terminal portions, and they are molded with an external covering material, and a part of the lead terminals are protruded to an outside, and various reinforcing materials are disposed. A configuration which is represented from FIG. 1 through FIG. 20, and a configuration which is represented from FIG. 21 through FIG. 40 are almost corresponding configurations, except for such a matter that the element is the multilayered capacitor and the lead terminals are connected, and hereinafter, according to need, explanations will be overlapped, and in case that there are main overlaps, they will be omitted.

1 designates an electronic component, and 2 designates an element, and 3 designates an electrode, and 4 designates a terminal portion, and 5 designates an external covering material, and 6 designates a multilayered capacitor, and 7 designates an internal electrode, and 8 designates a lead terminal, and 9 designates a bottom surface, and 10 designates an inclined portion, and 11 designates an intersect corner portion, and 12 designates a dent portion, and 15 designates a curved surface portion, and 16 designates a folded portion, and 17 designates a wavy portion, and 30 designates a distance, and the curved surface portion 15, the folded portion 16, and the wavy portion 17 are represented as an example of a flexure absorbing portion.

Firstly, with respect to each figure, in a configuration of the electronic component 1, features of the configuration which is represented in each figure respectively and advantages thereof will be briefly described.

Figure 1:
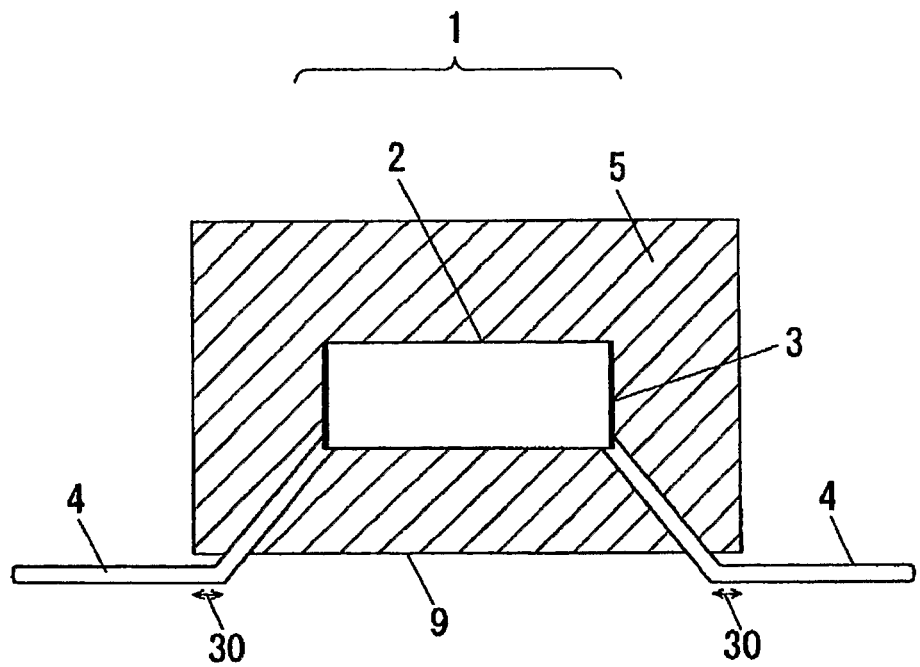
FIG. 1 is a side view of an electronic component in an embodiment of the invention.

FIG. 1 shows such a configuration that the terminal portions 4 are protruded from the bottom surface 9, and the distance 30 between positions where they are protruded and corner portions of a bottom surface and side surfaces of the external covering material 5. By the suchlike configuration, there occurs allowance (margin) between the terminal portions 4 which are protruded from the external covering material 5, and the external covering material 5, and flexure resistance is improved.

Figure 2:
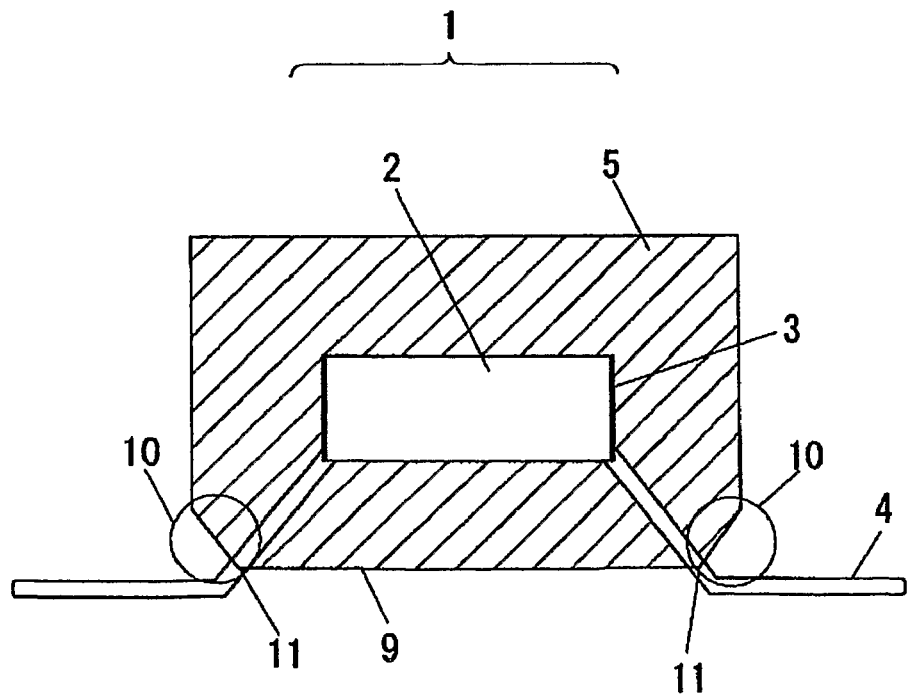
FIG. 2 is a side view of an electronic component in an embodiment of the invention.

FIG. 2 shows such a configuration that the inclined portions 10 are disposed on the corner portions of the bottom surface 9 and the side surfaces of the external covering material 5, and the terminal portions 4 are protruded from the corner portions where these inclined portions 10 and the bottom surface 9 intersect. In particular, it has such a surface mountable configuration that they are once protruded to a lower side, and then, folded back in a roughly L-letter shape. By the suchlike configuration, the terminal portions 4 are to be protruded from most projected portions of the bottom surface 9, and it becomes possible to secure a distance of the terminal portions 4 which are protruded to an outside and the corner portions of the bottom surface 9 and the side surfaces, and there occurs very large allowance (margin), and flexure resistance is to be improved.

Figure 3:
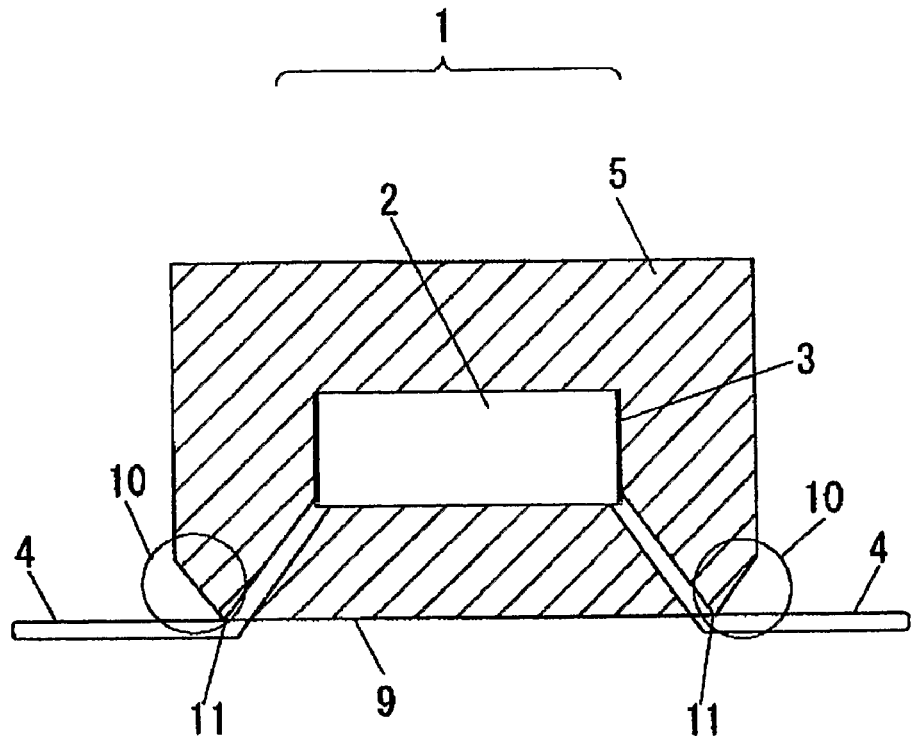
FIG. 3 is a side view of an electronic component in an embodiment of the invention

FIG. 3 shows such a case that the terminal portions 4 are protruded from corner portions where the inclined portions 10 and the bottom surface 9 intersect, in the same manner as in FIG. 2, and shows such a configuration that after the terminal portions 4 were protruded, they are stretched in a shape along the bottom surface. That is, the terminal portions 4 become roughly in parallel with the bottom surface 9 of the external covering material 5. In the same manner as in this case, there occurs allowance (margin), and flexure resistance is to be improved, and manufacture is easier than the case of FIG. 2.

Figure 4:
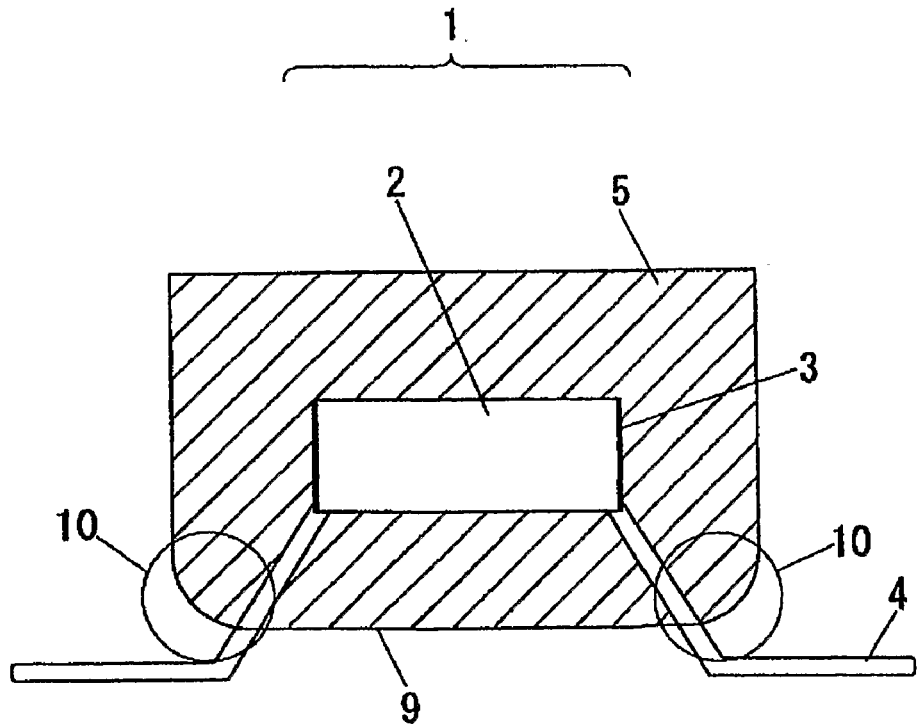
FIG. 4 is a side view of an electronic component in an embodiment of the invention.

FIG. 4 shows such a case that the inclined portion becomes a circular arc surface. Since it is the circular arc surface, there is such a merit that an electronic component with high endurance against shock etc. is realized. In addition, in the same manner as the case of FIG. 2, the protruded terminal portion is protruded to a lower side, and thereafter, folded back in a roughly L-letter shape, to form the terminal portion 4 with a surface mountable configuration.

Figure 5:
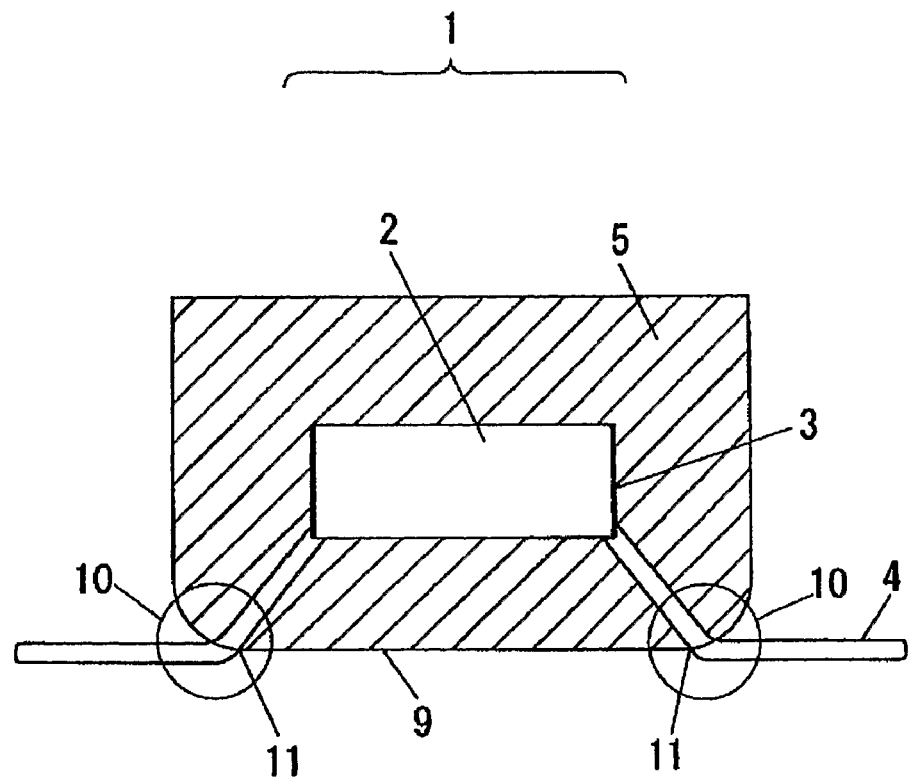
FIG. 5 is a side view of an electronic component in an embodiment of the invention.

FIG. 5 represents such a configuration that the inclined portion 10 is a circular arc surface, in the same manner as in FIG. 4, and furthermore, shows such a configuration that after the terminal portion 4 was protruded in the same manner as in FIG. 3, it is stretched along (roughly in parallel with) the bottom surface 9 of the external covering material 5.

Figure 6:
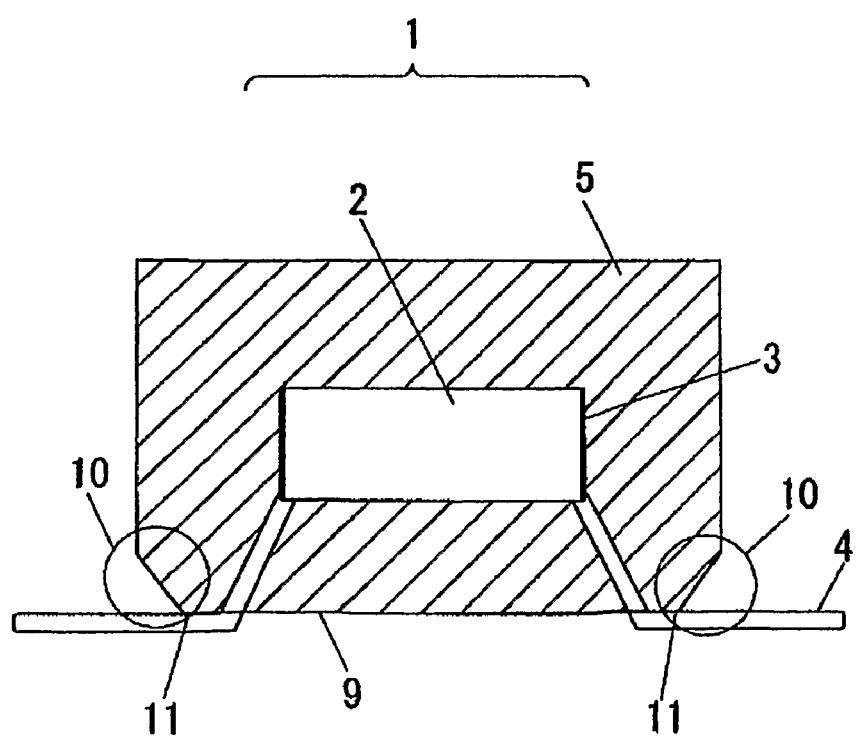
FIG. 6 is a side view of an electronic component in an embodiment of the invention.

FIG. 6 shows, as it is the same manner as in FIG. 3, such a configuration that the terminal portions 4 were protruded from corner portions where the inclined portions 10 intersect with the bottom surface 9, and then, they are stretched along the bottom surface 9 of the external covering material 5. In this case, allowance (margin) between the terminal portions 4 and the external covering material 5 becomes further large, and flexure resistance is improved sufficiently.

Figure 7:
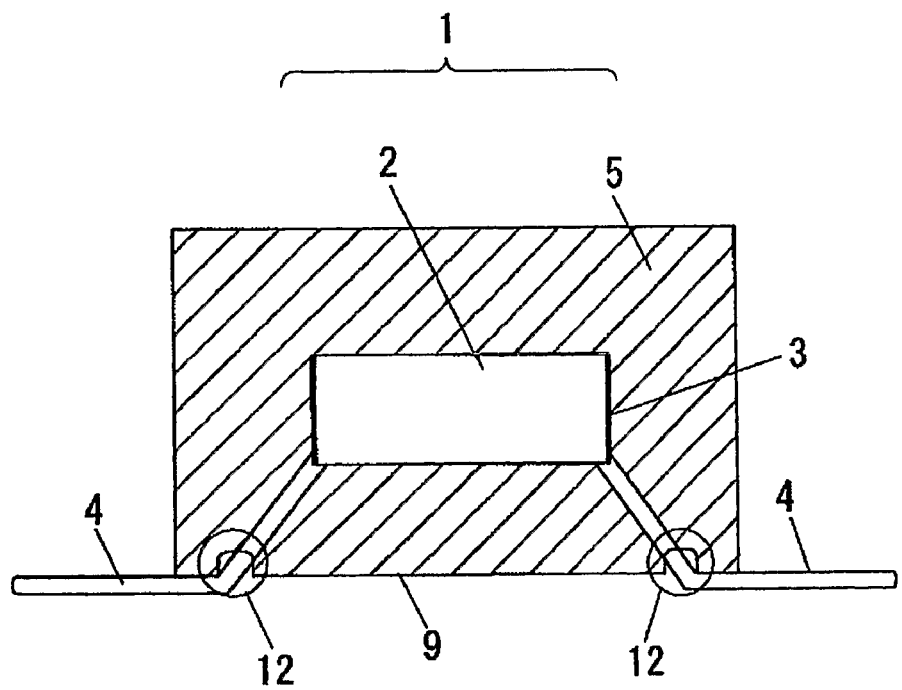
FIG. 7 is a side view of an electronic component in an embodiment of the invention.

FIG. 7 shows such a configuration that the terminal portions are protruded from bent portions 12 which were disposed on the bottom surface 9. In addition, as the bent portion 12, a roughly square-shaped cut-in is disposed.

Figure 8:
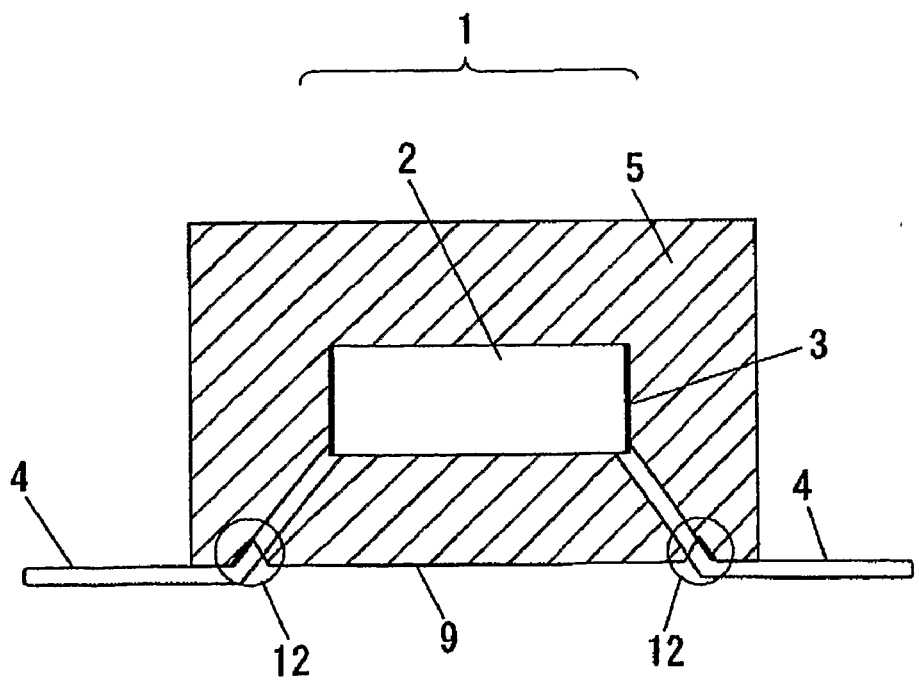
FIG. 8 is a side view of an electronic component in an embodiment of the invention.

FIG. 8 represents such a configuration that the terminal portions 4 are protruded from the bent portions in the same manner, and such a case that the bent portion 12 is a triangular shaped cut-in portion. In each cases of FIGS. 7 and 8, they are protruded from the bent portions 12, and thereby, there occurs allowance between the terminal portions 4 and the external covering material 4, and flexure resistance is improved. In addition, any one of them shows such a configuration that, after they were protruded, they are stretched along the bottom surface 9 in parallel with the same.

Figure 9:
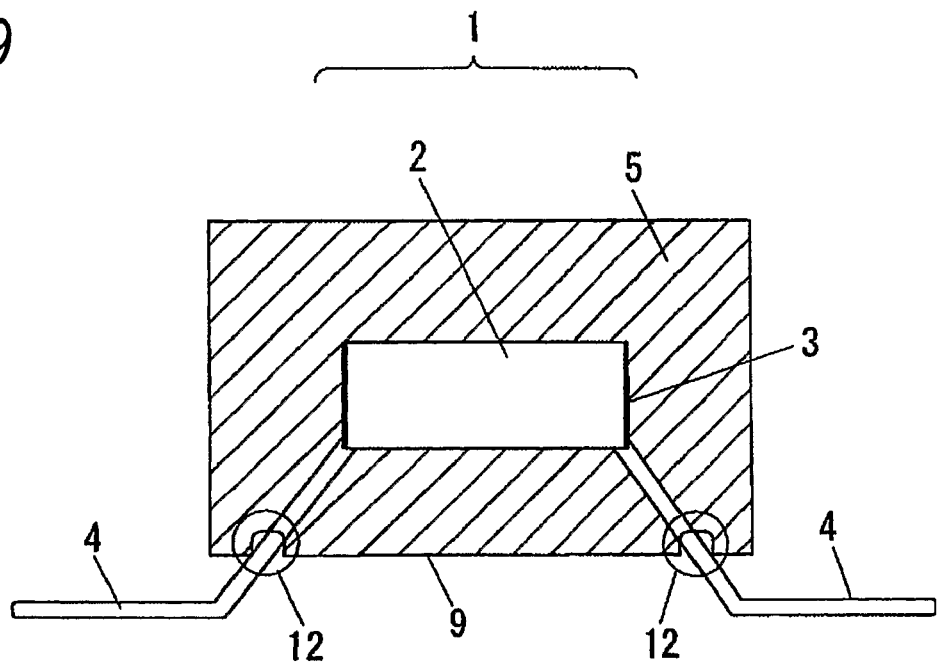
FIG. 9 is a side view of an electronic component in an embodiment of the invention.

FIG. 9 also represents such a case that the terminal portions 4 are protruded from the bent portions 12, and such a surface mountable configuration that the protruded terminal portions 4 are protruded to a lower side, and then, are folded back in a roughly L-letter shape in midstream. Also in this case, allowance (margin) between the terminal portions 4 and the external covering material 5 becomes very large, and flexure resistance becomes very large.

Figure 10:
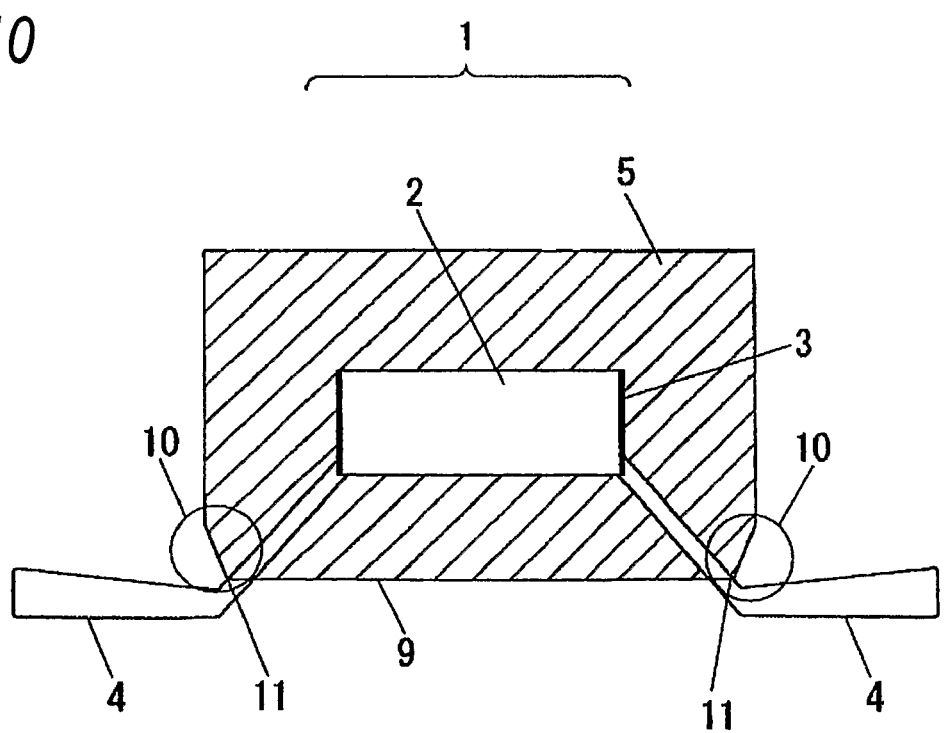
FIG. 10 is a side view of an electronic component in an embodiment of the invention.

FIG. 10 shows such a configuration that the protruded terminal portions 4 increase in thickness to front edges thereof. By the suchlike configuration, it is possible to realize flexure resistance which is strong against stress such as shock which is significantly applied to a front edge of the terminal portion 4, i.e., with securing shock resistance and endurance.

Figure 11:
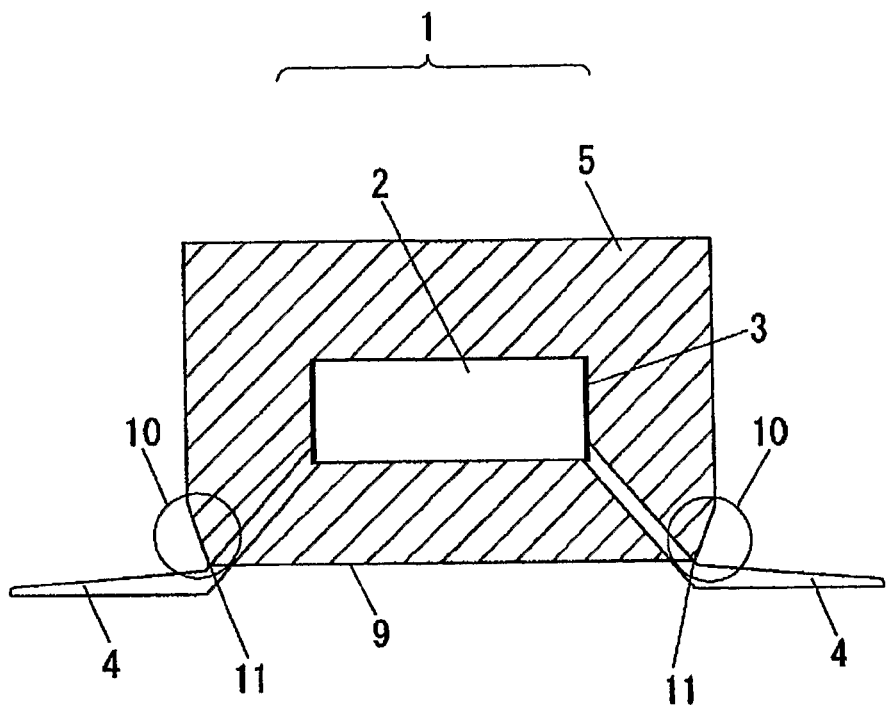
FIG. 11 is a side view of an electronic component in an embodiment of the invention.

FIG. 11 shows such a configuration that the protruded terminal portions 4 become thinner in thickness to their front edges. By the suchlike configuration, elasticity of the terminal portion 4 is heightened, and flexure resistance is improved more.

Figure 12:
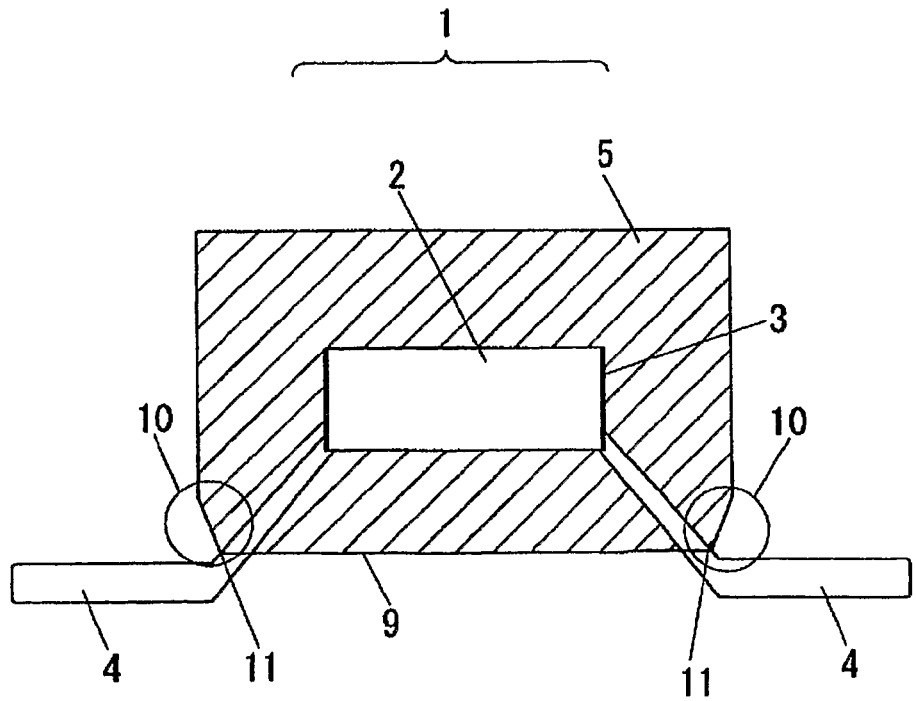
FIG. 12 is a side view of an electronic component in an embodiment of the invention.

FIG. 12 shows such a configuration that, in the terminal portions 4, there exist such portions that a thickness in an inside of the external covering material 5 is thicker, on an outside of the external covering material. By the suchlike configuration, it becomes possible to improve shock resistance of the terminal portion 4 which is on an outside.

Figure 13:
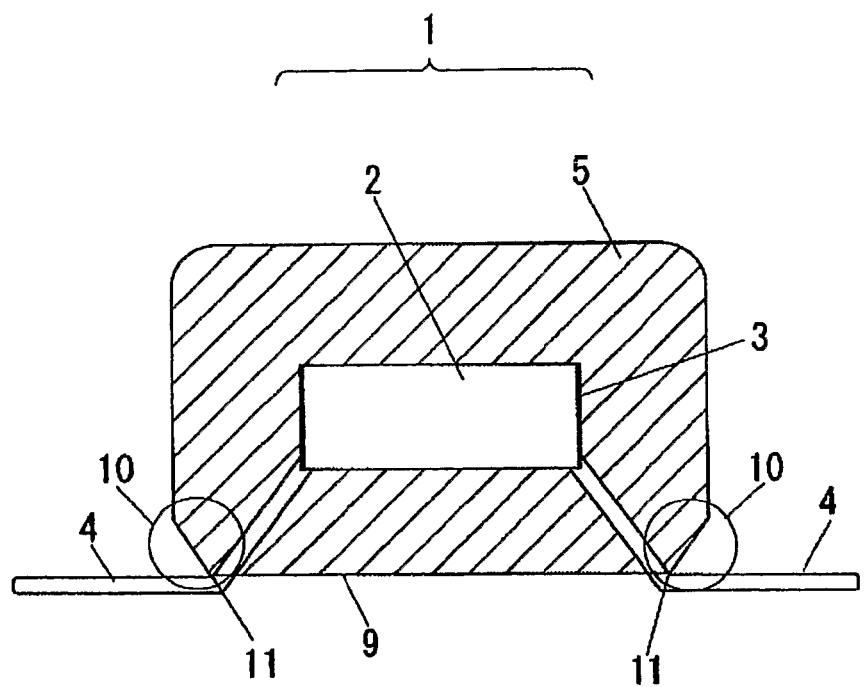
FIG. 13 is a side view of an electronic component in an embodiment of the invention.

FIG. 13 shows such a configuration that chamfering is applied to corner portions of the external covering material 5 other than the corner portions from which the terminal portions 4 are protruded. By the suchlike configuration, shock resistance of the external covering material 5 is heightened, and it is possible to prevent damage such as occurrence of cracks.

Figure 14:
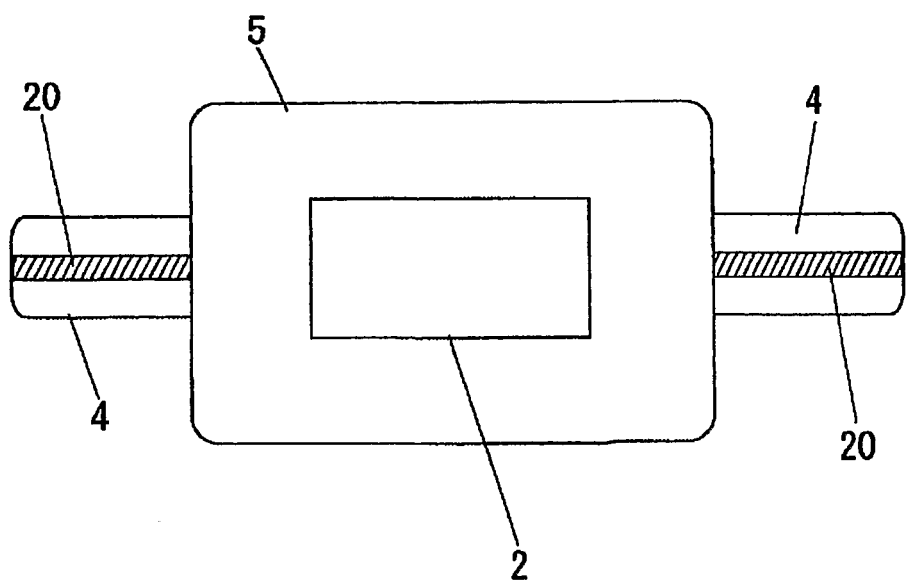
FIG. 14 is a top view of an electronic component in an embodiment of the invention.
Figure 15:
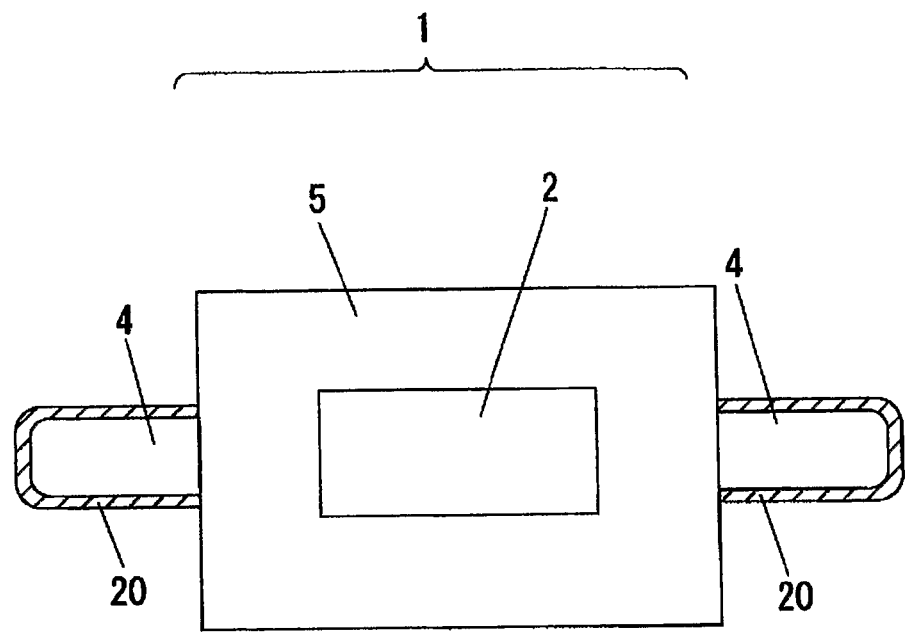
FIG. 15 is a top view of an electronic component in an embodiment of the invention.

FIGS. 14 and 15 show such a configuration that reinforcing materials 20 are disposed on non-mounting surfaces of the terminal portions 4. By the suchlike configuration, flexure resistance was improved, and in addition to that, shock resistance of the terminal portion 4 is improved. FIG. 14 shows such a configuration that the reinforcing materials 20 are formed at roughly center portions of the terminal portions 4, and FIG. 15 shows such a configuration that the reinforcing materials 20 are formed at outer edge portions of the terminal portions 4.

Figure 16:
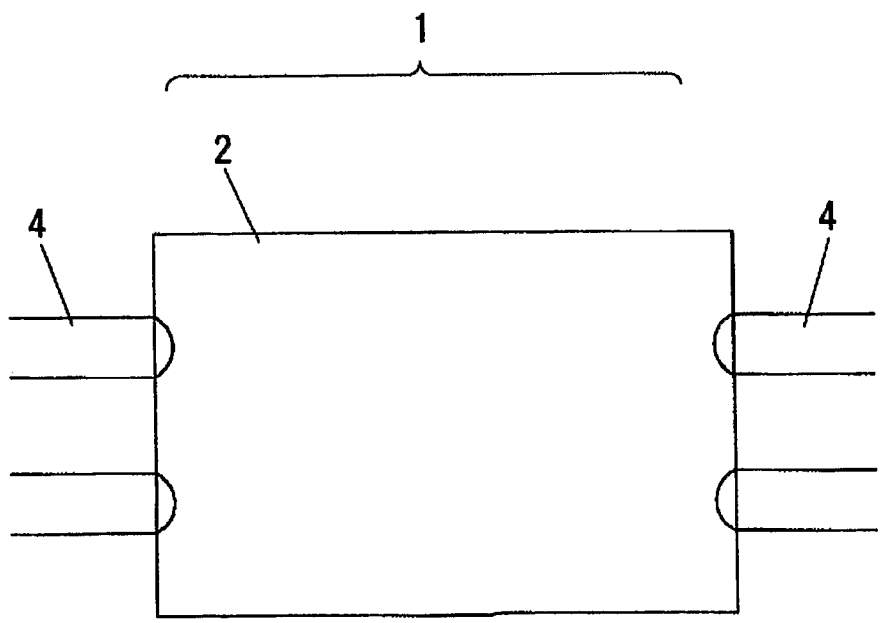
FIG. 16 is a top view of an electronic component in an embodiment of the invention.

FIG. 16 represents such an element 2 that a plurality of paired terminal portions 4 are disposed on one base body, and it is possible to form a composite device easily by use of one base body.

Figure 17:
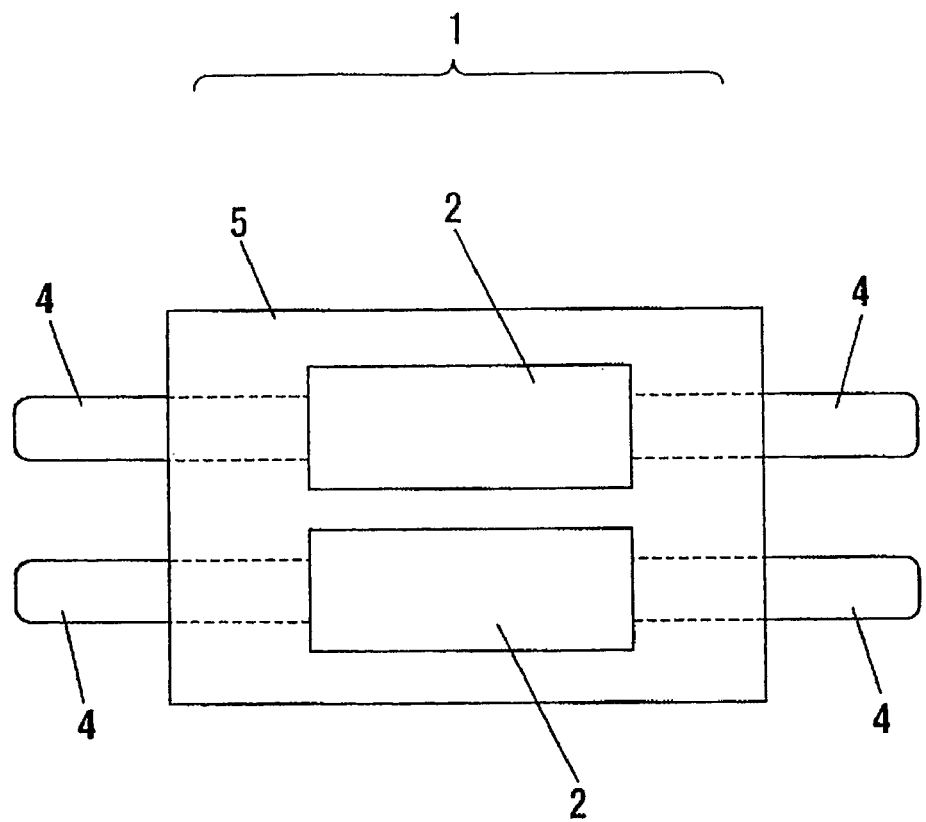
FIG. 17 is a top view of an electronic component in an embodiment of the invention.

FIG. 17 shows such a configuration that a plurality of elements 2 are sealed in one external covering material 5, and in the same manner, it is possible to form a composite device easily in one electronic component, and further, labor hour for mounting is saved.

Figure 18:
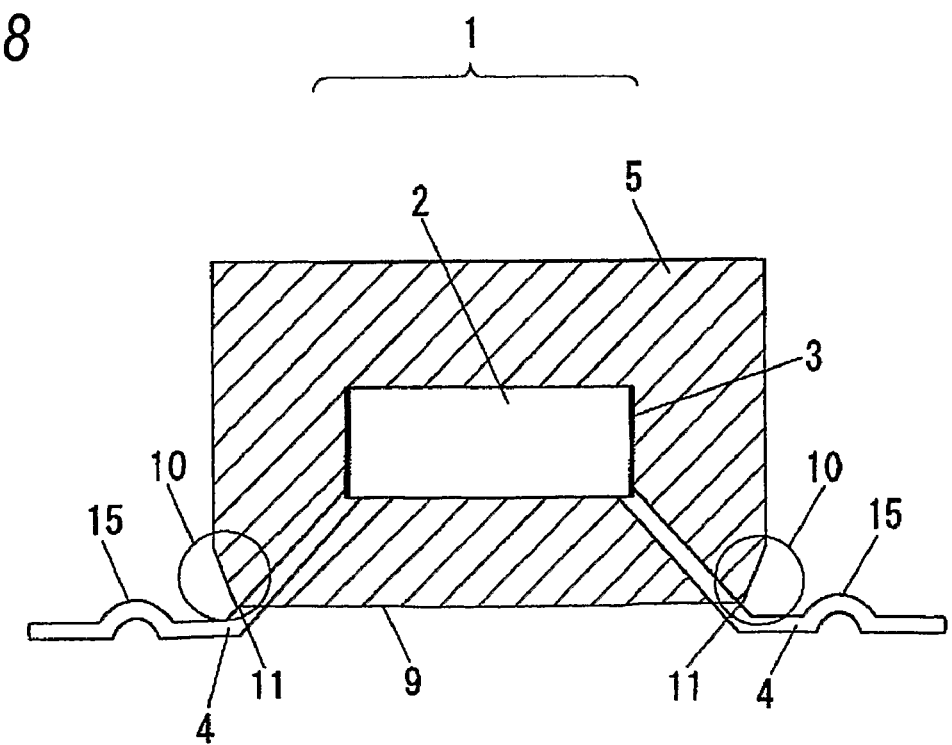
FIG. 18 is a side view of an electronic component in an embodiment of the invention.

FIG. 18 represents such a configuration that curved surface portions 15 were disposed as flexure absorbing portions on the terminal portions 4.

Figure 19:
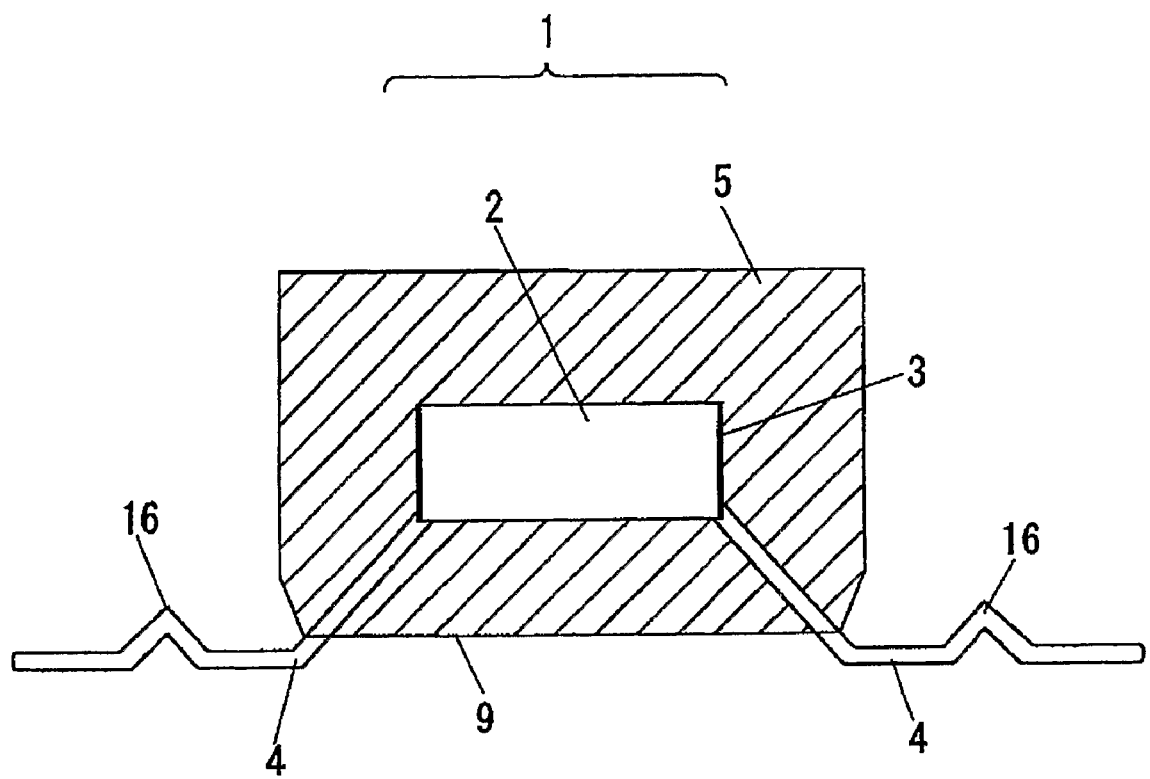
FIG. 19 is a side view of an electronic component in an embodiment of the invention.

FIG. 19 represents such a configuration that folded portions 16 were disposed as flexure absorbing portions on the terminal portions 4 in the same manner.

Figure 20:
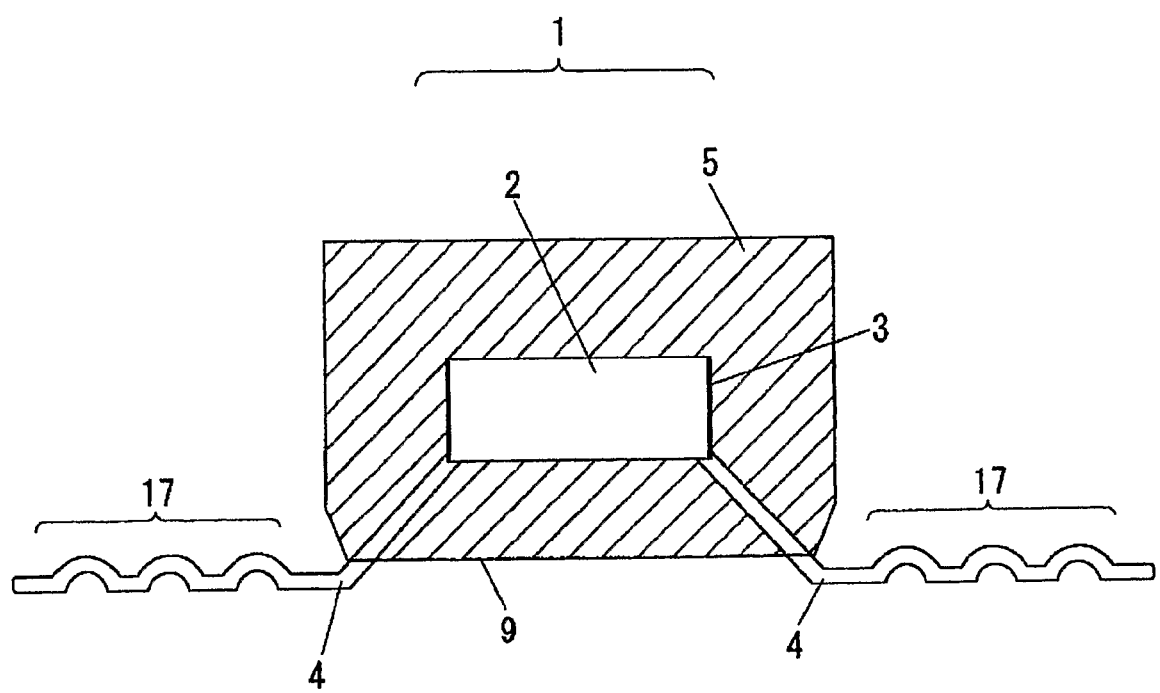
FIG. 20 is a side view of an electronic component in an embodiment of the invention.

FIG. 20 represents such a configuration that wavy surfaces 17 were disposed as flexure absorbing portions.

By the flexure absorbing portions as shown in FIGS. 18 through 20, it is possible to improve flexure resistance against flexure etc. which arises from vibration, shock etc. to the terminal portions 4.

Figure 21:
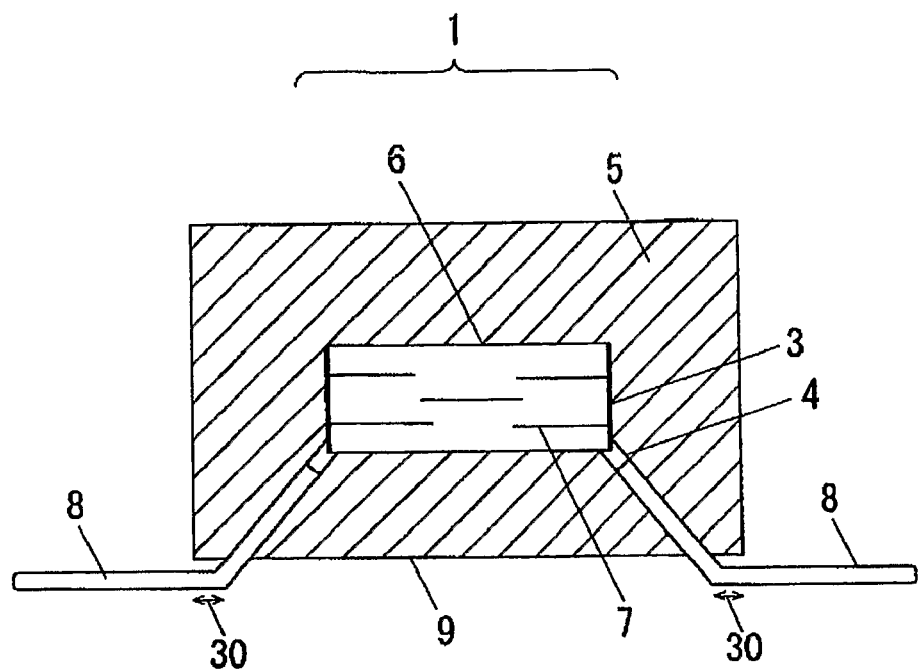
FIG. 21 is a side view of an electronic component in an embodiment of the invention.

FIG. 21 shows such a configuration that lead terminals 8 are protruded from the bottom surface 9, and a distance between positions where they are protruded and corner portions of the bottom surface and side surfaces of the external covering material 5 is 0.1 mm or more. By the suchlike configuration, there occurs allowance (margin) between the lead terminals 8 which are protruded from the external covering material 5, and the external covering material 5, and flexure resistance is improved.

Figure 22:
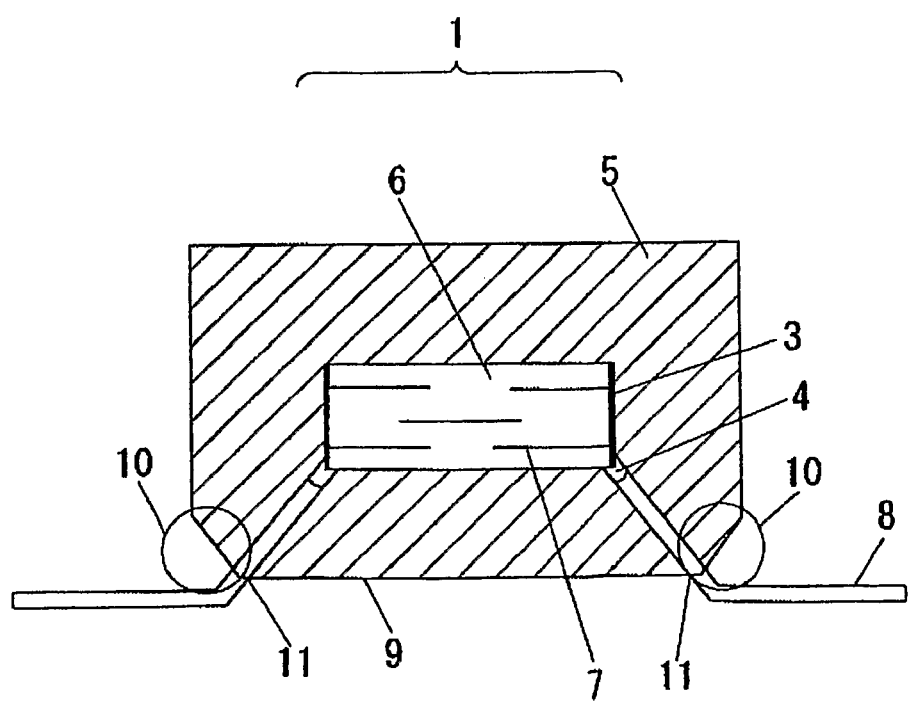
FIG. 22 is a side view of an electronic component in an embodiment of the invention.

FIG. 22 shows such a configuration that inclined portions 10 are disposed on corner portions of the bottom surface 9 and side surfaces of the external covering material 5, and the lead terminals 8 are protruded from the corner portions where these inclined portions 10 intersect with the bottom surface 9. In particular, it has such a surface mountable configuration that they are once protruded to a lower side, and then, folded back in a roughly L-letter shape. By the suchlike configuration, it becomes possible to secure a distance between the lead terminals 8 which are protruded to an outside and the corner portions of the bottom surface 9 and the side surfaces of the external covering material 5, and very large allowance (margin) is generated, and flexure resistance is to be improved.

Figure 23:
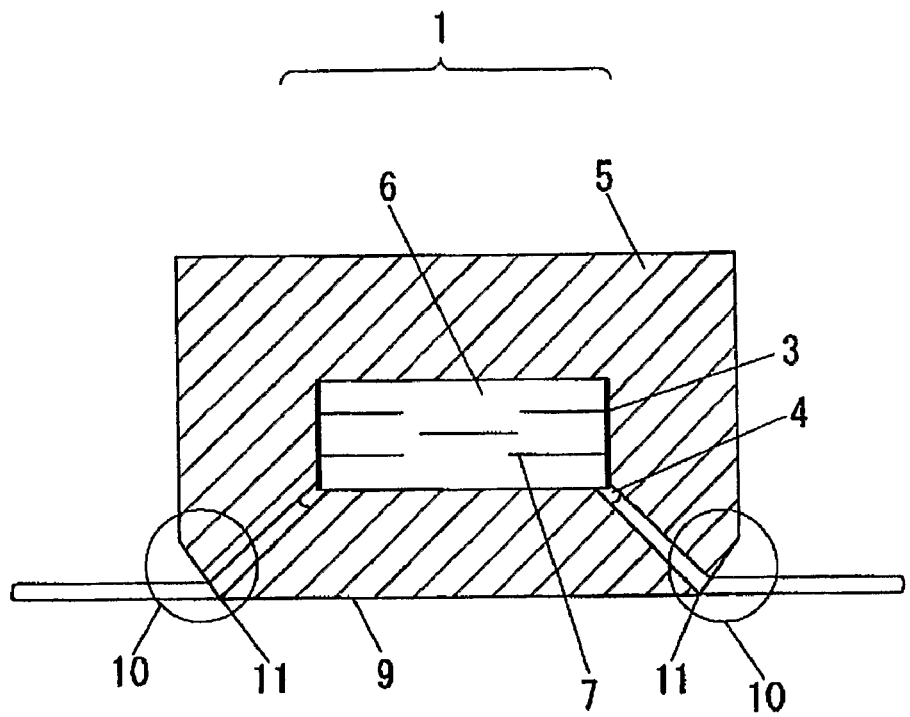
FIG. 23 is a side view of an electronic component in an embodiment of the invention.

FIG. 23 shows such a case that the lead terminals 8 are protruded from the corner portions of the inclined portions 10 and the bottom surface 9 in the same manner as in FIG. 22, and shows such a configuration that after the lead terminals 8 were protruded, they are stretched in a shape along the bottom surface. That is, the lead terminals 8 become roughly in parallel with the bottom surface 9 of the external covering material 5. Also in this case, in the same manner, allowance (margin) is generated, and flexure resistance is to be improved, and manufacture is easier than the case of FIG. 22.

Figure 24:
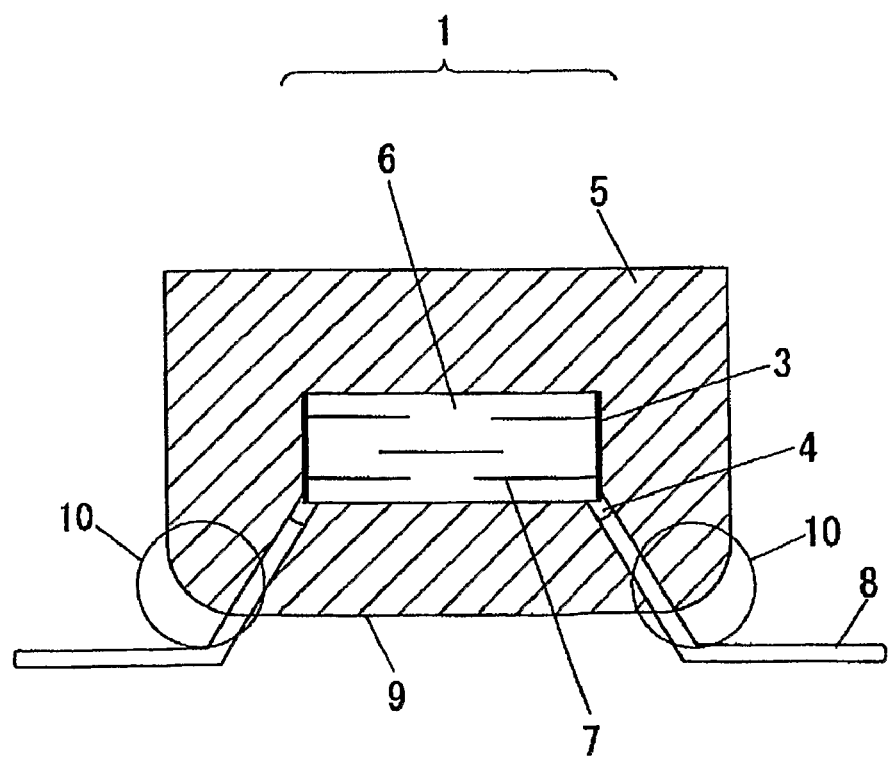
FIG. 24 is a side view of an electronic component in an embodiment of the invention.

FIG. 24 shows such a case that the inclined portions 10 are made as circular arc surfaces. Since they are of circular arc surfaces, there is such a merit that an electronic component having endurance against shock etc. is realized. In addition, in the same manner as the case of FIG. 22, the protruded terminals 8 are protruded, and thereafter, folded back in a roughly L-letter shape, to form a surface mountable configuration.

Figure 25:
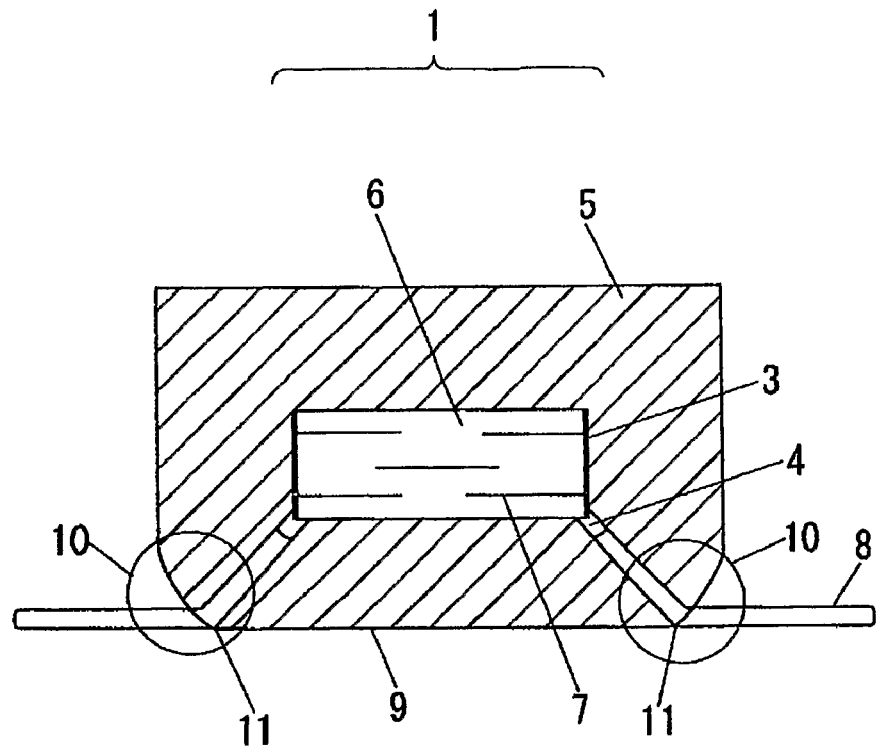
FIG. 25 is a side view of an electronic component in an embodiment of the invention.

FIG. 25 represents such a configuration that, in the same manner as in FIG. 24, the inclined portions 10 are of circular arc surfaces, and furthermore, in the same manner as in FIG. 23, after the lead terminals 8 were protruded, they are stretched along (roughly in parallel with) the bottom surface 9 of the external covering material 5.

FIG. 25 shows, in the same manner as in FIG. 23, such a configuration that the lead terminals 8 are protruded from more inner sides than corner portions where the inclined portions 10 and the bottom surface 9 intersect, and then, they are stretched along the bottom surface 9 of the external covering material 5. In this case, allowance (margin) between the lead terminals 8 and the external covering material 5 becomes larger, and flexure resistance is improved sufficiently.

Figure 27:
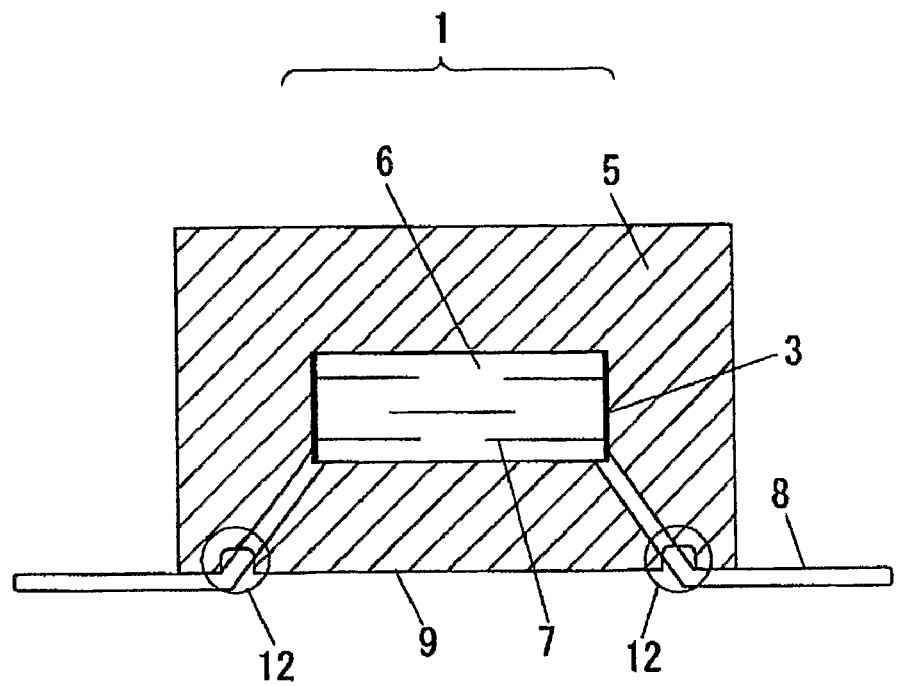
FIG. 27 is a side view of an electronic component in an embodiment of the invention.

FIG. 27 shows such a configuration that the lead terminals 8 are protruded from bend portions 12 which were disposed in the bottom surface 9. In addition, as the bent portion 12, a roughly square-shaped cut-in is disposed.

Figure 28:
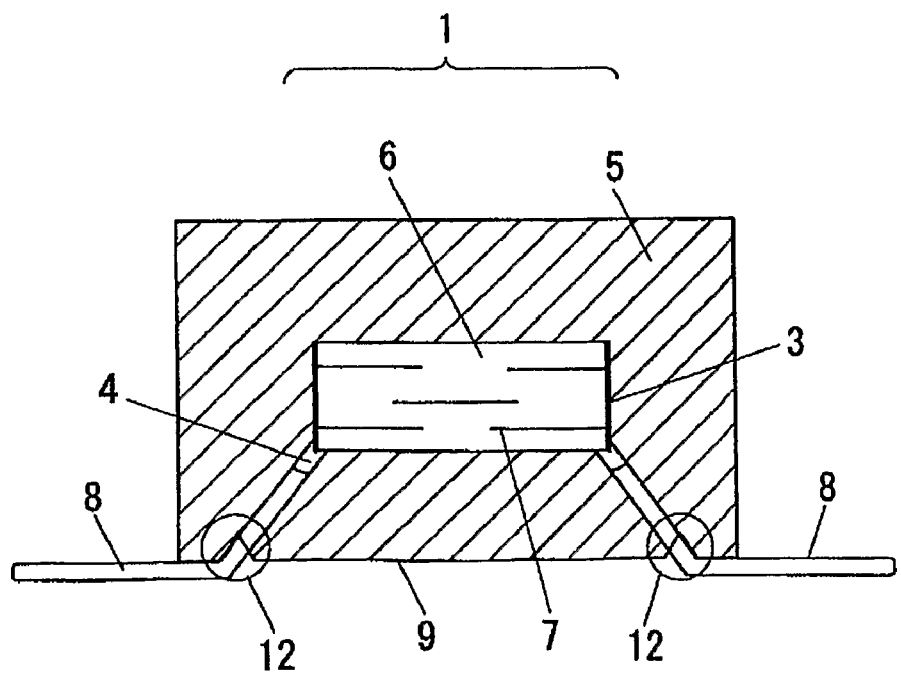
FIG. 28 is a side view of an electronic component in an embodiment of the invention.

FIG. 28 represents such a configuration that the lead terminals 8 are protruded from the dent portions 12 in the same manner, and such a case that the dent portions 12 are triangular shaped cut-in portions. In each case of FIGS. 27 and 28, they are protruded from the dent portions 12, and thereby, there occurs allowance between the lead terminals 8 and the external covering material 5, and flexure resistance is improved. In addition, each of them shows such a configuration that they are stretched along the bottom surface 9 in parallel with the same.

Figure 29:
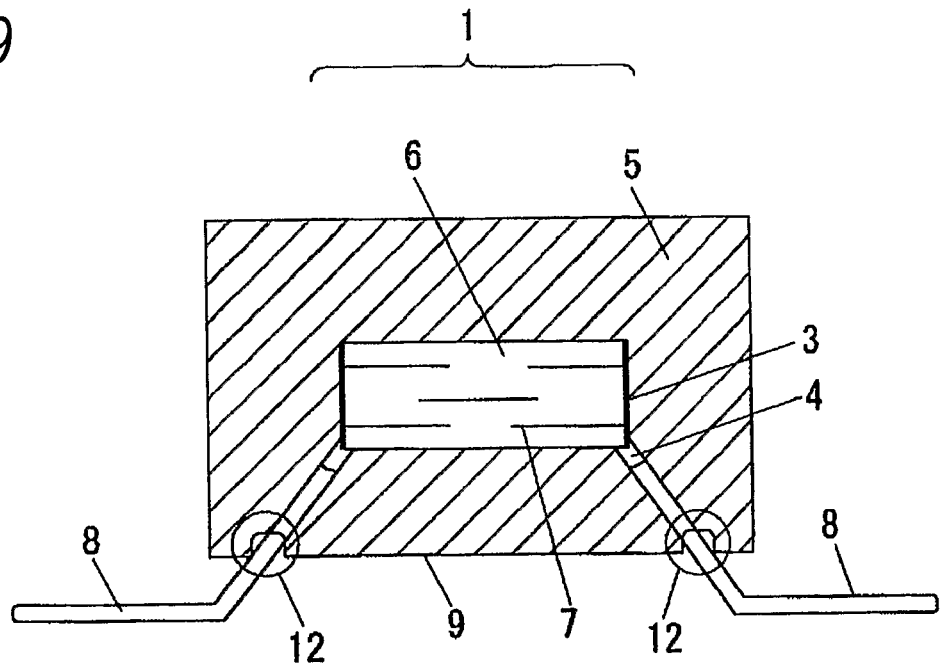
FIG. 29 is a side view of an electronic component in an embodiment of the invention.

FIG. 29 represents such a case that the lead terminals 8 are protruded from the dent portions 12, and such a surface mountable configuration that the protruded lead terminals 8 are protruded to a lower side, and then, folded back in a roughly L-letter shape in midstream. In this case, allowance (margin) between the lead terminals 8 and the external covering material 5 becomes very large, and flexure resistance becomes very large.

Figure 30:
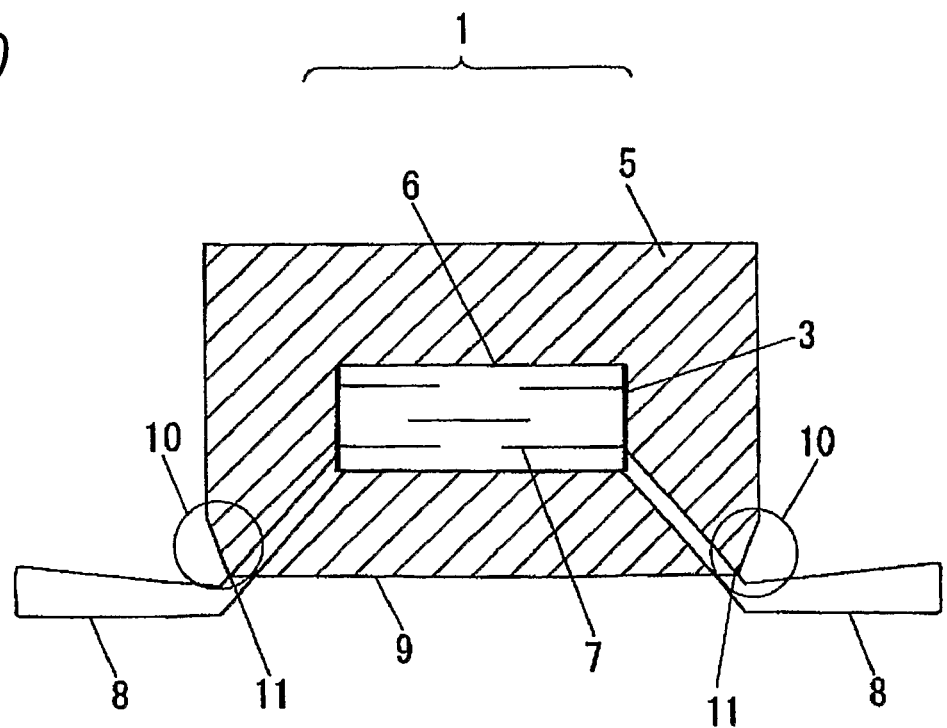
FIG. 30 is a side view of an electronic component in an embodiment of the invention.

FIG. 30 shows such a configuration that the protruded lead terminals 8 increase in thickness to front edges. By the suchlike configuration, it is possible to realize flexure resistance which is strong against stress such as shock which is substantially applied to front edges of the lead terminals 8, i.e., with securing shock resistance and endurance.

Figure 31:
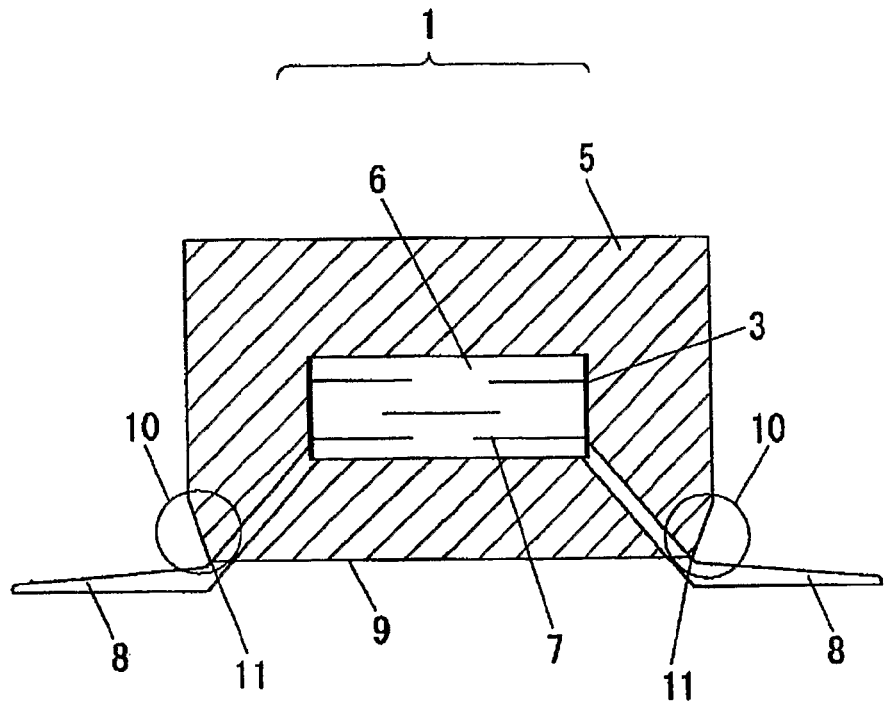
FIG. 31 is a side view of an electronic component in an embodiment of the invention.

FIG. 31 shows such a configuration that the protruded terminals 8 become thinner in thickness to front edges thereof. By the suchlike configuration, elasticity of the lead terminal 8 is heightened, and flexure resistance is more improved.

Figure 32:
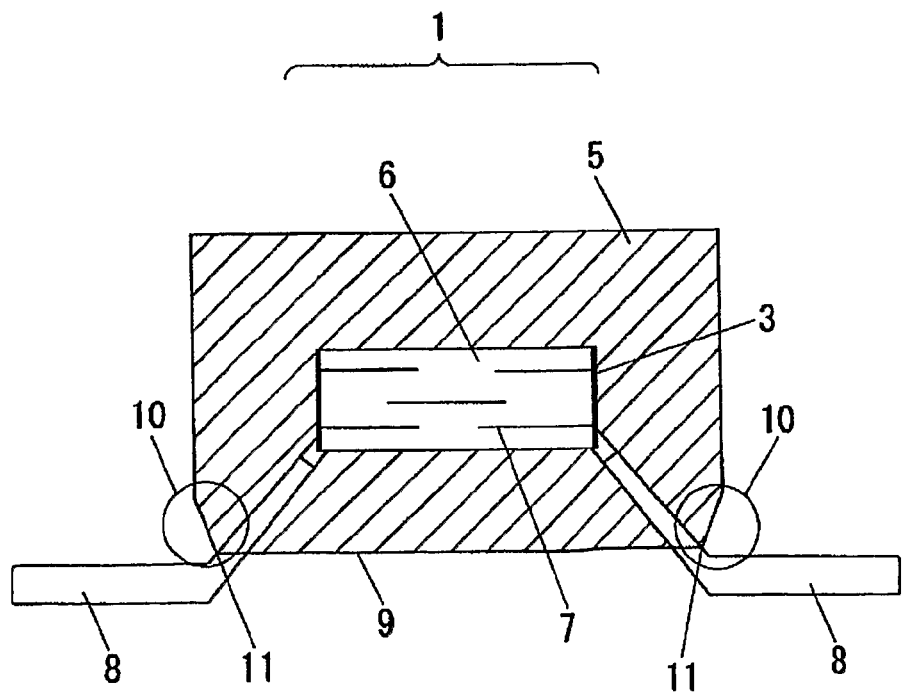
FIG. 32 is a side view of an electronic component in an embodiment of the invention.

FIG. 32 shows such a configuration that, in the lead terminals 8, there exists portions which are thicker than in an inside of the external covering material 5, at an outside of the external covering material 5. By the suchlike configuration, it becomes possible to improve shock resistance of the lead terminals 8 which come out to an outside.

Figure 33:
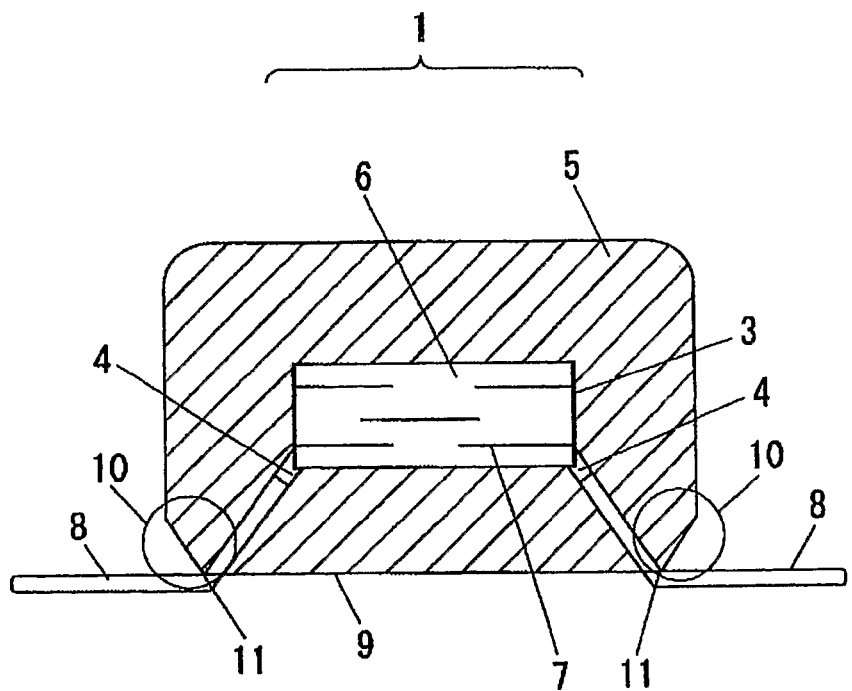
FIG. 33 is a side view of an electronic component in an embodiment of the invention.

FIG. 33 shows such a configuration that chamfering is applied to corner portions of the external covering material 5 other than the corner portions from which the lead terminals 8 are protruded. By the suchlike configuration, shock resistance of the external covering material 5 is heightened, and it is possible to prevent damage such as occurrence of cracks.

Figure 34:
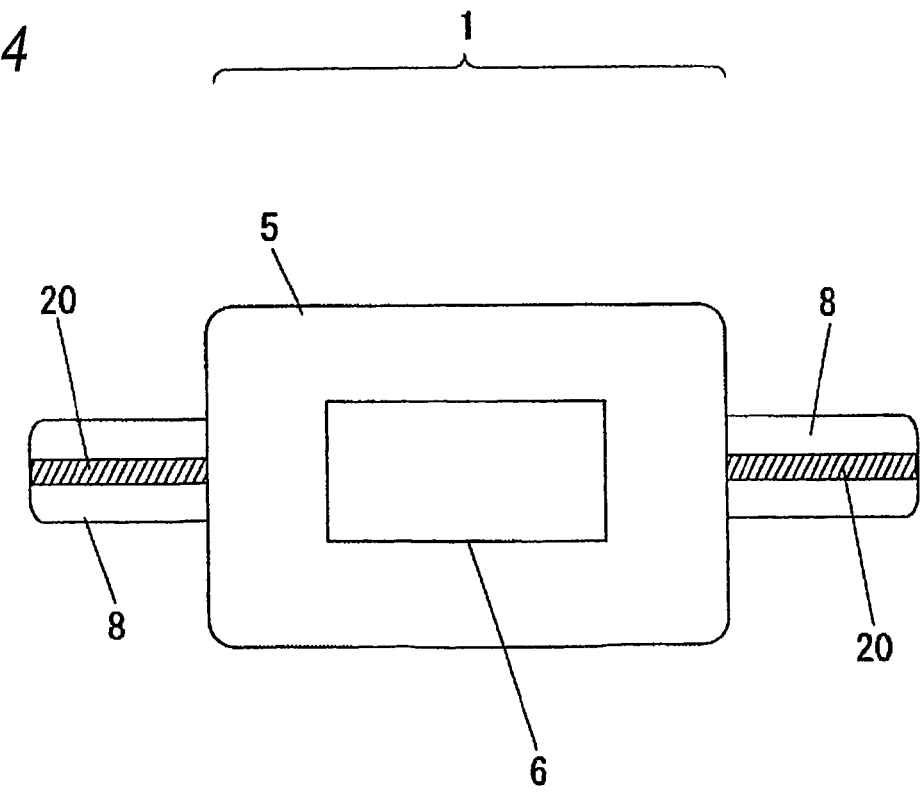
FIG. 34 is a top view of an electronic component in an embodiment of the invention.
Figure 35:
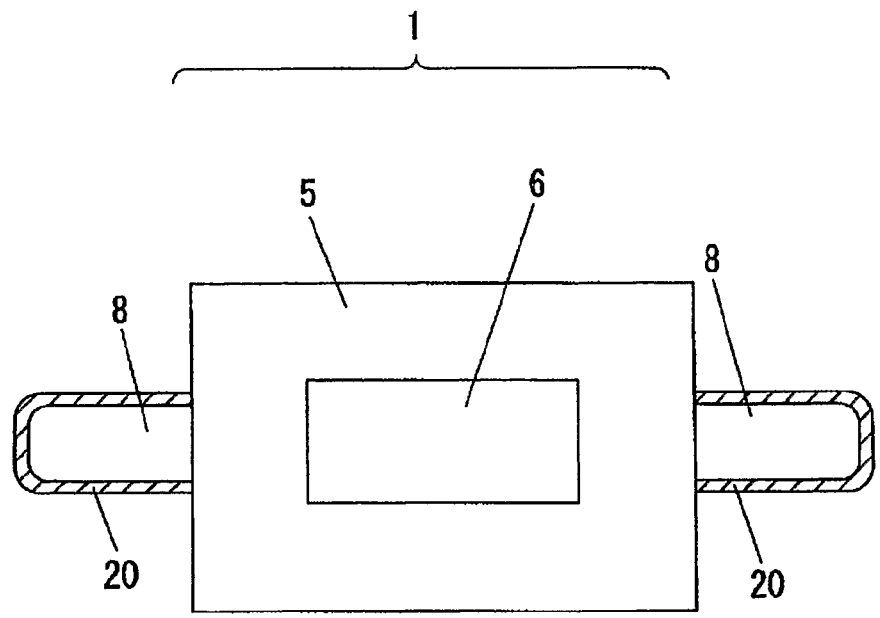
FIG. 35 is a top view of an electronic component in an embodiment of the invention.

FIGS. 34 and 35 shows such a configuration that the reinforcing materials 20 were disposed on non-mounting surfaces of the lead terminals 8. By the suchlike configuration, shock resistance of the lead terminals 8 is improved, in addition to such a fact that flexure resistance was improved. FIG. 34 shows such a configuration that the reinforcing materials 20 are formed at roughly center portions of the lead terminals 8, and FIG. 35 shows such a configuration that the reinforcing materials 20 are formed at outer edge portions of the lead terminals 8.

Figure 36:
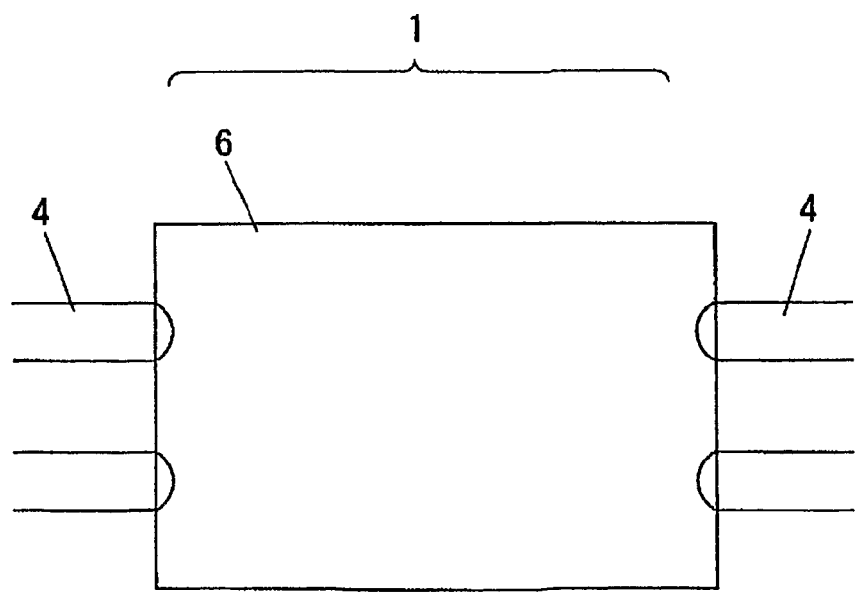
FIG. 36 is a top view of an electronic component in an embodiment of the invention.

FIG. 36 represents a multilayered capacitor 6 in which a plural sets of paired terminal portions 4 are disposed on one base body, and it is possible to form a composite device easily in one base body.

Figure 37:
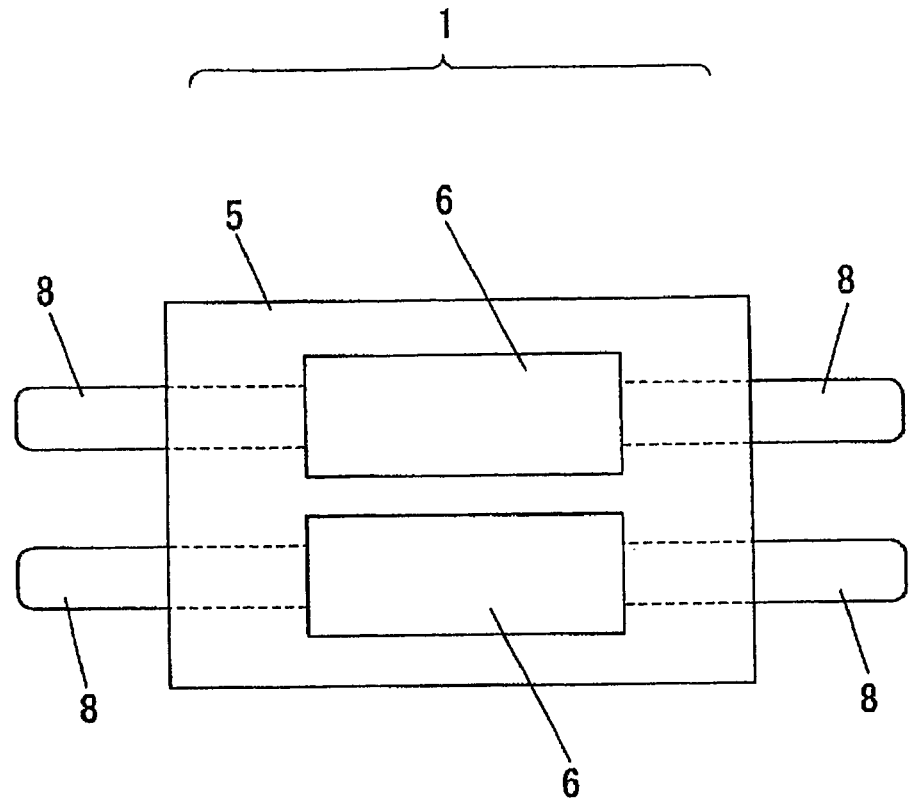
FIG. 37 is a top view of an electronic component in an embodiment of the invention.

FIG. 37 shows such a configuration that a plurality of multilayered capacitors 6 are sealed in one external covering material 5, and in the same manner, it is possible to form a composite device easily in one electronic component, and further, labor hour for mounting is saved.

Figure 38:
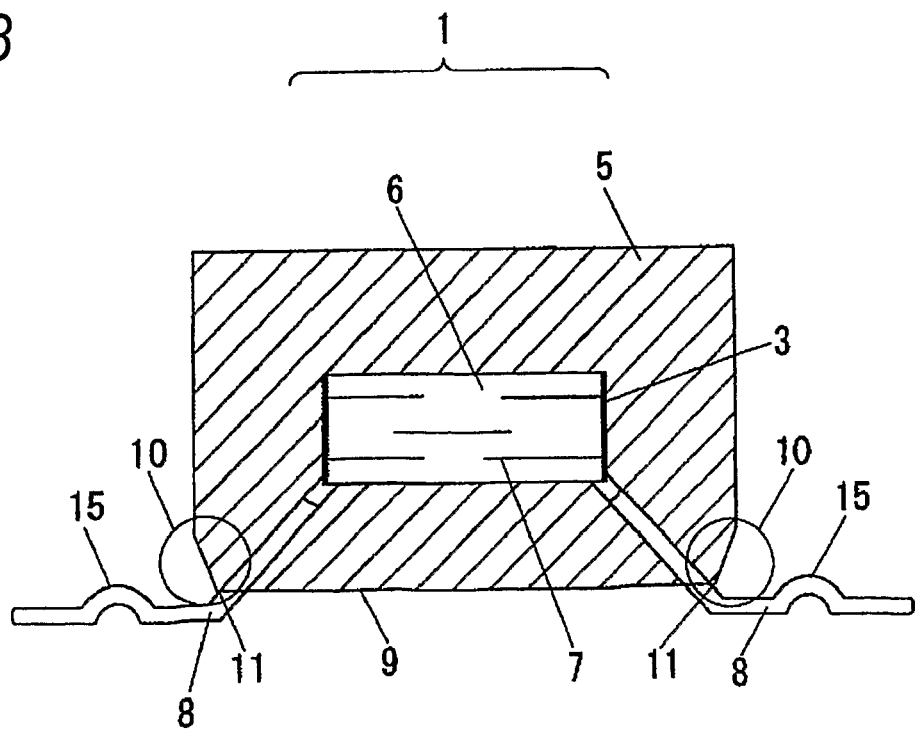
FIG. 38 is a side view of an electronic component in an embodiment of the invention.

FIG. 38 represents such a configuration that the curved surface portions 15 were disposed on the lead terminals 8 as flexure absorbing portions.

Figure 39:
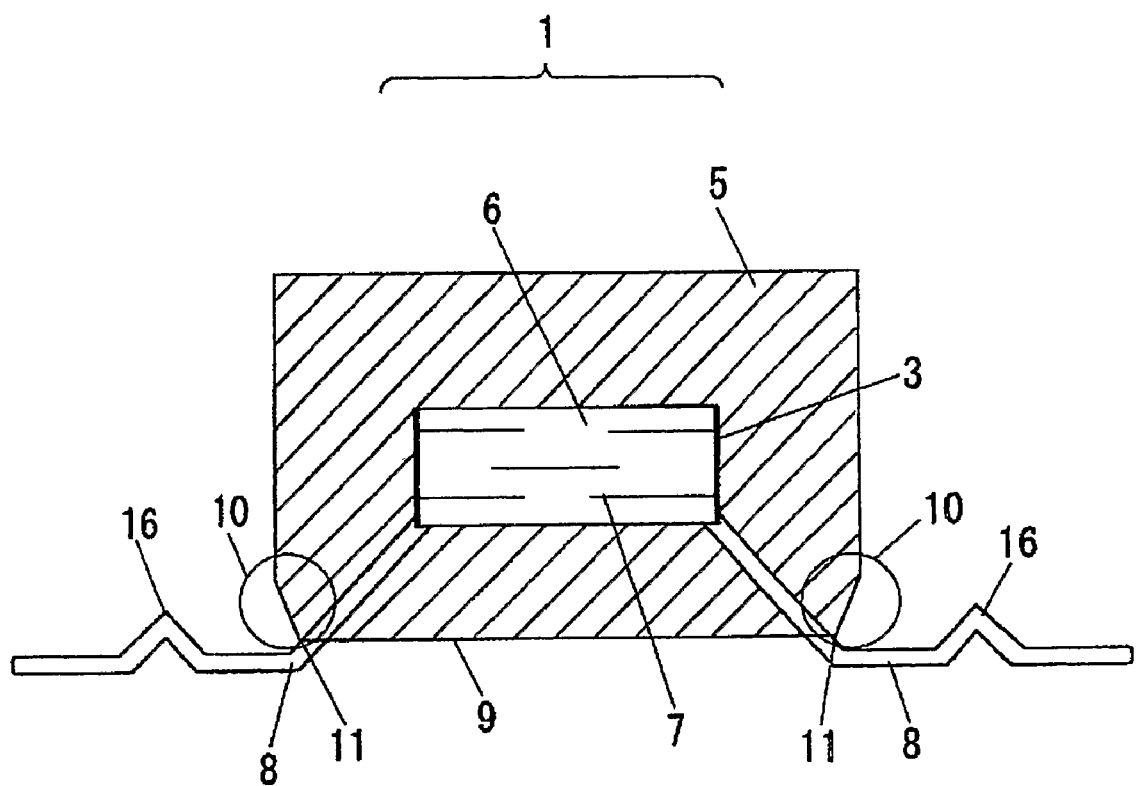
FIG. 39 is a side view of an electronic component in an embodiment of the invention.

FIG. 39 represents such a configuration that the folded portions 16 were disposed on the lead terminals 8 as flexure absorbing portions, in the same manner.

Figure 40:
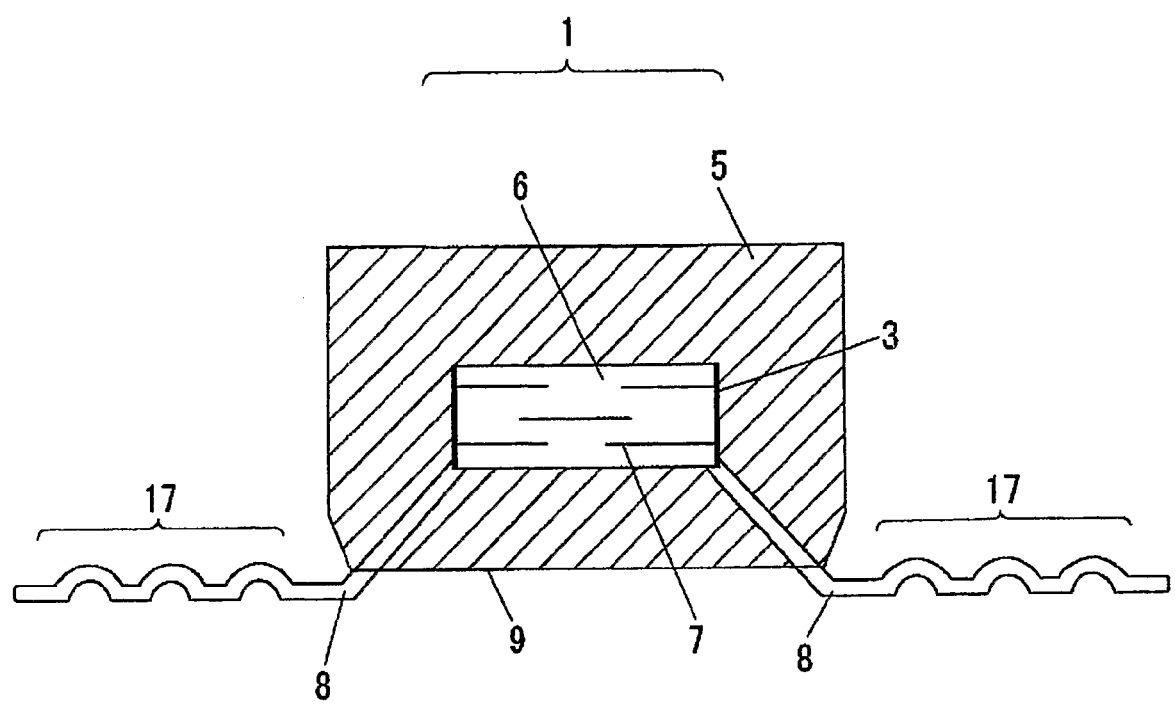
FIG. 40 is a side view of an electronic component in an embodiment of the invention.
Figure 41:
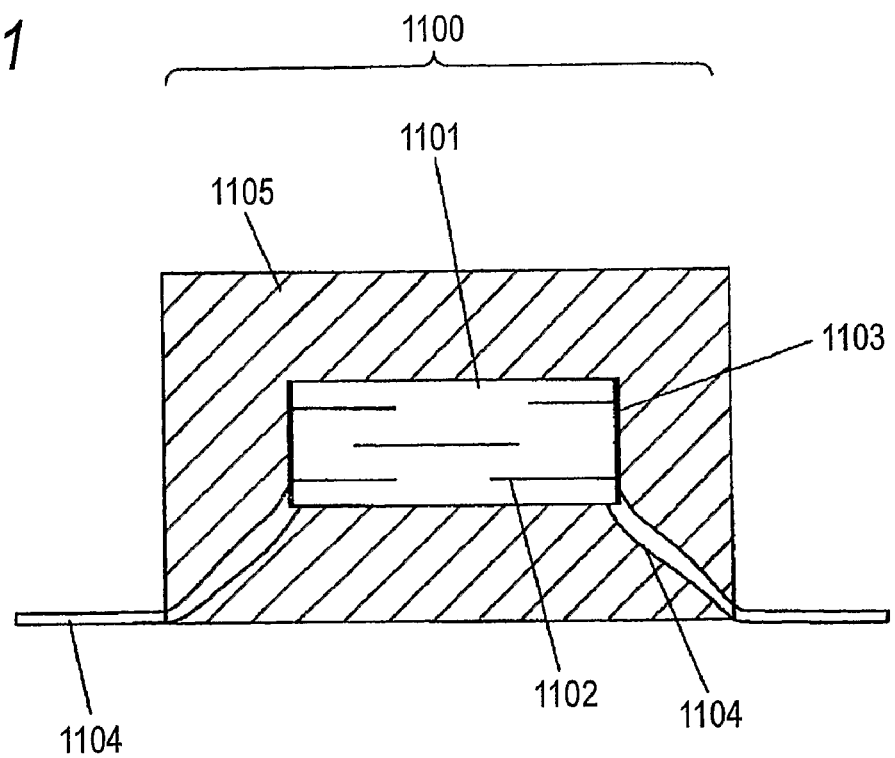
FIG. 41 is a side view of an electronic component in relevant art.
Figure 42:
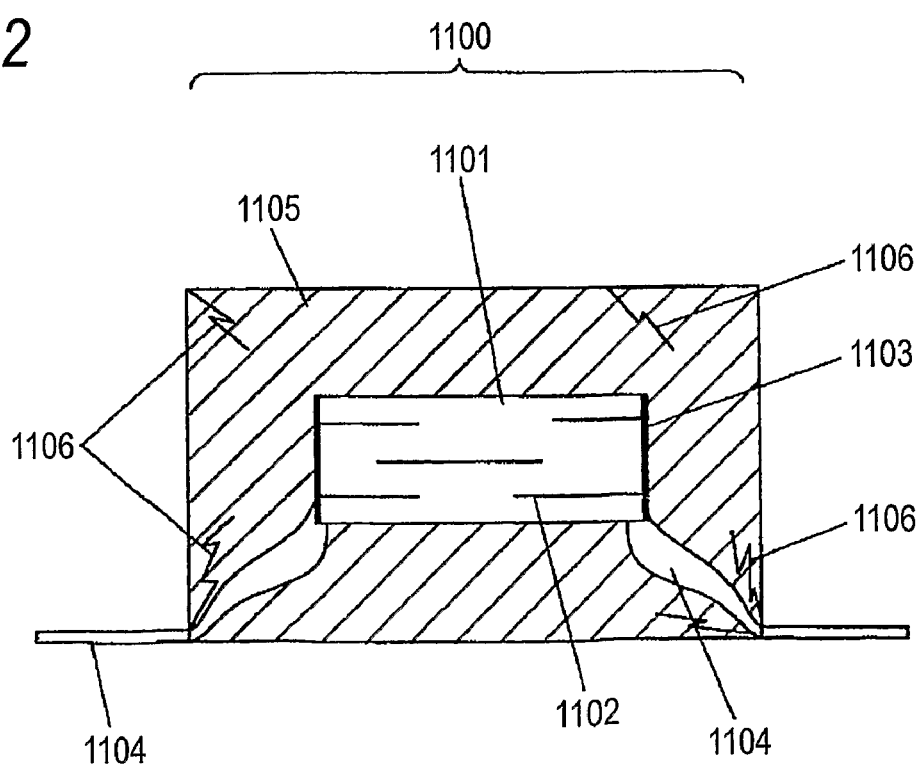
FIG. 42 is a side view of an electronic component in relevant art.

FIG. 40 represents such a configuration that the wavy surfaces 17 were disposed as flexure absorbing portions.

By the flexure absorbing portions as shown in FIGS. 38 through 40, it is possible to improve flexure resistance against flexure etc. which arises from vibration, shock etc. to the lead terminals 8.

The foregoing is description of the configuration of each drawing and its point.

Meanwhile, in order to have the terminal portions 4 protruded from the bottom surface of the external covering material 5, as shown in FIGS. 1 through 14, the electrodes 3 are connected to the element 2, and thereafter, the terminal portions 4 are connected to the electrodes 3, and then, the terminal portions 4 are folded back arbitrarily, and they are placed in a metal mold in an upside-down state, and melted resin etc. are poured into the metal mold, and pouring-in of resin is terminated before folded portions of the terminal portions 4, and if these are done, it is possible to have the terminal portions 4 protruded from the bottom surface 9 surely.

This is the same even in the case of the multilayered capacitor 6 and the lead terminal 8 as shown in FIGS. 20 through 34, and it is possible to easily realize it by metal mold type pour-in resin sealing which can be manufactured at low cost.

Next, detail of each portion will be described.

1 designates an electronic component, and as represented in FIG. 1 etc., an electronic component in which a capacitor, a resistor, an inductor, a filter, and other electronic elements etc. were molded with an external covering material such as resin, and an electronic component having such a feature that, since it was molded with the external covering material, endurance and moisture resistance, shock resistance are heightened, and further, it can also bear with high breakdown voltage.

Next, an element 2 will be described.

2 designates an element, and as the element 2, as described above, any one of a capacitor, a resistor, an inductor, a filter, IC, and other electronic device may be used, and the capacitor may be any capacitor of a single plate capacitor, a multilayered capacitor, an electrolytic capacitor, etc. FIG. 1 represents the single plate capacitor, and FIG. 2 represents the multilayered capacitor.

Meanwhile, the element 2 (or the multilayered capacitor 6) may be sealed with the external covering material 5 singularly, and a plurality of them may be sealed with the external covering material 5.

Alternatively, it is all right even if a pair of electrodes 3 are disposed on one base body and thereby, it has an operation as one electronic device, or it is also all right even if a plurality of paired electrodes 3 are disposed on one base body, and it has an operation as a plurality of electronic devices.

Such a configuration that a plurality of elements 2 (or multilayered capacitor 6) are sealed is represented in FIGS. 17 and 37.

Next, the electrode 3 will be described.

The electrodes 3 are electric conductive members which were disposed as a pair on both ends of the element 2 (or multilayered capacitor 6), and realize electric conduction with an external mounting substrate through the terminal portions 4 and the lead terminals 8, to the element 2 (or multilayered capacitor 6). It is common that the electrodes 3 are disposed as a pair on both ends of the element 2 (or multilayered capacitor 6), but it is all right even if they are disposed on midstream portions of the element 2 (or multilayered capacitor 6), but not on both ends. Alternatively, it is all right even if they are disposed on upper and lower surfaces, but not on side surfaces of the element 2 (or multilayered capacitor 6), and it is also all right even if they are disposed across whole surfaces of side surfaces and upper and lower surfaces, and it is also all right even if they are disposed only on a part thereof, and it is also all right even if they are disposed so as to run off the edge to another surface.

As a material of the electrode 3, cited is a metal material which includes at least one of Ni, Ag, Pd, Cu, Au etc. In particular, by using Ni single body or Ni alloy, it becomes advantageous also on the cost phase. In addition, it is all right even if alloy of these materials, and one to which surface plating processing was applied are used. As a matter of course, it is also all right even if alloy etc. are used, and it is all right if it is realized by any one of single layer, multiple layer plating processing, deposition processing, sputter processing, paste coating etc.

Next, the terminal portion 4 will be described.

The terminal portions 4 are connected to the electrodes 3, and disposed as a pair on the element 2 (or multilayered capacitor 6). Normally, there are many cases in which they are disposed on both ends thereof, but it is all right even if they are disposed on places other than the both ends. For example, in case that the electrodes 3 are disposed on upper and lower surfaces, it is also all right even if these electrodes 3, which were formed on upper and lower surfaces, and the terminal portions 4 are connected. In addition, it is also all right even if the terminal portion 4 is configured by a material which includes at least one of Cu, Zn, Ni, Ag, Au etc., and single layer or multiple layer plating processing is applied to surfaces thereof.

In addition, it is all right even if the terminal portion 4 is configured by bonding a metal cap to the element 2. Further, it is desirable that a outermost portion (most surface portion) of the terminal portion 4 is configured by an electric conductive material with a melting point of 200 degree or more, and by this configuration, even if high temperature is applied to an electronic component due to re-flow etc., there is no such a case that thermal damage is added to the terminal portion 4, and it is possible to obtain a stable re-flow characteristic.

The terminal portions 4 are connected to the electrodes 3, and processed in a proper shape, arbitrarily, and formed so as to be protruded to an outside of the external covering material 5.

In addition, the external covering material 5, which will be described later, is realized by putting such a thing that the terminal portions 4 (or lead terminals 8) were connected to the element 2 (or multilayered capacitor 6) in a frame, and pouring melted resin in this frame, and therefore, the terminal portions 4 are protruded from the bottom surface of the external covering material.

That is, it is placed in the frame in such a state that the terminal portions 4 were connected to the element 2, and fixed in such a state that these terminal portions 4 were hooked at the metal mold. By pouring melted resin etc. in this metal mold, up to a portion right before a virtual plane which is formed by the terminal portions 4, such a configuration that the terminal portions 4 are protruded from the bottom surface is to be realized easily.

That is, as compared to costly manufacture such as transfer mold, it becomes possible to have the terminal portions 4 protruded from the bottom surface 9, in order to improve flexure resistance, although it is very easy and of low cost.

At this time, as shown in FIG. 1, the distance 30 between positions where the terminal portions 4 are protruded from the bottom surface 9, and corner portions where the bottom surface 9 and extended surfaces of side surfaces intersect is 0.1 mm or more, and thereby, as compared to such a case that they are protruded from corner portion of the bottom surface 9 and side surfaces of the external covering material 5, distance spaces are generated between the external covering material 5 and the terminal portions 4, and allowance (margin) is generated, and thereby, flexure resistance against shock and vibration after mounting is improved. Further, flexure resistance is improved, and thereby, it is possible to prevent damage such as occurrence of cracks to the external covering material 5 and mounting solder, and shock resistance is improved.

These things are the same even in case of protrusion of the lead terminals 8, shown in FIG. 20 and later.

Next, the external covering material 5 will be described.

The external covering material 5 is, as represented in FIG. 1 etc., molding an electronic device such as a resister and an inductor starting with the element 2 (or multilayered capacitor 6), and a part of the terminal portions 4 (or lead terminals 8) which are connected to it.

As a material of the external covering material 5, epoxy resin such as opto-cresol-novolack series, biphenyl series, and pentadiene series is used preferably.

In addition, a minimum value (the thinnest wall thickness portion of the external covering material 5) of an interval between a surface of the external covering material 5 and a surface of the element 2 (or multilayered capacitor 6) is set to 0.1 mm or more, and thereby, it is possible to improve outer skin breakdown voltage. Further, by setting it to this value or more, it is possible to realize the electronic component 1 which is strong in breakdown voltage, moisture resistance, heat resistance.

In addition, by applying chamfering (R) to the corner portions of the external covering material 5, it becomes possible to improve shock resistance from an outside. At this time, the corner portions may be straight line shaped corner portions, and circular arc shaped corner portions.

In addition, as a shape of the external covering material 5, it is all right if it is a commonly used pillar shape, and it is also all right even if it is a roughly cuboid, a roughly cube, of a trapezoid shape, or of other polygonal pillar, but from the cost phase, the roughly cuboid and roughly cube, or such a trapezoid shape that side surfaces become slightly inclined surfaces. In addition, at the time of molding with the external covering material 5, unavoidable unevenness which occurs on a surface, and so on exist.

If it is a roughly cuboid etc., there occur the bottom surface 9 and side surfaces, and by these things, there occur corner portions (it is all right even if they are complete straight line shaped corner portions, and circular arc shaped corner portions).

Next, the multilayered capacitor 6 will be described.

As to the multilayered capacitor 6, a base body, which is configured by a dielectric material, is laminated with a plurality of sheets, and the internal electrodes 7 are formed, and thereby, it is possible to make it larger capacitance with an identical size, as compared to a single plate capacitor.

The dielectric base body is a base body which was configured by a dielectric material, and a dielectric material such as for example, titanium oxide and barium titanate is suitably used. Alternatively, alumina etc. are also used. By use of the suchlike materials, it is arbitrarily formed in necessary shape, size.

The internal electrode 7 is an electrode which was buried in an inside of the dielectric base body, and as a constituent material of the internal electrode 7, cited are a metal material and alloy including at least one of Ni, Ag, Pd, Cu, Au etc. In particular, by using Ni single body or Ni alloy, it becomes advantageous also on the cost phase. In addition, it is all right even if alloy of these materials, and one to which surface plating processing was applied are used. As a matter of course, it is also all right even if alloy etc. are used. In addition, a thickness of the internal electrode 7 is configured so as to be 1 through 5 μm. In addition, it is desirable that a distance between adjacent internal electrodes 7 is set to 15 μm or more.

At this time, in case that, in particular, a material, which consists primarily of Ni, is used for the internal electrode 7, and an anti-reducing material is used for the dielectric base body which becomes stacked sheets, the multilayered capacitor 6 is realized at very low cost.

The internal electrodes 7 are electrically connected to the electrodes 3, and the internal electrode 7, which is connected to only one of the electrodes 3, faces against the internal electrode 7 which is connected to only the other of the electrodes 3, and major capacitance is generated between these facing internal electrodes 7.

Next, the terminal portions 4 are connected to the electrodes 3. The terminal portion 4 is as described above. The terminal portions 4 are connected to the electrodes 3 as a pair together, and a pair of the lead terminals 8 are connected, in tune with these terminal portions 4.

Meanwhile, a size of the multilayered capacitor 6 is configured so as to satisfy, when it is assumed that its length is L1 and height is L2 and width is L3, $3.0 \text{ mm} \leq L1 \leq 5.5 \text{ mm}$
$0.5 \text{ mm} \leq L2 \leq 2.5 \text{ mm}$
$1.5 \text{ mm} \leq L3 \leq 3.5 \text{ mm}$ but as a matter of course, it is all right even if a size other than this is used, and it is also all right even if a plurality of, but not single, multilayered capacitors 6 are sealed with the external covering material 5.

Meanwhile, when L1 through L3 are made smaller than the above-described lower limits, a forming area of the internal electrode 7 becomes insufficient, and a mutual distance between the internal electrodes 7 becomes narrow necessarily, and it must reduce the number of sheets of the internal electrodes 7, and it becomes difficult to obtain a large capacitance value, and it becomes difficult to obtain an electronic component having wide range of capacitance.

In addition, it is preferable that, in order to prevent damage due to shock against the multilayered capacitor 6 at the time of molding the multilayered capacitor 6 with the external covering material 5, chamfering is applied to corner portions of the multilayered capacitor 6, and a circular arc shaped curve curved line is disposed on a part, or all of each side surface.

In addition, it is also preferable that a plurality of the multilayered capacitors 6 are molded, and mounted in parallel signal lines as a composite device, although it is of a small size, and thereby, mounting cost and labor hour for mounting are reduced.

Next, the lead terminal 8 will be described.

The lead terminals 8 are used as electric terminals for realizing electric conduction between the element 2, the multilayered capacitor 6 in an inside, and a substrate by being connected to a pair of the terminal portions 4, and pulled out to an outside of the external covering material 5, and mounted on a mounting substrate, and are formed as a pair. Meanwhile in response to the number of the multilayered capacitors 6 which are molded in an inside, it is all right even if they are a pair or more, and as to a shape of the lead terminal 8, it is all right even if it is of various shapes such as a rectangle shape, an ellipse shape, a square shape, and a linear shape, and chamfering and curve shape of the corner portion, formation of an inclined portion, or formation of a slit etc., and so on are suitable. In addition, as to its size and width, it is all right if they are arbitrarily decided, in accordance with balance of a mounting area to be required, mounting strength, a size of the element and so on.

The lead terminal 8 is, in the same manner as the terminal portion 4, formed by a dielectric material, and formed by various metals etc. It is all right even if it is configured by a material which includes at least one of Cu, Zn, Ni, Ag, Au etc., and single layer or multiple layer plating processing is applied to its surface. In addition, ally may be available.

In addition, the reason why the lead terminals 8 are protruded from the bottom surface of the external covering material 5 is the same as described as to the terminal portions 4, and it is possible to have them protruded from the bottom surface easily, with maintaining low cost manufacture, and to improve flexure resistance.

At this time, as shown in FIG. 21, a distance between positions where the lead terminals 8 are protruded from the bottom surface 9 and corner portions where the bottom surface and extended surfaces of the side surfaces intersect is 0.1 mm or more, and thereby, as compared to such a case that they are protruded from corner portions of the bottom surfaces 9 and side surfaces of the external covering material 5, distance spaces are generated between the external covering material 5 and the lead terminals 8, and there occurs allowance (margin) and thereby, flexure resistance against vibration and shock after mounting is improved. Furthermore, flexure resistance is improved, and thereby, it is also possible to prevent damage such as occurrence of cracks to the external covering material 5 and mounting solder, and shock resistance is also improved.

In addition, as described later, protrusion from the bottom surface 9 has various forms.

Next, the reinforcing material 20 will be described.

The reinforcing material 20 is formed on a non-mounting surface of the terminal portion 4 and the lead terminal 8. For example, as represented in FIG. 14, it may be formed in the roughly center of the terminal portion 4, and as represented in FIG. 15, it may be formed along a peripheral portion of the terminal portion 4. In case of the former, although its formation is easy, it is possible to improve shock resistance in a longitudinal direction which is weak against stress, and in case of the latter, it is formed across the peripheral portion, and thereby, it becomes possible to improve shock resistance of the terminal portion 4 very much. This is the same even in case of the lead terminal 8 as represented in FIGS. 34 and 35.

Meanwhile, the reinforcing material 20 may be of another shape, and may be formed at another position.

As a material of the reinforcing material 20, resin and ceramic etc. are used, and epoxy series resin etc. are used suitably in the same manner as the external covering material 5. In addition, even if the same material as the external covering material 5 is used, it is suitable. It is all right even if the reinforcing material 20 is of a bar shape, a pillarar shape, and a plate shape, and a plurality of them, but not a single one, are disposed.

In addition, the reinforcing material 20 may be formed only on a front edge or root of the terminal portion 4 or the lead terminal 8.

In case that it is formed on a front edge portion, thereby, it is possible to reduce influence on a front edge of the terminal portion 4 and the lead terminal 8, which is most susceptive to stress due to shock from an external world, and to heighten shock resistance. Furthermore, in case that it is disposed on a front edge portion, thereby, it becomes a weight on the front edge portion, and a pressure crimping force against a mounting substrate is heightened, and mounting reliability, especially endurance against shock etc. is improved, and consequently, there is such a merit that flexure resistance of the terminal portion 4 (or lead terminal 8) is also improved. In case that it was disposed on a root, it becomes difficult to occur a clinch etc.

Next, the curved surface portion 15, the folded portion 16, and the wavy portion 17 as flexure absorbing portions will be described. The flexure absorbing portion is a portion which mitigates influence of flexure which is generated by vibration, shock etc. applied to the mounted electronic component 1.

The curved surface portion 15 is a portion which was disposed on the terminal portion 4 and the lead terminal 8 and was bent in a curved surface shape, and as to this portion, it is not solder-mounted on a mounting substrate, and it plays a role of a buffer material, and thereby, flexure resistance is improved.

The folded portion 16 is the same, and its formation is easier than the case of forming the curved surface portion 15. In particular, in case that it is formed in a roughly V-letter shape, thereby, it can be formed easily, and it is not solder-mounted in the same manner as the curved surface portion 15. In case that it is used as a buffer region, thereby, improvement of flexure resistance is realized.

Meanwhile, the curved surface portion 15 and the folded portion 16 may be disposed in a singular form or a plural form, on the terminal portion 4 and the lead terminal 8, and may be disposed at an arbitrary place such as a root, an intermediate portion, and a front edge portion.

The wavy surface 17 is slightly complex in its formation, but as a buffer region which absorbs flexure, most effective, and flexure resistance is improved very much. The wavy surface 17 may be selected arbitrarily and decided in its size etc., in the context of a mounting area (i.e., mounting strength) of the terminal portion 4 and the lead terminal 8 etc. to be mounted.

Alternatively, the curved surface portion 15, the folded portion 16, and the wavy portion 17 etc., may be combined arbitrarily, in accordance with specifications.

The suchlike flexure absorbing portion may be disposed according to need, and as described later, it further improve improvement of flexure resistance due to protrusion of the terminal portion 4 and the lead terminal 8.

Next, the inclined portion 10 will be described. The inclined portions 10 are disposed on corner portions of the bottom surface 9 and side surfaces of the external covering material 5, and have such a shape that the corner portions were cut out. That is, it is a region which was formed by a surface which connects an arbitrary point of the side surface and an arbitrary point of the bottom surface 9, and had inclination.

The inclined portion 10 may be formed by cutting out the external covering material after it was solidified, or it is possible to form the inclined portions 10 which become inclined on corner portions as shown in FIG. 2, by adjusting a shape of a metal mold from the beginning. In particular, in case that the external covering material 5 is of a square shape such as a roughly cuboid and a roughly cube, the inclined portion 10 is formed with having inclination.

In addition, the inclined portion 10 may be of a straight plane, but as shown in FIGS. 4 and 24, may be of a circular arc surface, and unevenness etc. may be generated unavoidably on the surface.

An advantage due to a combination of the inclined portion 10 and protrusion of the terminal portion 4 and the lead terminal 8 will be described in detail later.

Next, the dent portion 12 will be described.

The dent portions 12 are disposed at arbitrary two placed on the bottom surfaces 9, and become regions from which the terminal portions 4 or the lead terminals 8 are protruded. The dent portion 12 may be, as shown in FIGS. 8 and 28, a triangle shaped cutout, and as shown in FIGS. 7 and 27 etc., a roughly square shaped or roughly hemisphere shaped cutout etc. These may be formed by processing of the external covering material 5, and it is also all right even if a protection cover is attached to circumference of the terminal portion 4 or the lead terminal 8, and then, melted resin is poured into a metal mold etc. to form the external covering material 5, and thereafter, this cover is removed, and after that, the dent portion 12 is formed.

Meanwhile, a shape of the dent portion 12 is not limited to FIGS. 7, 8 etc., and may be various shapes.

The foregoing is description of each portion of the configuration of the electronic component in this embodiment.

Next, an advantages, which is realized from the above-described configurations and can improve flexure resistance, although it is a configuration which enables low cost manufacture, will be described in detail together with the inclined portion 10, as a point of the invention.

Firstly, the terminal portions 4 and the lead terminals 8 are protruded from the bottom surface 9, and positions, where they are protruded, are distant by 0.1 mm or more from corner portions where the bottom surface 9 and extended surfaces of side surfaces of the external covering material 5 intersect, and thereby, it is possible to secure a distance between the terminal portions 4 or the lead terminals 8 and the external covering material 5, and this distance become margin with the external covering material, and flexure resistance is improved. At this time, in case that it is smaller than 0.1 mm, a distance is insufficient, and response to flexure resistance becomes also insufficient.

Next, a feature on a shape of the terminal portion 4 and the lead terminal 8 and its merit will be described.

FIGS. 10 and 30 represent such a configuration that a thickness increases gradually to a front edge, on a portion where the terminal portion 4, the lead terminal 8 are protruded to an outside of the external covering material 5, respectively. The protruded terminal portion 4 and the lead terminal 8 are in a state which is susceptive to influence of shock from an outside, to front edges, but by making the suchlike configuration that it increases in its thickness to a front edge, this influence is avoided, and it is possible to prevent folding-down, bending of the terminal portion 4 and the lead terminal 8, and it is possible to heighten shock resistance and endurance at the time of manufacture, transport, and mounting, and to improve mounting reliability.

Next, FIGS. 11 and 31 show such a configuration that a thickness becomes thinner gradually to a front edge, on a portion where the terminal portion 4, the lead terminal 8 are protruded to an outside of the external covering material 5, respectively. In such a shape that it becomes thinner to a front edge, elastic forces of the terminal portion 4 and the lead terminal 8 become large, and in case that they were mounted on amounting substrate, pressure, which is given to the mounting substrate, is heightened, and it becomes strong against flexure due to shock etc. after mounting. In particular, by using metal etc. with high elasticity and spring performance as a material of the terminal portion 4 and the lead terminal 9, flexure resistance is more improved.

Alternatively, it becomes possible to disperse a burden which is applied to the terminal portion 4 and the lead terminal 8, so that shock resistance and stress resistance are heightened.

Next, FIGS. 12 and 32 represent such a configuration that there exists a portion which is thicker that the thickness of the terminal portion 4, the lead terminal 8 which exist in an inside of the external covering material 5, on a portion where the terminal portion 4, the lead terminal 8 are protruded to an outside of the external covering material, respectively. By this means, it is possible to make the electronic component 1 which is protruded and strong against folding-back and twisting, to stress and shock which are applied from an outside.

Meanwhile, these may be used independently, and may be combined arbitrarily.

As above, by artifice of a shape of the terminal portion 4 and the lead terminal 8, it is possible to improve shock resistance, endurance, and flexure resistance.

Next, improvement of flexure resistance due to the inclined portion 10 and the dent portion 12 will be described.

In case that the inclined portion 10 was formed, thereby, a corner where the inclined portion 10 and the bottom surface 9 intersect becomes a peak (in this regard, however, it is not a peak only a part of which was protruded, and a surface where peaks formed on two places were connected is the bottom surface 9, and its height etc. do not differ particularly) on the bottom surface 9, and becomes positions of two places where a pair of the terminal portions 4, or a pair of the lead terminals 8 are protruded.

Although it will described in detail later, the terminal portion 4 and the lead terminal 9 are protruded based on a corner portion where this inclined portion 10 and the bottom surface 9 intersect, At this time, in case that the terminal portion 4 and the lead terminal 8 are protruded from the bottom surface 9 as a straight plane which is formed with a completely constant height, a distance between the external covering material 5 and the terminal portion 4, or the lead terminal 8 becomes shorter at any rate, and therefore, its allowance is reduced. In contrast to this, the inclined portion 10 is formed, and a corner portion where the inclined portion 10 and the bottom surface 9 intersect is used as a protruding portion of the terminal portion 4 and the lead terminal 9, and thereby, consequently, a portion where the bottom surface 9 is protruded becomes the protruding portion of the terminal portion 4 etc., and therefore, a distance between the external covering material 5 and the terminal portion 4, the lead terminal 8 becomes large. By this means, sufficient allowance (margin) is generated, and flexure resistance is improved substantially. Furthermore, by the existence of the inclined portion 10, the protruding portion of the terminal portion 4 or the lead terminal 8, which is the weakest against stress in the electronic component 1, becomes of a blunt angle, or a circular arc shape, and therefore, there is such a merit that it is possible to prevent damage such as cracks to the external covering material 5 which can be generated from shock from an outside, and vibration which is applied to the terminal portion 4 and the lead terminal 8.

Meanwhile, chamfering, an inclined portion etc. are applied to a corner portion of the external covering material 5 other than the inclined portion 10, and thereby, a corner portion is reduced, or eliminated from the external covering material, and therefore, it is possible to damage due to external shock.

In the same manner, the terminal portion 4 or the lead terminal 8 is protruded from the dent portion 12, and thereby, in the same manner, it is possible to secure a distance and a space with the external covering material 5, and therefore, allowance (margin) can be secured, and flexure resistance is improved.

Furthermore, improvement of flexure resistance due to protrusion of the terminal portion 4 and the lead terminal 8 from a corner portion where the suchlike inclined portion 10 and the bottom surface 9 intersect, or protrusion from the dent portion 12 will be described.

Firstly, as shown in FIGS. 2 and 22 etc., in case that the terminal portion 4 and the lead terminal 8 are protruded from the corner portion where the inclined portion 10 and the bottom surface 9 intersect, and in case of such a configuration that they are once stretched to a lower side, and then, after that, folded back in a roughly L-letter shape, and a mounting surface is formed, flexure resistance is improved.

That is, since they are once stretched to a lower side, a distance space between the external covering material 5 and the terminal portion 4, the lead terminal 8 becomes large, and a portion, which becomes allowance (margin), becomes very large. In particular, margin in a roughly vertical direction to a mounting plane can be taken on a grand scale, after mounting, and therefore, it becomes possible to respond to not only flexure due to vibration and shock which are applied in a horizontal direction of the mounting plane, but also flexure due to vibration and shock which are applied in a roughly vertical direction, and these configurations are combined, so that flexure resistance is improved very much.

Figure 26:
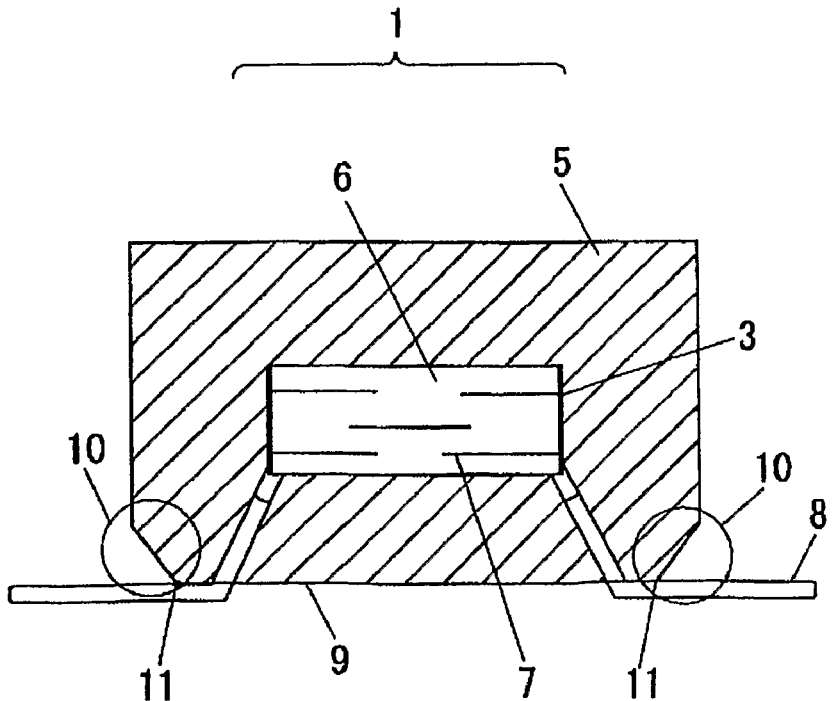
FIG. 26 is a side view of an electronic component in an embodiment of the invention.

In addition, as shown in FIGS. 6 and 26 etc., the terminal portion 4 and the lead terminal 8 are protruded from positions of the bottom surface 9, which entered into an slightly more inside than the corner portion where the inclined portion 10 and the bottom surface 9 intersect, and they are stretched on a mounting surface along the bottom surface in roughly parallel with the same, without change.

In the suchlike configuration, since a distance space between the external covering material 5 and the terminal portion 4, the lead terminal 8 is small in a roughly vertical direction to the mounting plane, a responding force to vibration and shock in a roughly vertical direction is weak, but it is strong against vibration etc. in a horizontal direction, in the same manner, and flexure resistance is sufficiently secured. Furthermore, in this case, since a distance between the electronic component 1 and the mounting substrate becomes small, there is such a merit that mounting stability and mounting strength are secured.

These are the same not only in such a case that protrusion is carried out from the corner portion where the inclined portion 10 and the bottom surface 9 intersect, but also in such a case that protrusion is carried out from the dent portion 12.

In addition, although it becomes repetition, the flexure absorbing portion is formed, and thereby, flexure resistance is improved more. As described above, since the flexure absorbing portion becomes a buffer region which is not solder-connected to a mounting substrate at the time of mounting, it is possible to absorb various vibrations etc., and it is possible to improve flexure resistance more.

By the electronic component 1 which has the configurations as above, it becomes possible to realize the electronic component 1 in which flexure resistance is high and a life is long, with maintaining low cost, and it is possible to realize endurance, a longer life performance of an electronic device in which the electronic components 1 were mounted.

Further, with maintaining low cost due to simplification of manufacturing processes, shock resistance, endurance, heat resistance, moisture resistance etc. by which damage to an external covering material is prevented, are improved, and the electronic component 1 which is suitable for practical use, and an electronic device are realized.

FIGS. 43, 44, 45, 46, 47, 48, 49, 50, 51, 52, 53, 54, 55, 62, 63, 64, 65, 66, 67, 68, 69, 70, 71, 72, 73, and 74 are side views of electronic components in embodiments of the invention, and FIGS. 56, 57, 58, 59, 60, 61, and 62 are top views of the electronic components in the embodiments of the invention. FIGS. 60, 61, 79 and 80 are manufacturing process views of an electronic component of embodiments of the invention.

FIGS. 43 through 59 represent such a configuration that terminal portions are connected to an element which is various electronic devices such as a capacitor (single plate, stacked, electrolytic etc.), a resistor, an inductor, a filter, and IC, and they are molded with an external covering material, and they are molded with an external covering material, and a part of the terminal portions are protruded from convex portions which were disposed on a bottom surface of the external covering portion.

On one hand, FIGS. 19 through 36 represents such a configuration that, as an internal element, a multilayered capacitor is represented, and terminal portions are connected to the multilayered capacitor, and a pair of lead terminals are connected to the terminal portions, and they are molded with an external covering material, and a part of the lead terminals are protruded from the convex portions which were disposed on the bottom surface of the external covering material.

A configuration which is represented from FIG. 43 through FIG. 60, and a configuration which is represented from FIG. 61 through FIG. 78 are almost corresponding configurations, except for such a matter that the element is the multilayered capacitor and the lead terminals are connected, and hereinafter, according to need, explanations will be overlapped, and in case that there are main overlaps, they will be omitted.

101 designates an electronic component, and 102 designates an element, and 103 designates an electrode, and 104 designates a terminal portion, and 105 designates an external covering material, and 106 designates a multilayered capacitor, and 107 designates an internal electrode, and 108 designates a lead terminal, and 109 designates a bottom surface, and 110 designates a convex portion, and 112 designates chamfering, and 115 designates a curved surface portion, and 116 designates a folded portion, and 117 designates a wavy portion, and 120 designates a reinforcing material, and the curved surface portion 115, the folded portion 116, and the wavy portion 117 are represented as an example of a flexure absorbing portion. In addition, 130 designates a metal mold, and 131 designates a metal mold inside, and 132 designates a resin supply section, and 133 designates a cooling section, and 134 designates melted resin, and 135 designates a cooling fan.

Firstly, in a configuration of the electronic component 101, features of the configuration which is represented in each figure respectively and advantages thereof will be briefly described.

Figure 43:
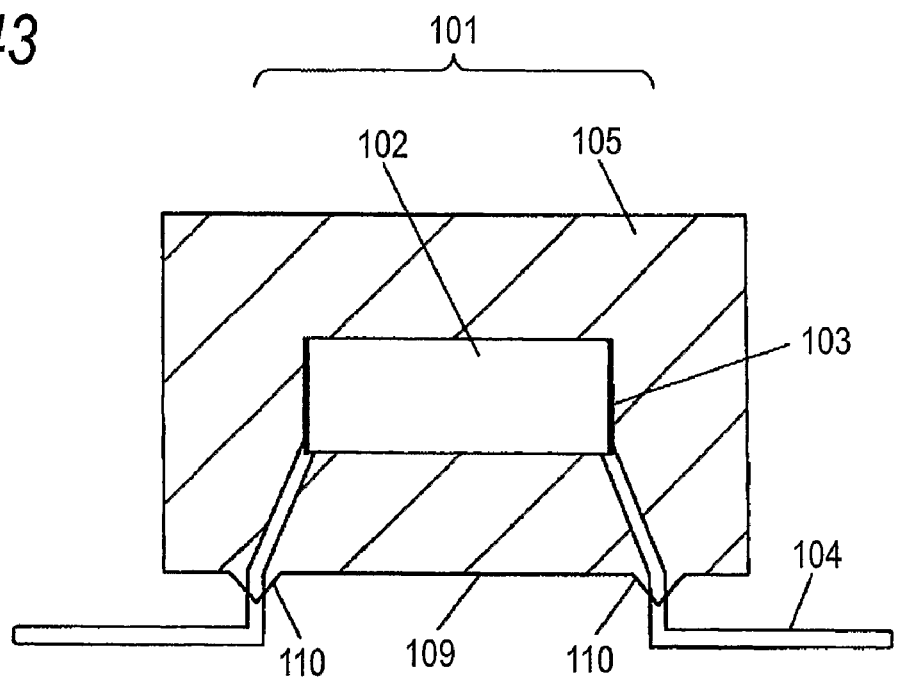
FIG. 43 is a side view of an electronic component in an embodiment of the invention.

FIG. 43 shows such a configuration that the terminal portions 104 are protruded from the convex portions 110 which were disposed on the bottom surface 109, and after the protruded terminal portions 104 are once stretched to a lower side, and folded back in a roughly L-letter shape, and mounting becomes available. By this configuration, a space is generated between the bottom surface 109 of the external covering material 105 and the terminal portions 104, and this space becomes allowance (margin), and flexure resistance is improved.

Figure 44:
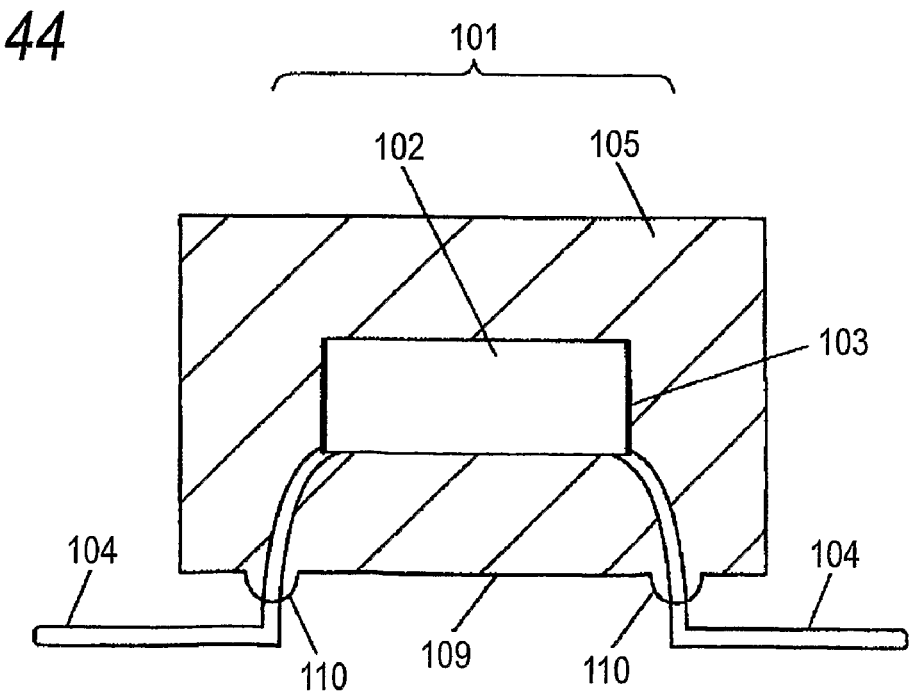
FIG. 44 is a side view of an electronic component in an embodiment of the invention.

FIG. 44 shows such a case that the convex portion 110, which was disposed on the bottom surface 109, is a semicircular pillar, and in the same manner as the case of FIG. 43, the terminal portions 104 are folded back in a roughly L-letter shape and protruded, allowance (margin) between them and the bottom surface 109 of the external covering material 105 is generated, and flexure resistance is improved.

Figure 45:
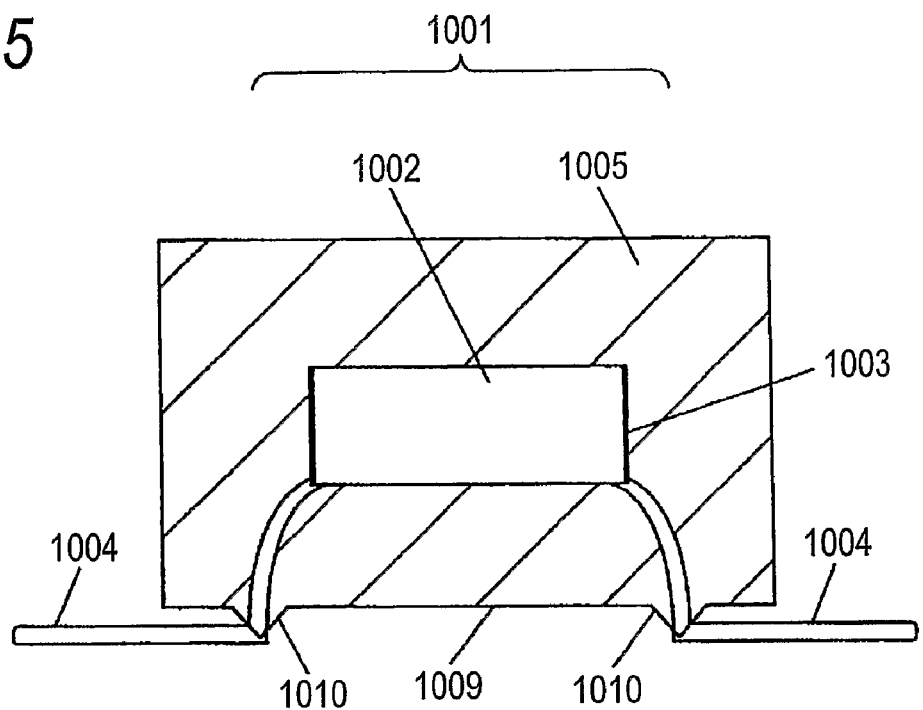
FIG. 45 is a side view of an electronic component in an embodiment of the invention.

FIG. 45 represents such a configuration that the terminal portions 104 are protruded from the convex portions 110 which were disposed on the bottom surface 109, but the terminal portions 104 are folded back at places where they left from front edges of the convex portions 110, and a mountable configuration is realized. According to this configuration, a space is secured between the terminal portions 104 and the bottom surface 109, by just portions of the convex portions 110, and by this secured space, margin is generated between the external covering material 105 and the terminal portion 104, and flexure resistance is improved.

Figure 46:
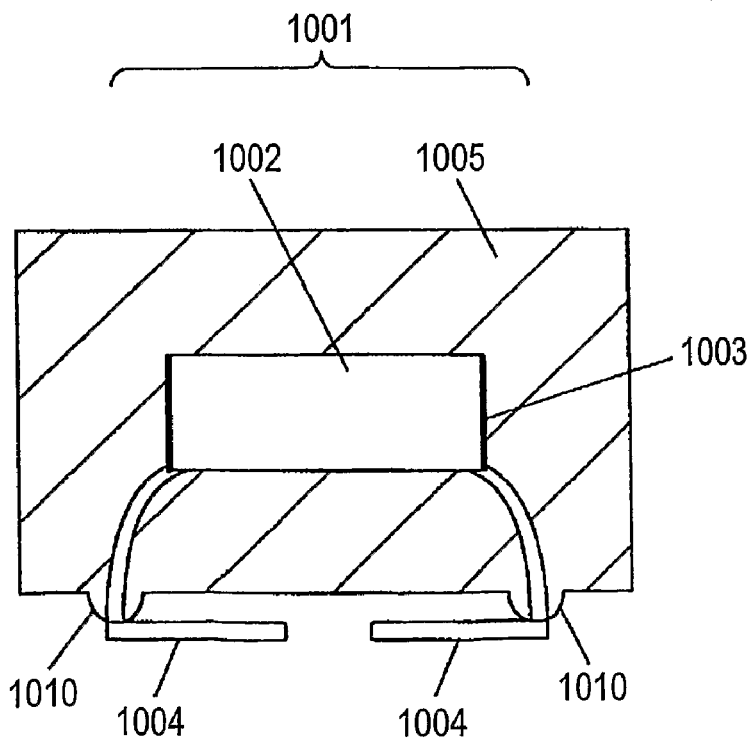
FIG. 46 is a side view of an electronic component in an embodiment of the invention.

FIG. 46 also shows a configuration which is similar to FIG. 45, and shows such a configuration that the terminal portions 104 are folded back on an inward side. It is suitable for reducing a mounting area.

Figure 47:
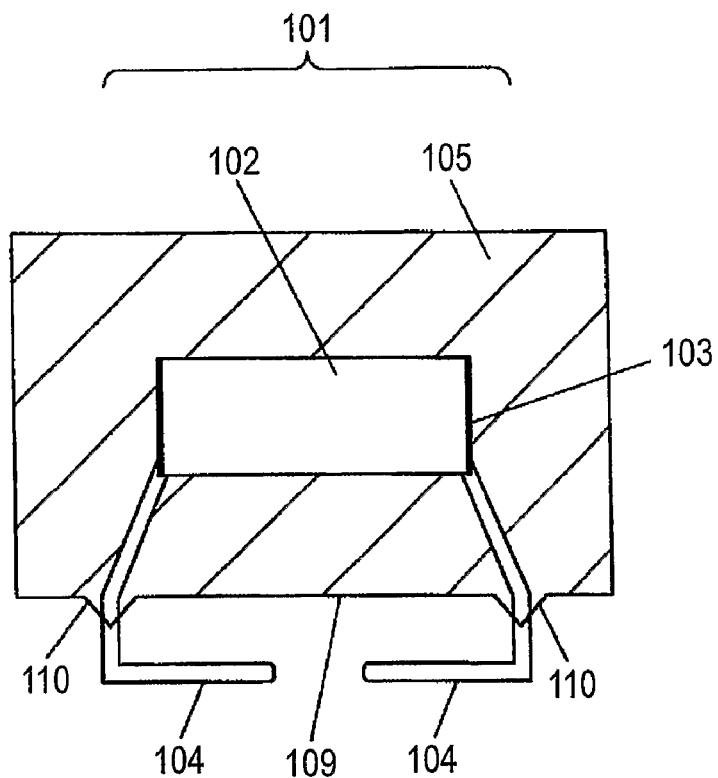
FIG. 47 is a side view of an electronic component in an embodiment of the invention.

FIG. 47 represents a configuration which is similar to FIG. 43, and in which the terminal portions 104 are folded back on an inward side, as in FIG. 46, and just the same, it is suitable for reducing a mounting area of the electronic component 101 over maintaining flexure resistance improvement.

Figure 48:
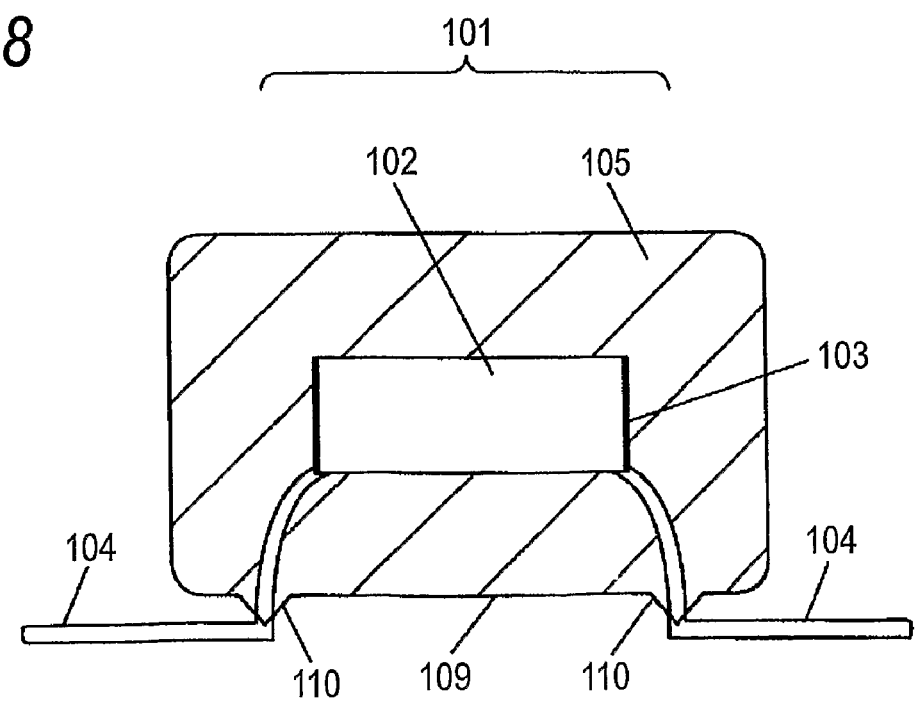
FIG. 48 is a side view of an electronic component in an embodiment of the invention.

FIG. 48 represents a configuration which is similar to FIG. 46 but such a case that the convex portions are not semicircular pillars, but of a roughly triangle shape widening toward a root of the terminal portion 104. As described later, formation of the convex portion 110 is very easy.

Figure 49:
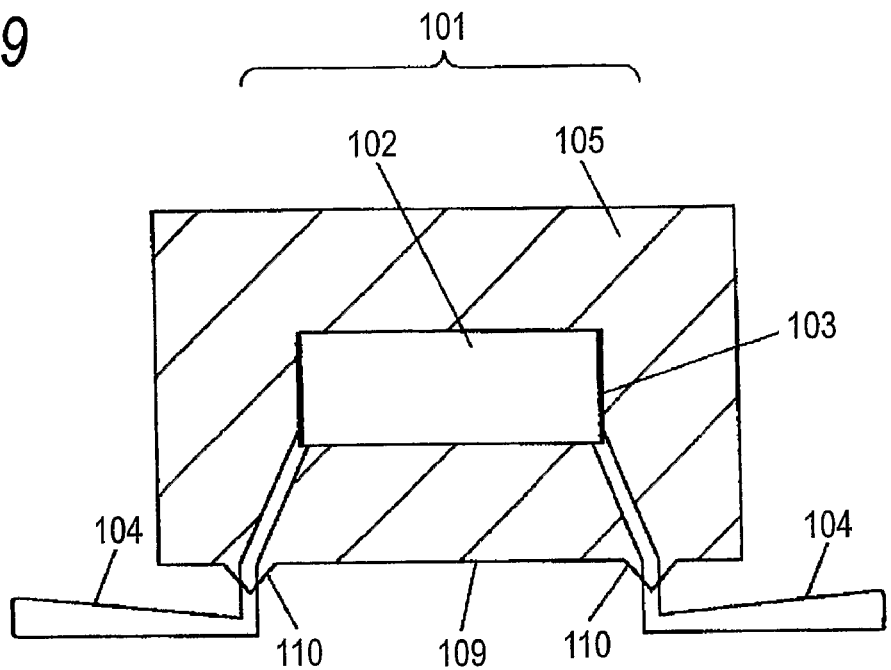
FIG. 49 is a side view of an electronic component in an embodiment of the invention.

FIG. 49 represents such a configuration that the terminal portions 104, which are protruded to an outside and folded back in tune with a mounting surface, increase in thickness to front edges. By the terminal portion of this configuration, realized is strength securement of the front edge of the terminal portion which is weak against stress such as shock.

Figure 50:
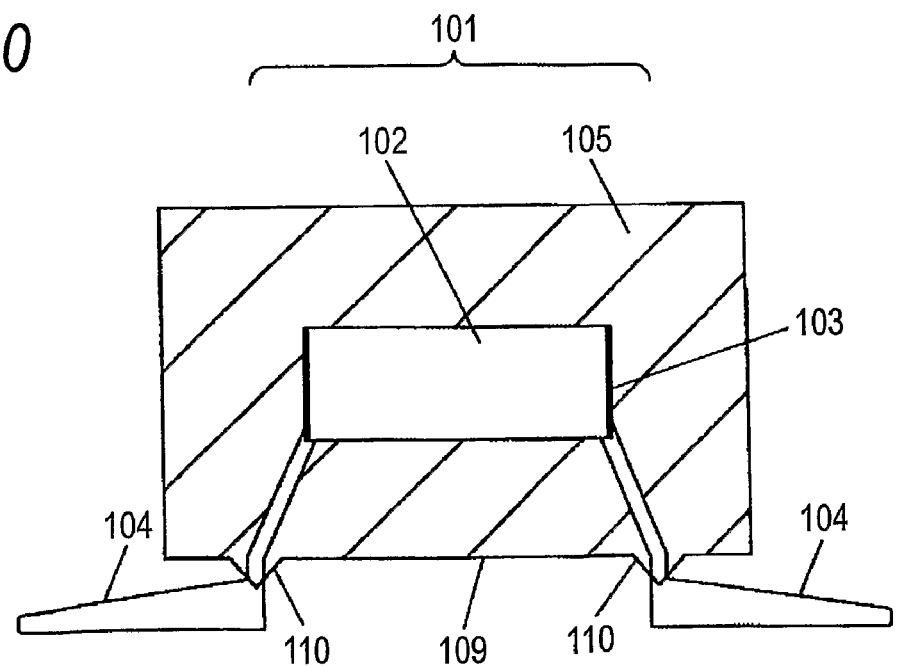
FIG. 50 is a side view of an electronic component in an embodiment of the invention.

FIG. 50 represents such a configuration that the terminal portions 104, which are protruded to an outside and folded back in tune with a mounting surface, become thinner to front edges, and elasticity is generated on the terminal portion 104, and flexure resistance is further improved.

Figure 51:
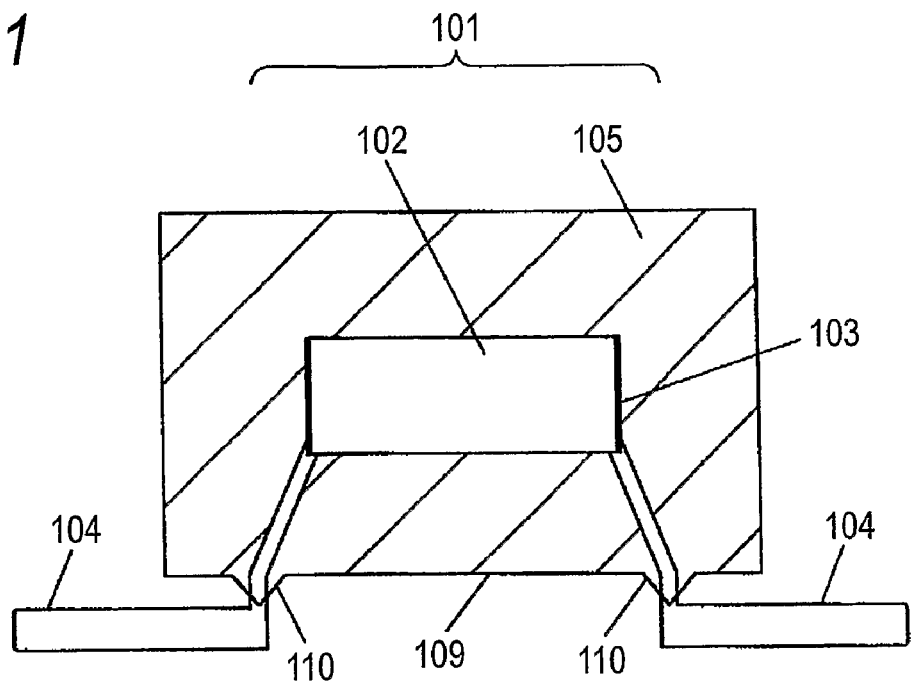
FIG. 51 is a side view of an electronic component in an embodiment of the invention.

FIG. 51 represents a configuration having a portion which is thicker in thickness than the terminal portion 104 in an inside of the external covering material 105, on the terminal portion which was protruded to an outside of the external covering material 105. A thickness of a portion which was protruded to an outside is increased, and thereby, it is possible to improve shock resistance etc.

Figure 52:
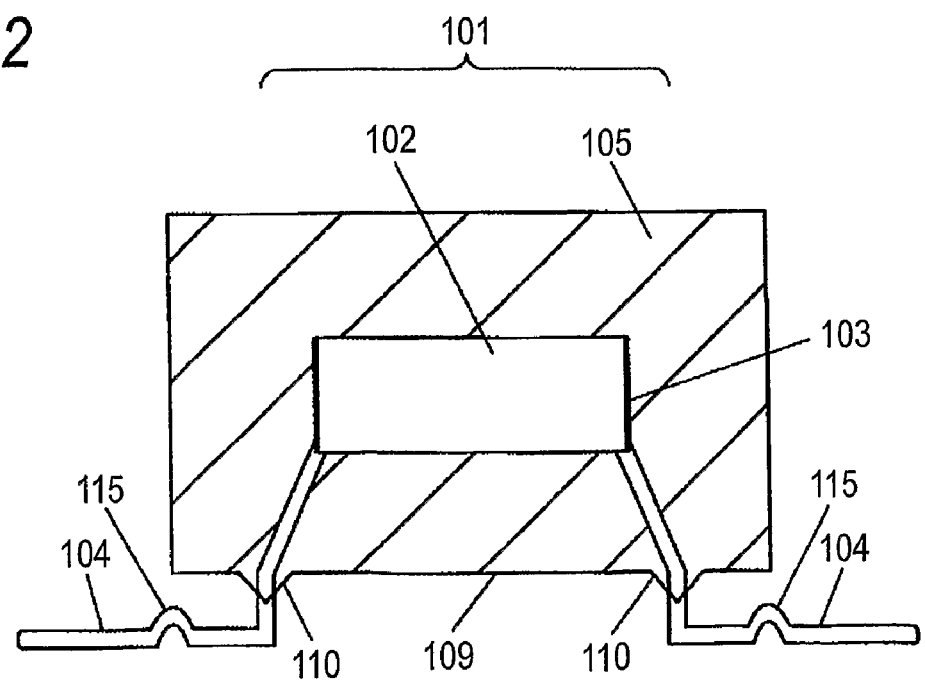
FIG. 52 is a side view of an electronic component in an embodiment of the invention.

FIG. 52 represents such a configuration that the curved surface portion 115 as a flexure absorbing portion is disposed on a part of the terminal portion 104 which was protruded to an outside of the external covering material 105. By this configuration, it is possible to improve flexure resistance against vibration etc. which are applied mainly in a horizontal direction after mounting, in addition to flexure resistance improvement due to space securement between the bottom surface 109 of the external covering material 105 and the terminal portion 104.

Figure 53:
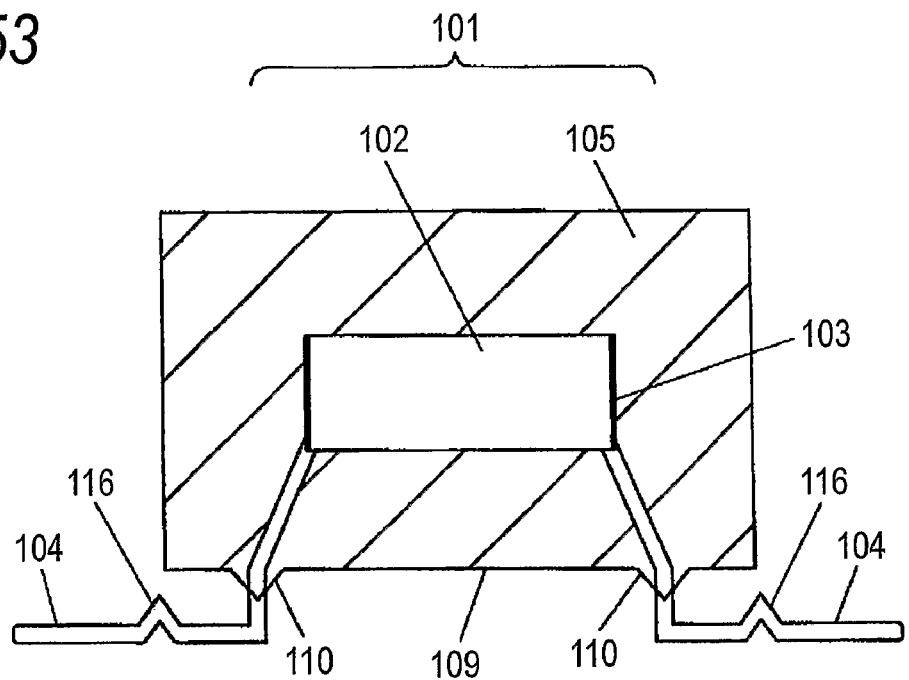
FIG. 53 is a side view of an electronic component in an embodiment of the invention.

FIG. 53 shows such a configuration that the folded portion 116y is formed as the flexure absorbing portion. In the same manner as FIG. 52, additional improvement of flexure resistance is realized.

Figure 54:
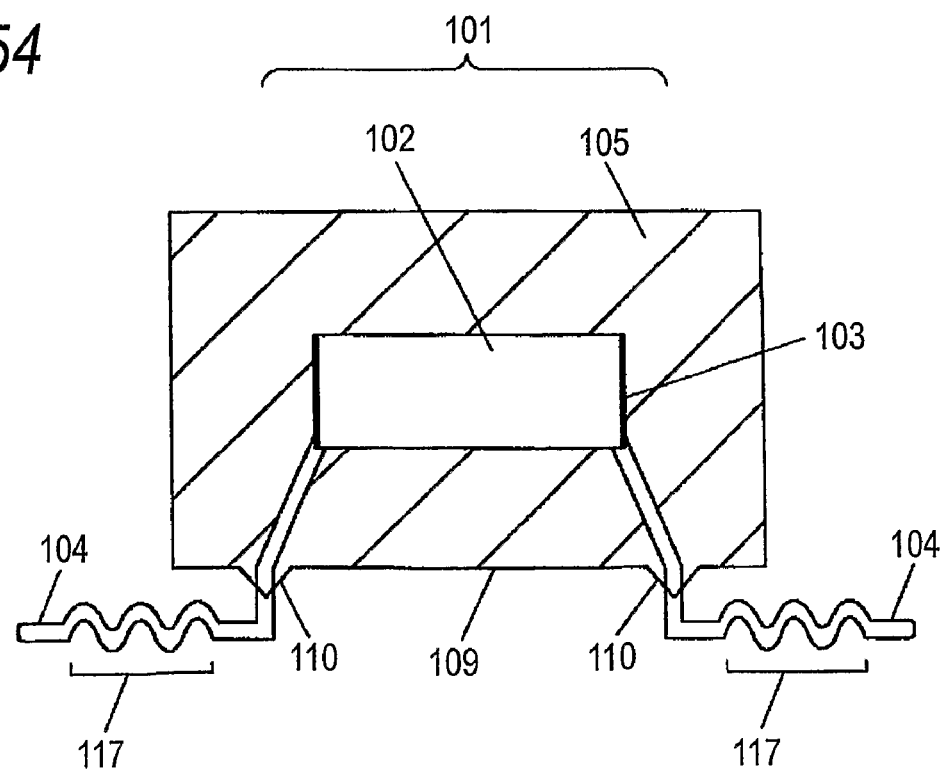
FIG. 54 is a side view of an electronic component in an embodiment of the invention.

FIG. 54 shows such a configuration that the wavy surface 117 is formed as the flexure absorbing portion. Additional improvement of flexure resistance is realized.

Figure 55:
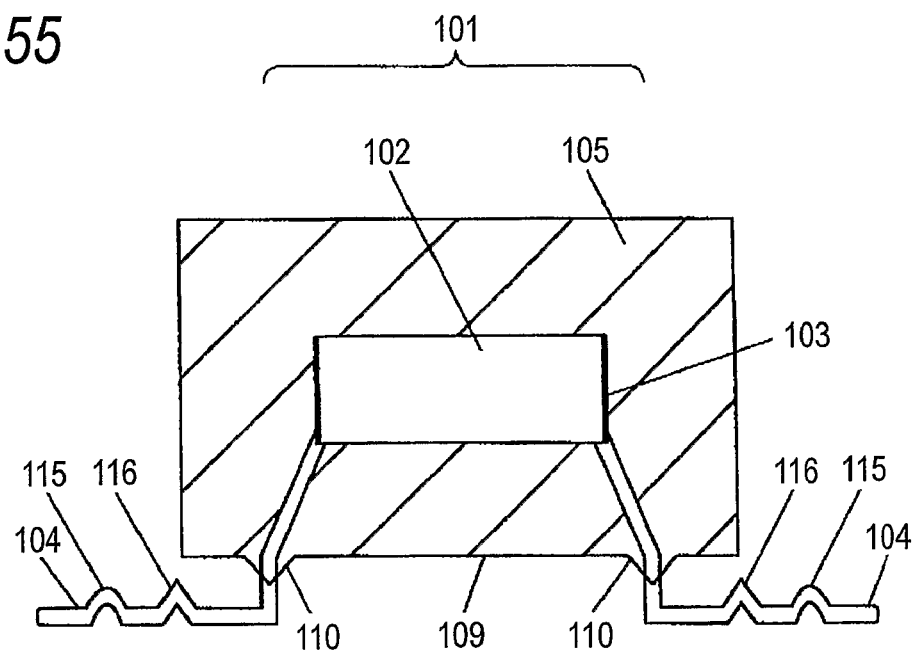
FIG. 55 is a side view of an electronic component in an embodiment of the invention.

FIG. 55 shows such a configuration that the curved surface portion 115 and the folded portion 116 are formed on the terminal portion 104 as the flexure absorbing portion. The flexure absorbing portions with a plurality of shapes are combined and formed, and thereby, respective good points in flexure resistance are enjoined and additional flexure resistance improvement is realized.

Figure 56:
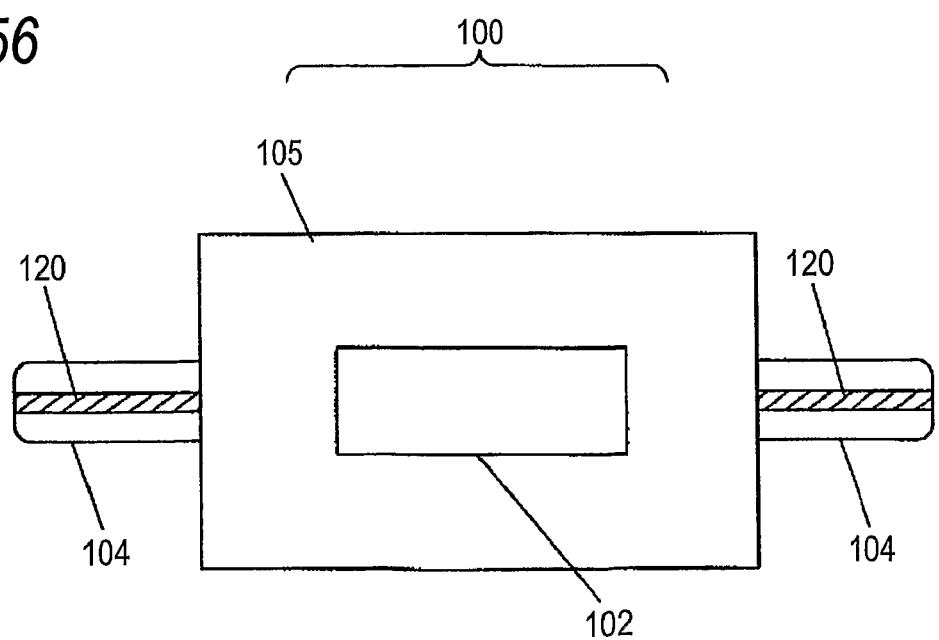
FIG. 56 is a top view of an electronic component in an embodiment of the invention.

FIG. 56 represents such a configuration that the reinforcing material 120 was disposed at an approximately center portion in a longitudinal direction of a non-mounting surface of the terminal portion 104. By this configuration, shock resistance etc. of the terminal portion 104 is improved.

Figure 57:
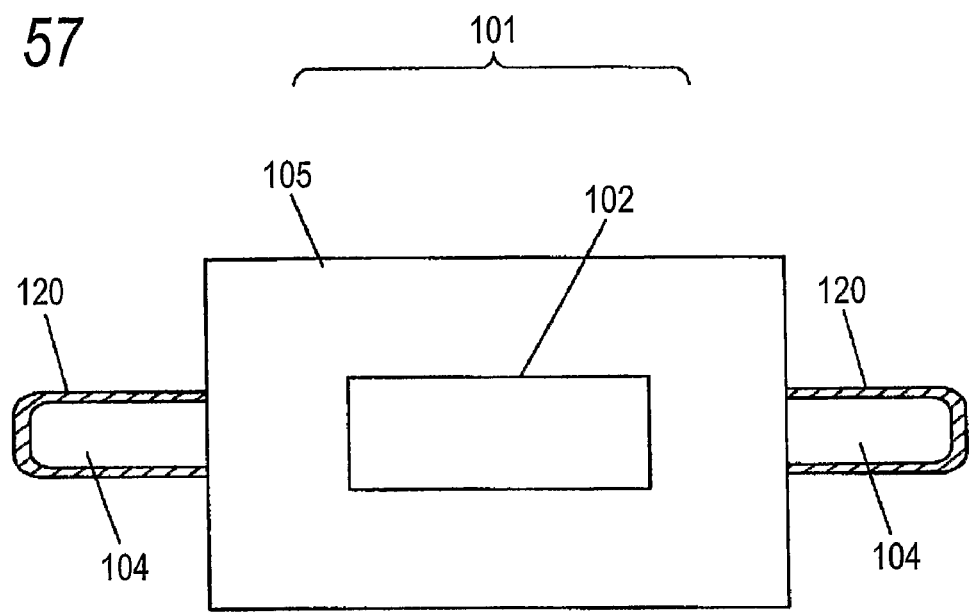
FIG. 57 is a top view of an electronic component in an embodiment of the invention.

FIG. 57 represents such a configuration that the reinforcing material 120 was disposed at a peripheral portion of the non-mounting portion of the terminal portion 104. By this configuration, shock resistance of the terminal portion 104 is improved.

Figure 58:
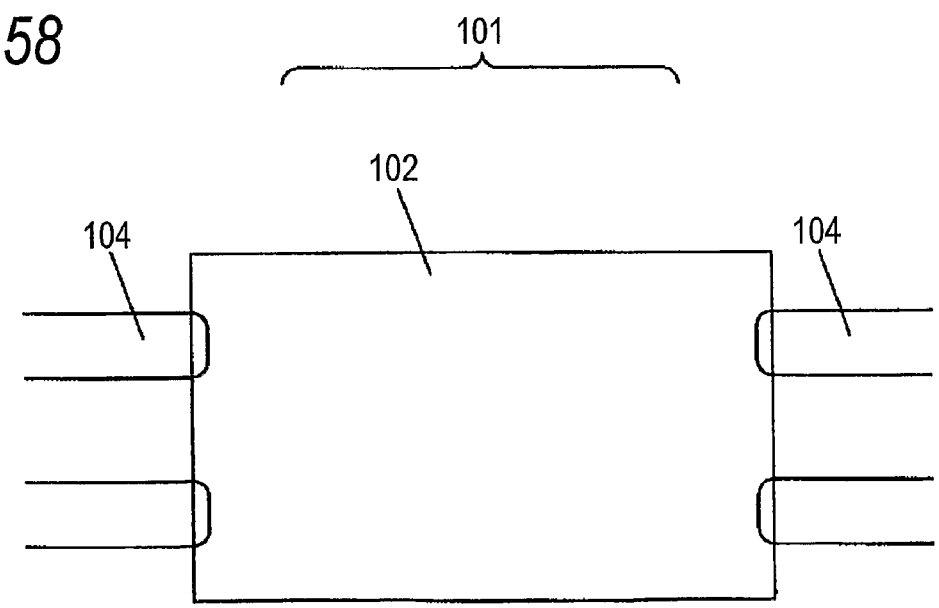
FIG. 58 is a top view of an electronic component in an embodiment of the invention.

FIG. 58 represents such a configuration that a plurality of paired terminal portions 104 are connected to one base body, and it is possible to configure a composite device easily in a small size.

Figure 59:
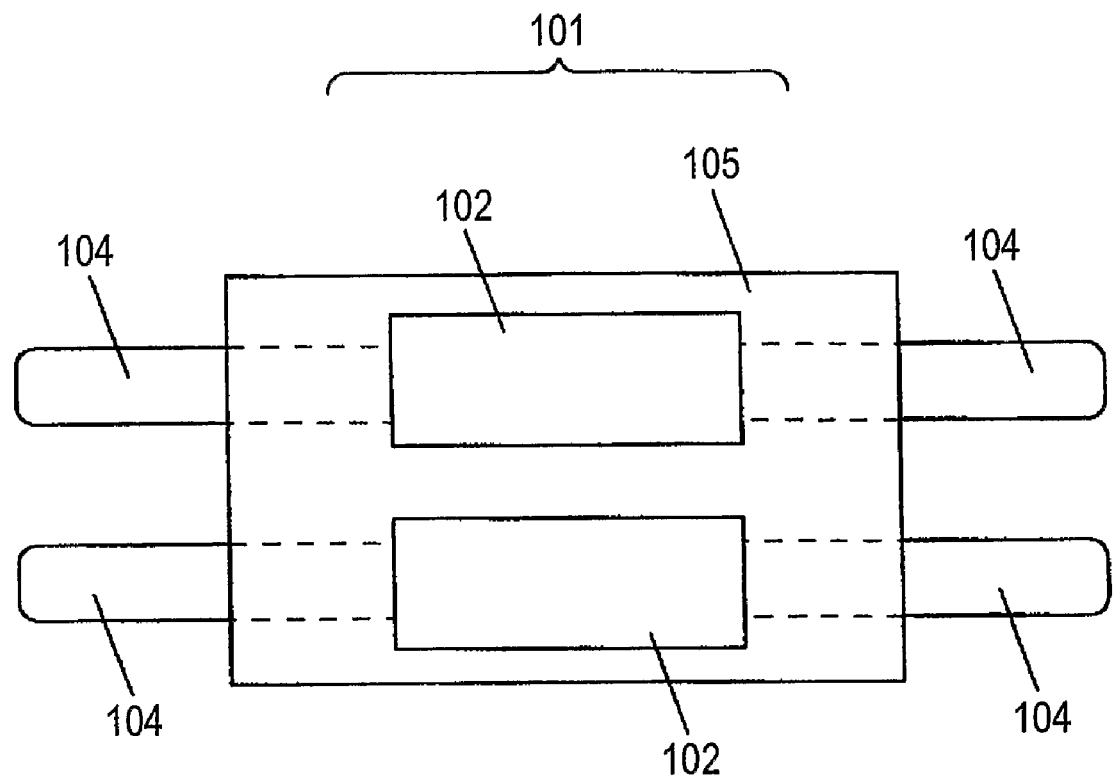
FIG. 59 is a top view of an electronic component in an embodiment of the invention.

FIG. 59 shows such a configuration that a plurality of elements 102 are sealed in one external covering material 105, and it is possible to configure a composite device easily in a small size, and to save labor hour for mounting.

Figure 60:
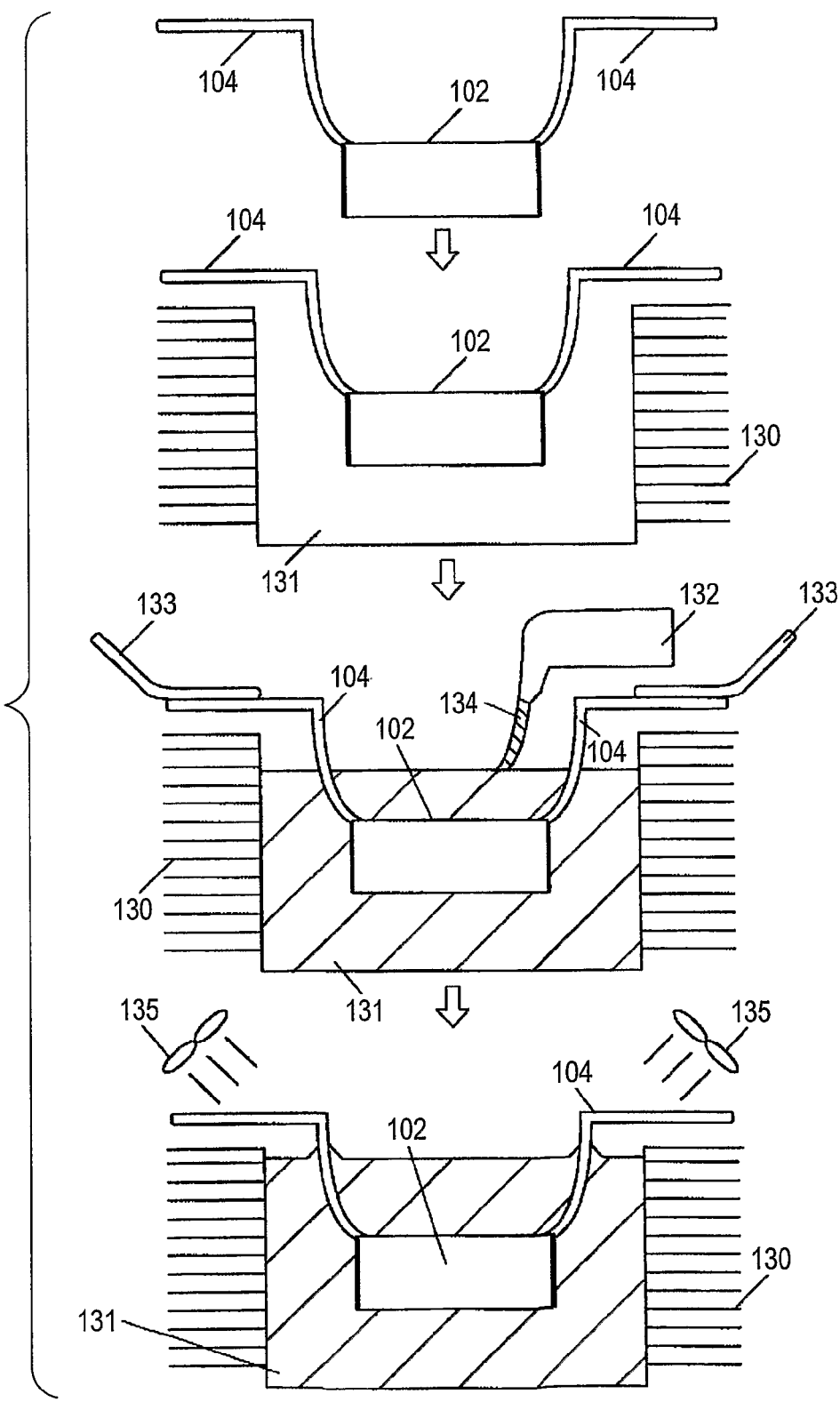
FIG. 60 is a manufacturing process view of an electronic component in an embodiment of the invention.

FIG. 60 represents a manufacturing process of the electronic component 101.

Figure 61:
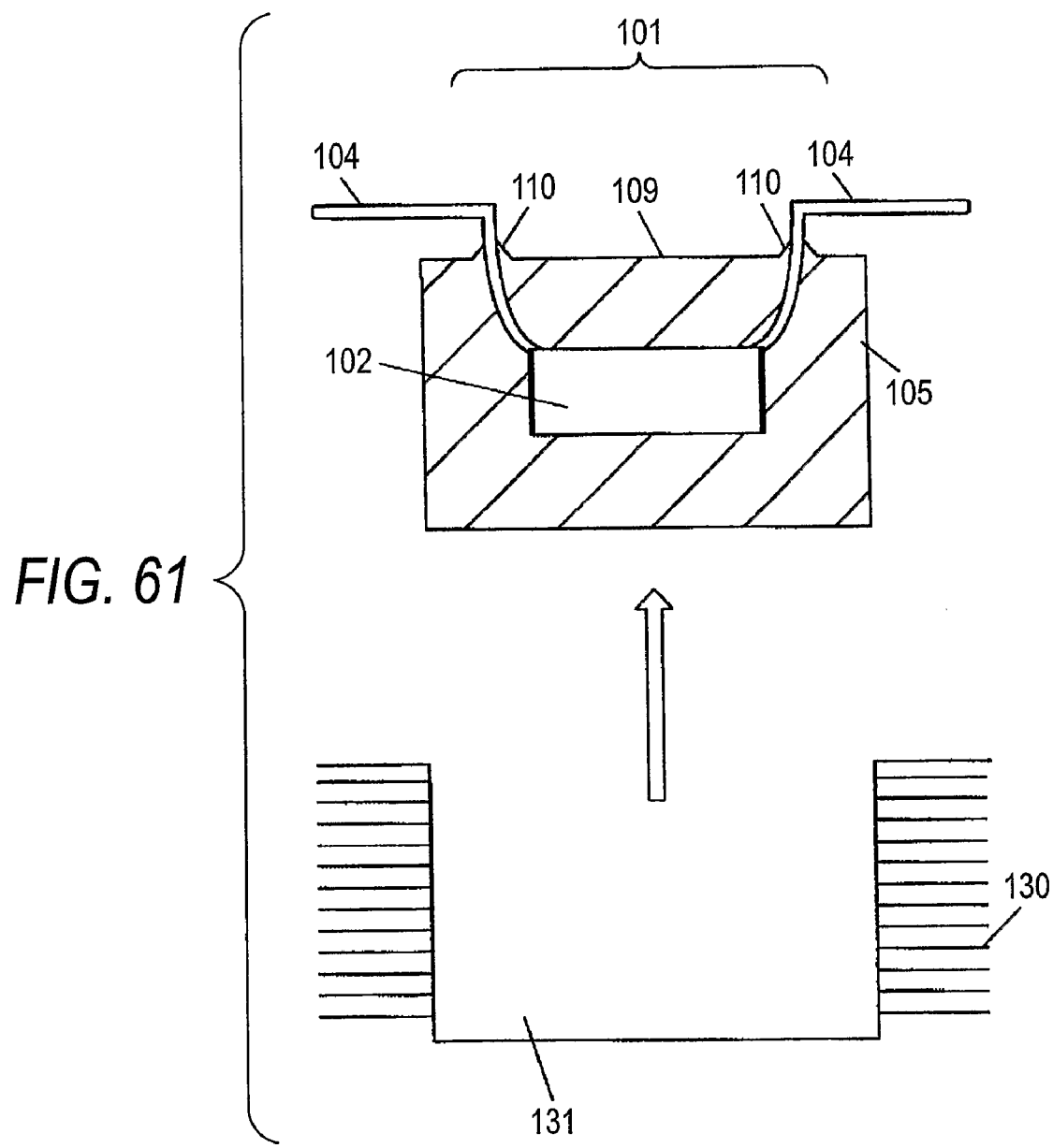
FIG. 61 is a manufacturing process view of an electronic component in an embodiment of the invention.

FIG. 61 represents the electronic component 101 which was manufactured in accordance with the manufacturing process represented in FIG. 60.

Figure 62:
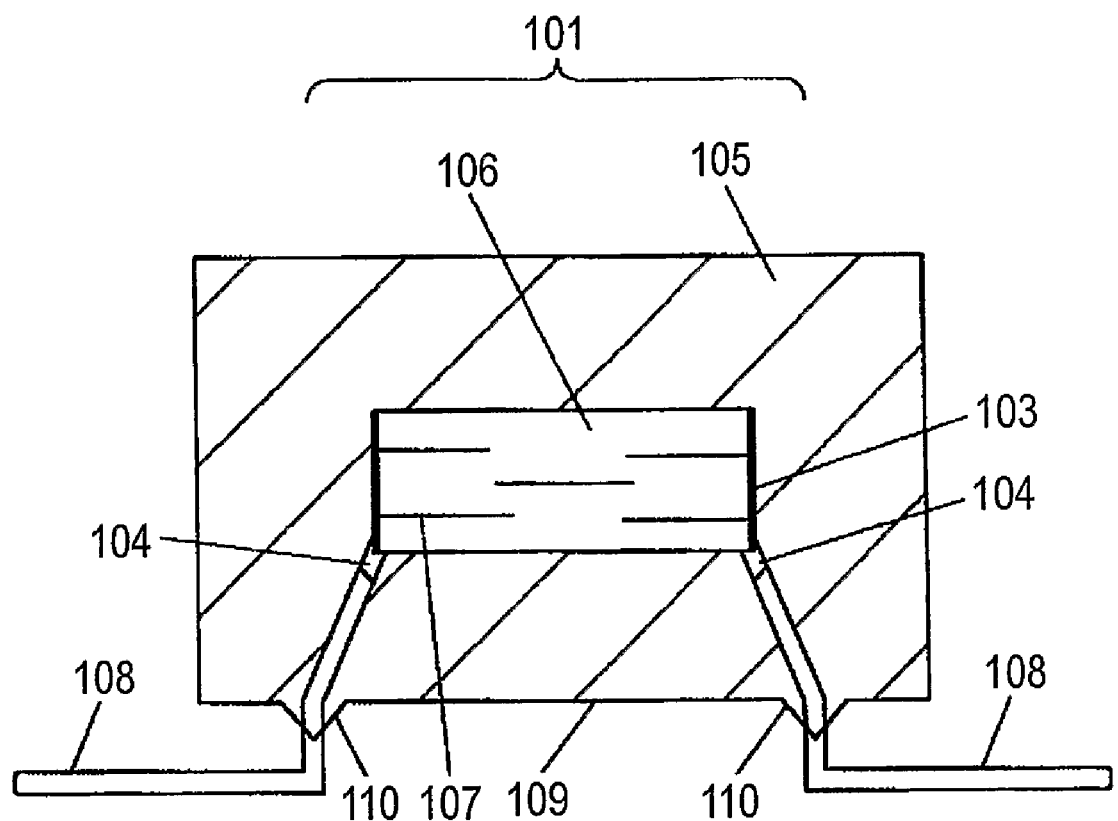
FIG. 62 is a side view of an electronic component in an embodiment of the invention.

FIG. 62 represents such a configuration that the lead terminals 108 are protruded from the convex portions 110 which were disposed on the bottom surface, and the protruded lead terminals 108 are once stretched to a lower side, and thereafter, folded back in a roughly L-letter shape, and thereby, mounting becomes possible. By this configuration, a space is to be generated between the bottom surface 109 of the external covering material 105, and the lead terminal 108, and this space becomes allowance (margin), and flexure resistance is improved.

Figure 63:
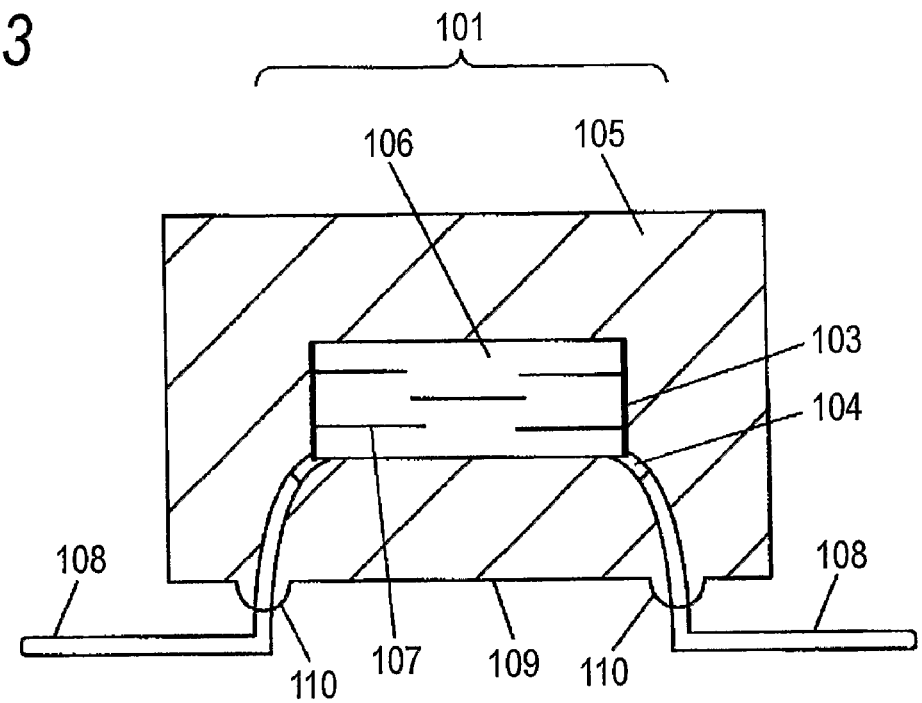
FIG. 63 is a side view of an electronic component in an embodiment of the invention.

FIG. 63 shows such a case that the convex portion 110, which was disposed on the bottom surface 109, is a semicircular pillar, and in the same manner as the case of FIG. 61, the lead terminal 108 is folded back in a roughly L-letter shape and protruded, and allowance (margin) between it and the bottom surface of the external covering material 105 is generated, and flexure resistance is improved.

Figure 64:
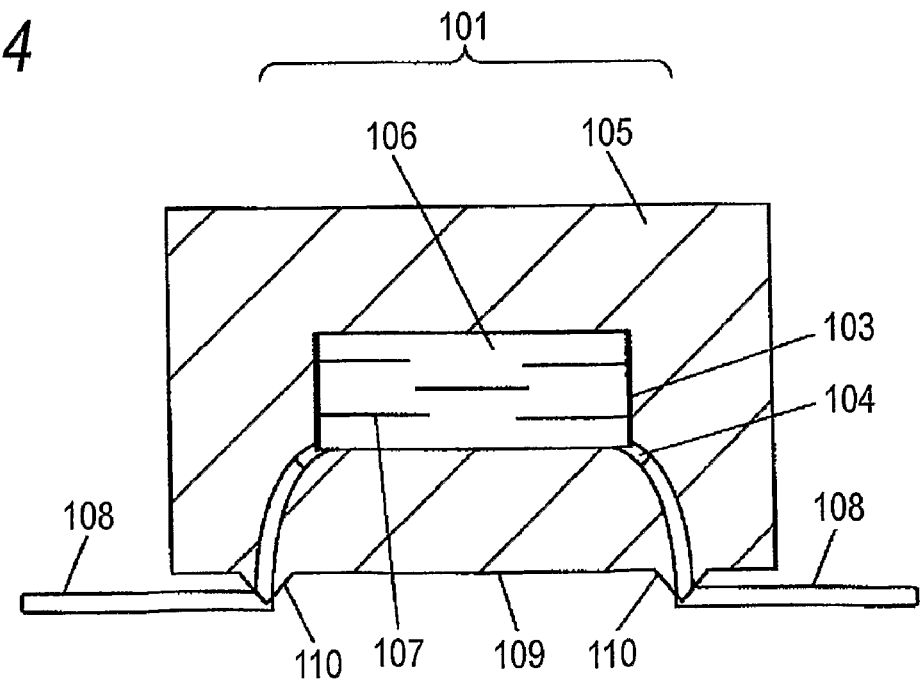
FIG. 64 is a side view of an electronic component in an embodiment of the invention.

FIG. 64 represents such a configuration that the lead terminals 108 are protruded from the convex portions 110 which were disposed on the bottom surface 109, and the lead terminal 108 is folded back at a place where they left from front edges of the convex portions 110, and a mountable configuration is realized. According to this configuration, a space is secured between the lead terminals 104 and the bottom surface 109, by just portions of the convex portions 110, and by this secured space, margin is generated between the external covering material 105 and the lead terminal 104, and flexure resistance is improved.

Figure 65:
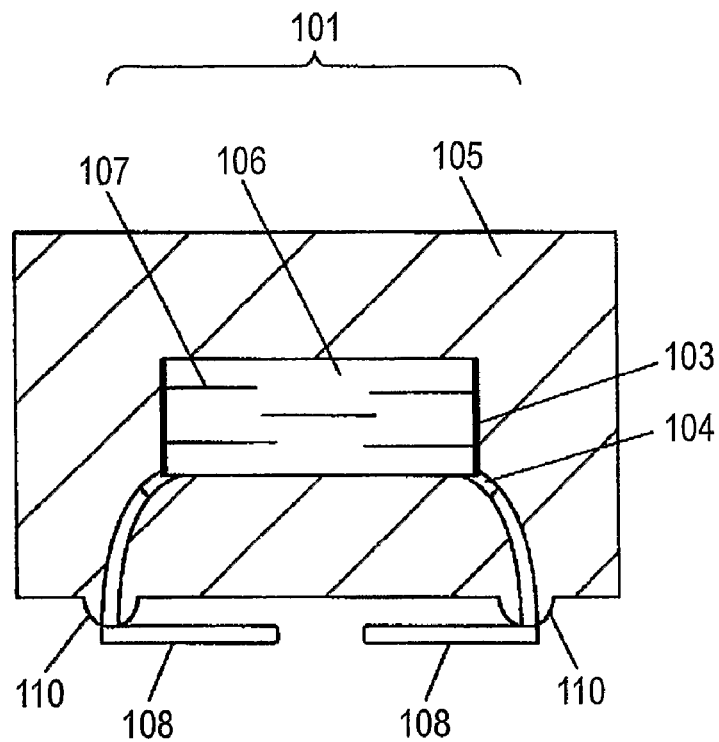
FIG. 65 is a side view of an electronic component in an embodiment of the invention.

FIG. 65 also shows a configuration which is similar to FIG. 64, and shows such a configuration that the lead terminals 108 are folded back on an inward side. It is suitable for reducing a mounting area.

Figure 66:
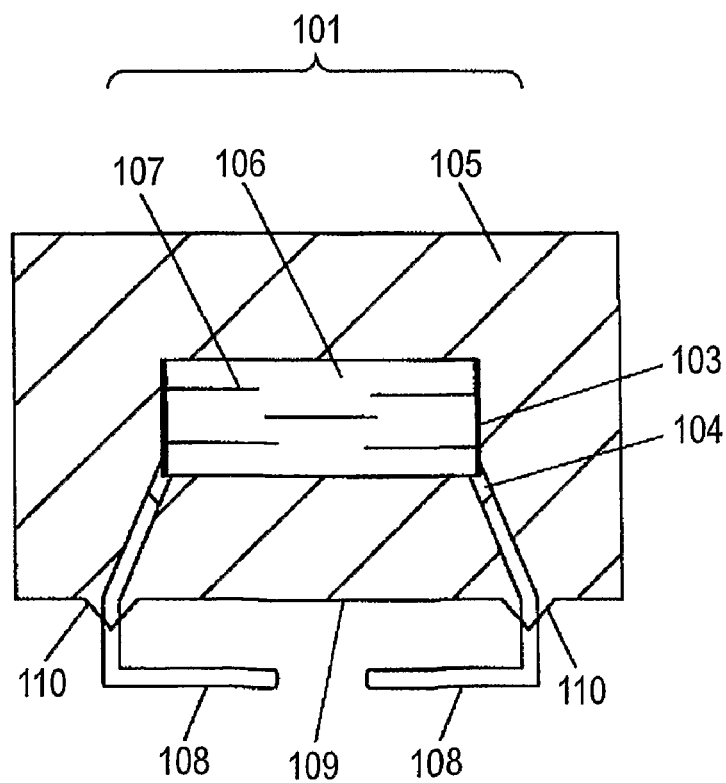
FIG. 66 is a side view of an electronic component in an embodiment of the invention.

FIG. 66 represents a configuration which is similar to FIG. 61, and in which the terminal portions 104 are folded back on an inward side, as in FIG. 65, and just the same, it is suitable for reducing a mounting area of the electronic component 101 over maintaining flexure resistance improvement.

Figure 67:
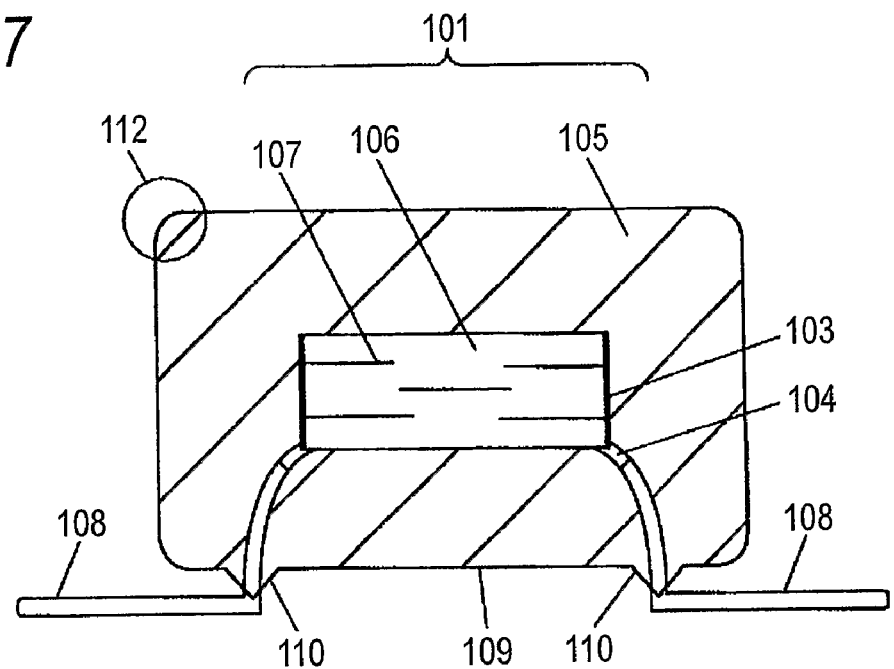
FIG. 67 is a side view of an electronic component in an embodiment of the invention.

FIG. 67 represents a configuration which is similar to FIG. 65 but such a case that the convex portions are not semicircular pillars, but of a roughly triangle shape widening toward a root of the terminal portion 104. As described later, formation of the convex portion 110 is very easy.

Figure 68:
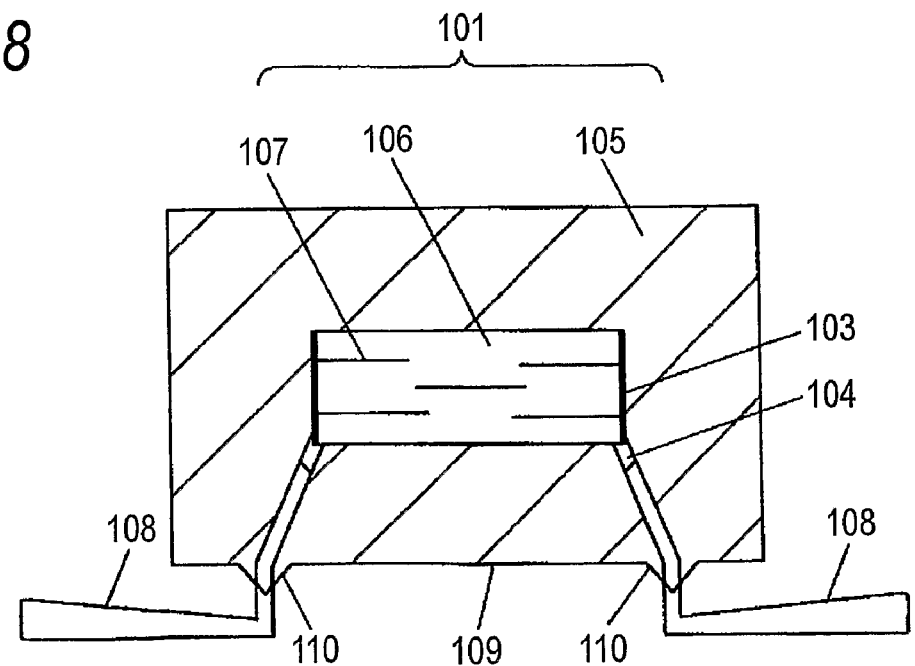
FIG. 68 is a side view of an electronic component in an embodiment of the invention.

FIG. 68 represents such a configuration that the lead terminals 108, which are protruded to an outside and folded back in tune with a mounting surface, increase in thickness to front edges. By the lead terminal 108 of this configuration, realized is strength securement of the front edge of the lead terminal 108 which is weak against stress such as shock.

Figure 69:
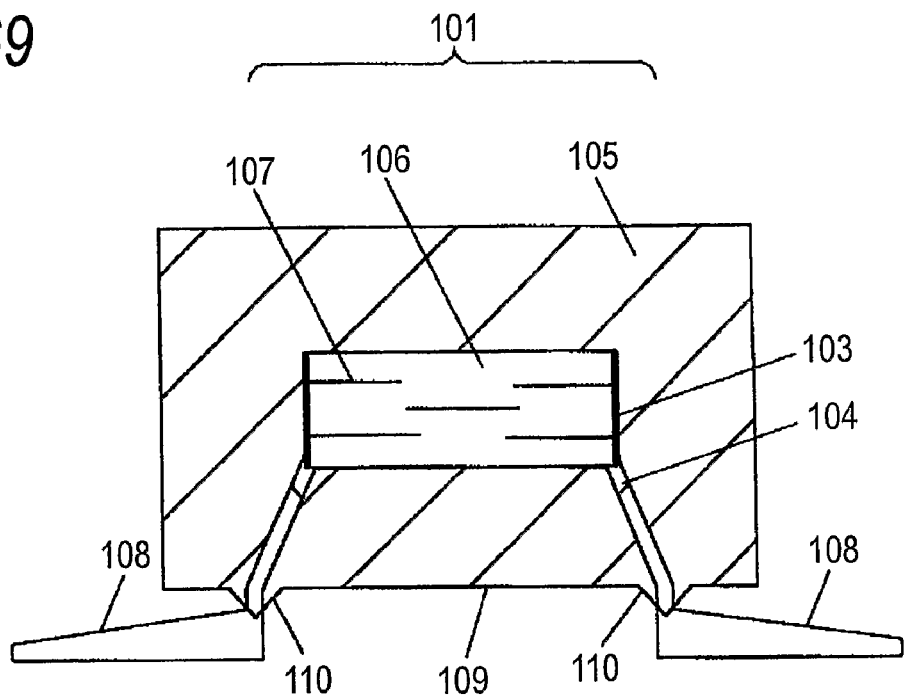
FIG. 69 is a side view of an electronic component in an embodiment of the invention.

FIG. 69 represents such a configuration that the lead terminals 108, which are protruded to an outside and folded back in tune with a mounting surface, become thinner to front edges, and elasticity is generated on the lead terminal 108, and flexure resistance is further improved.

Figure 70:
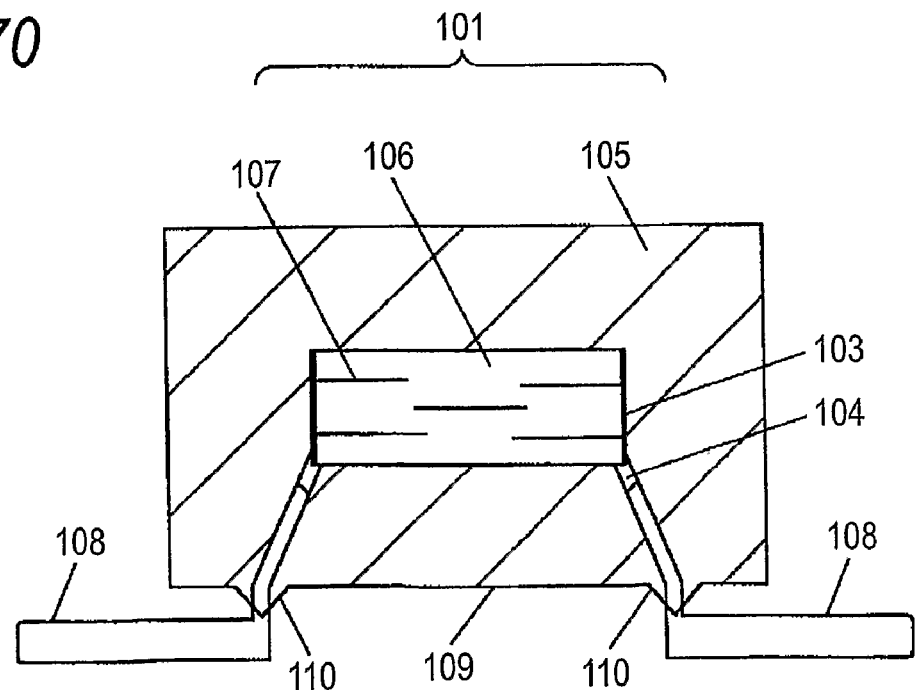
FIG. 70 is a side view of an electronic component in an embodiment of the invention.

FIG. 70 represents a configuration having a portion which is thicker in thickness than the lead terminal 108 in an inside of the external covering material 105, on the lead terminal 108 which was protruded to an outside of the external covering material 105. A thickness of a portion which was protruded to an outside is increased, and thereby, it is possible to improve shock resistance etc.

Figure 71:
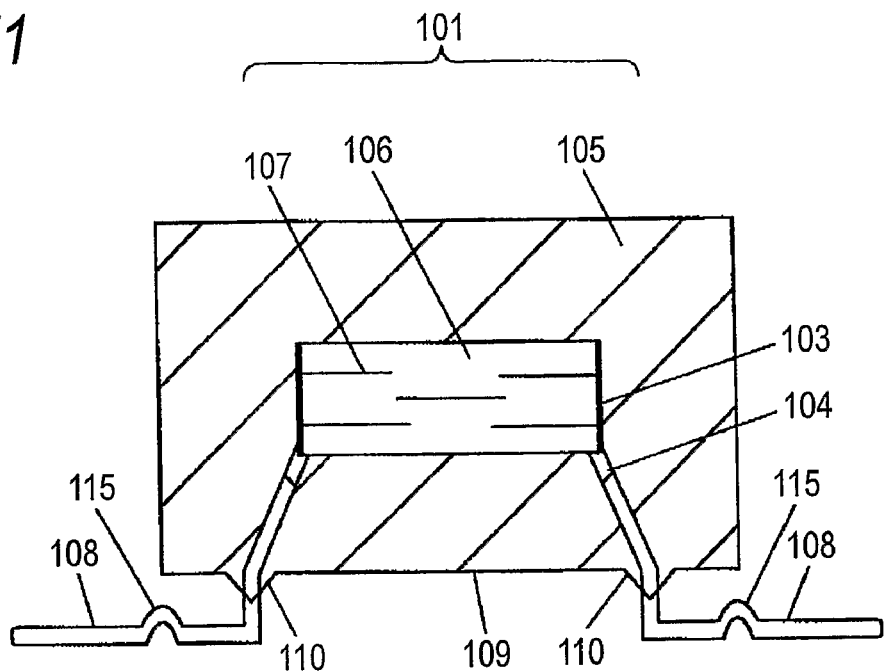
FIG. 71 is a side view of an electronic component in an embodiment of the invention.

FIG. 71 represents such a configuration that the curved surface portion 115 as a flexure absorbing portion is disposed on a part of the lead terminal 108 which was protruded to an outside of the external covering material 105. By this configuration, it is possible to improve flexure resistance against vibration etc. which are applied mainly in a horizontal direction after mounting, in addition to flexure resistance improvement due to space securement between the bottom surface 109 of the external covering material 105 and the lead terminal 108.

Figure 72:
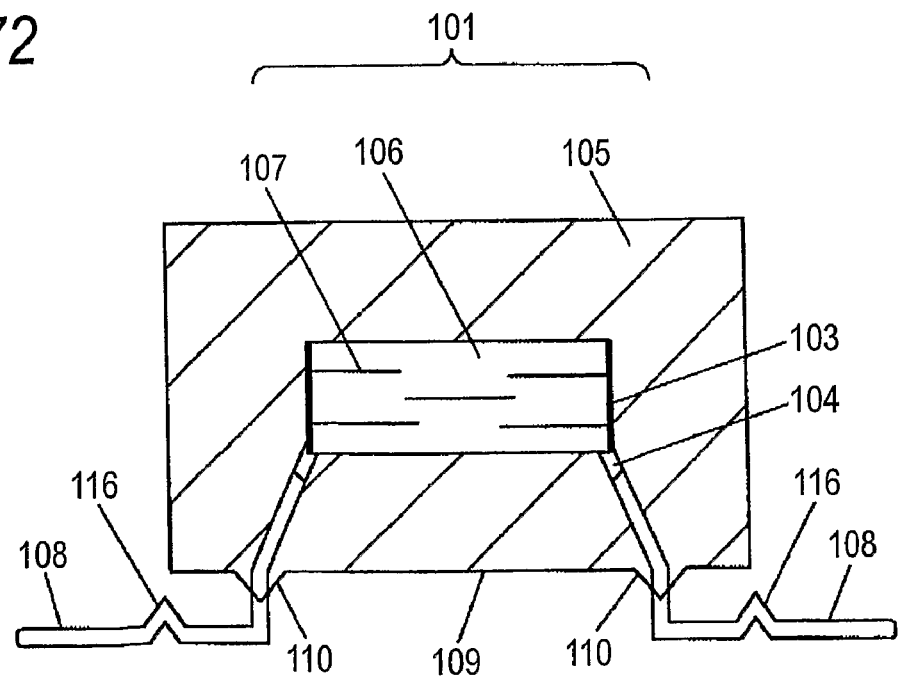
FIG. 72 is a side view of an electronic component in an embodiment of the invention.

FIG. 72 shows such a configuration that the folded portion 116y is formed as the flexure absorbing portion. In the same manner as FIG. 71, additional improvement of flexure resistance is realized.

Figure 73:
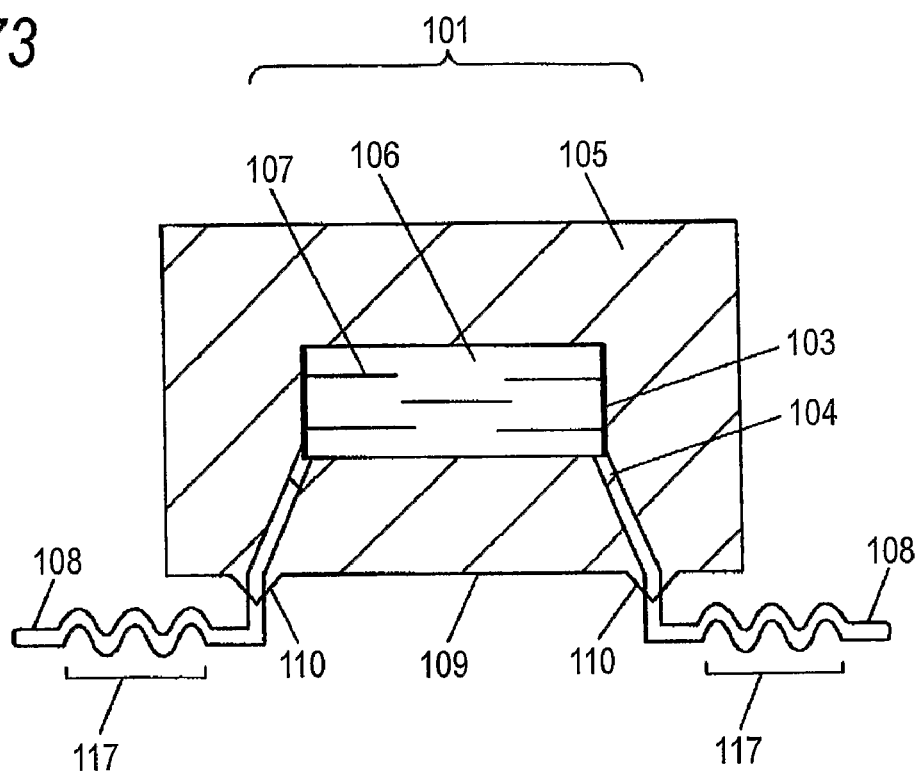
FIG. 73 is a side view of an electronic component in an embodiment of the invention.

FIG. 73 shows such a configuration that the wavy surface 117 is formed as the flexure absorbing portion. Additional improvement of flexure resistance is realized.

Figure 74:
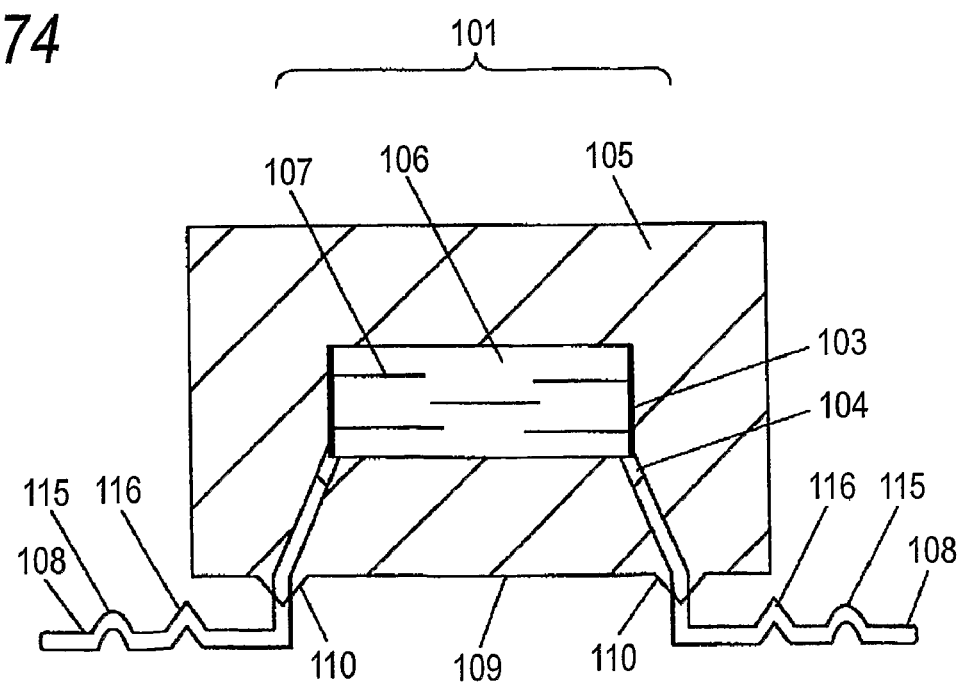
FIG. 74 is a side view of an electronic component in an embodiment of the invention.

FIG. 74 shows such a configuration that the curved surface portion 115 and the folded portion 116 are formed on the terminal portion 104 as the flexure absorbing portion. The flexure absorbing portions with a plurality of shapes are combined and formed, and thereby, respective good points in flexure resistance are enjoined and additional flexure resistance improvement is realized.

Figure 75:
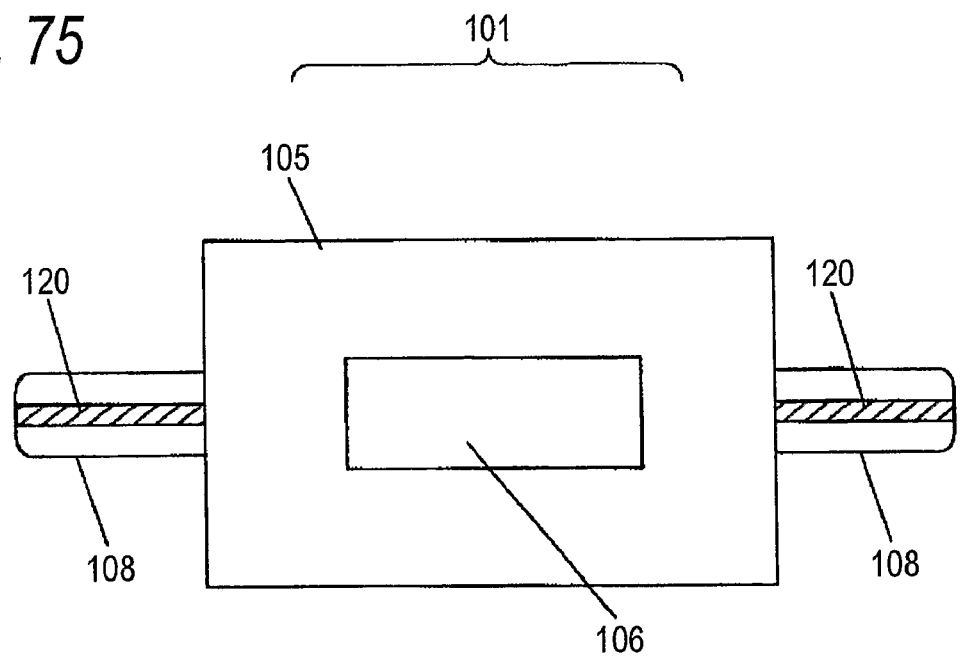
FIG. 75 is a top view of an electronic component in an embodiment of the invention.

FIG. 75 represents such a configuration that the reinforcing material 120 was disposed at an approximately center portion in a longitudinal direction of a non-mounting surface of the lead terminal 108. By this configuration, shock resistance etc. of the lead terminal 108 is improved.

Figure 76:
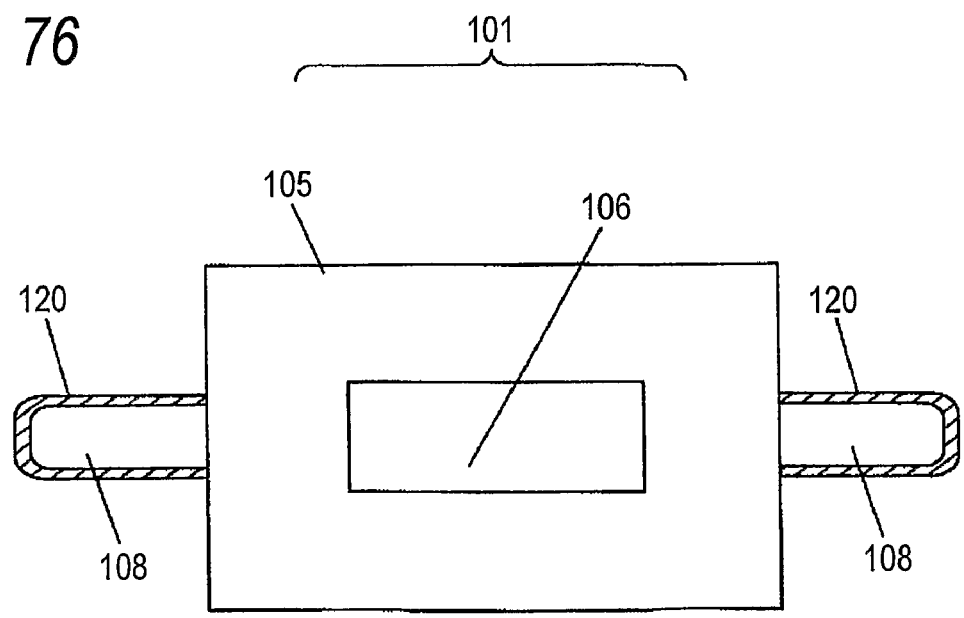
FIG. 76 is a top view of an electronic component in an embodiment of the invention.

FIG. 76 represents such a configuration that the reinforcing material 120 was disposed at a peripheral portion of the non-mounting portion of the lead terminal 108. By this configuration, shock resistance of the lead terminal 108 is improved more.

Figure 77:
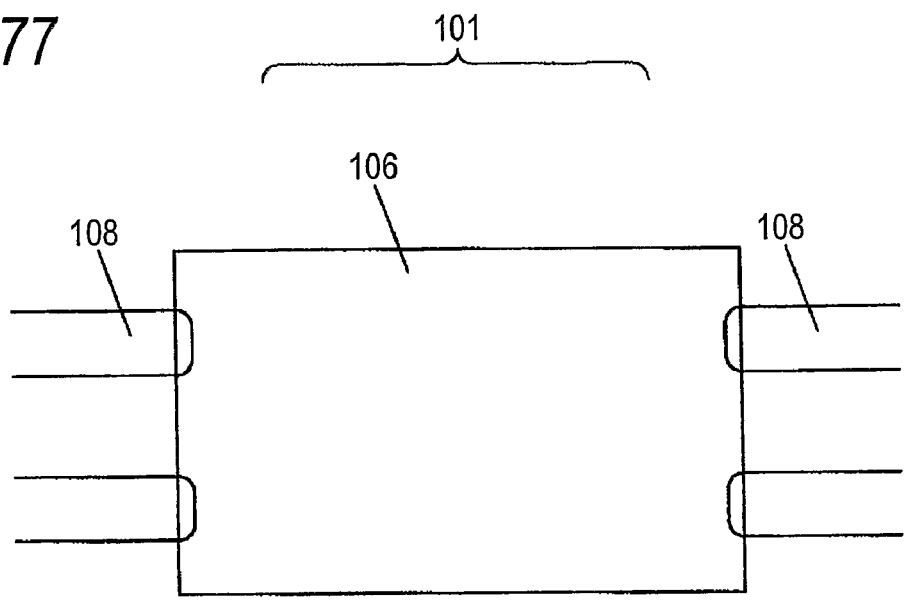
FIG. 77 is a top view of an electronic component in an embodiment of the invention.

FIG. 77 represents such a configuration that a plurality of paired lead terminals 108 are connected to one base body, and it is possible to configure a composite device easily in a small size.

Figure 78:
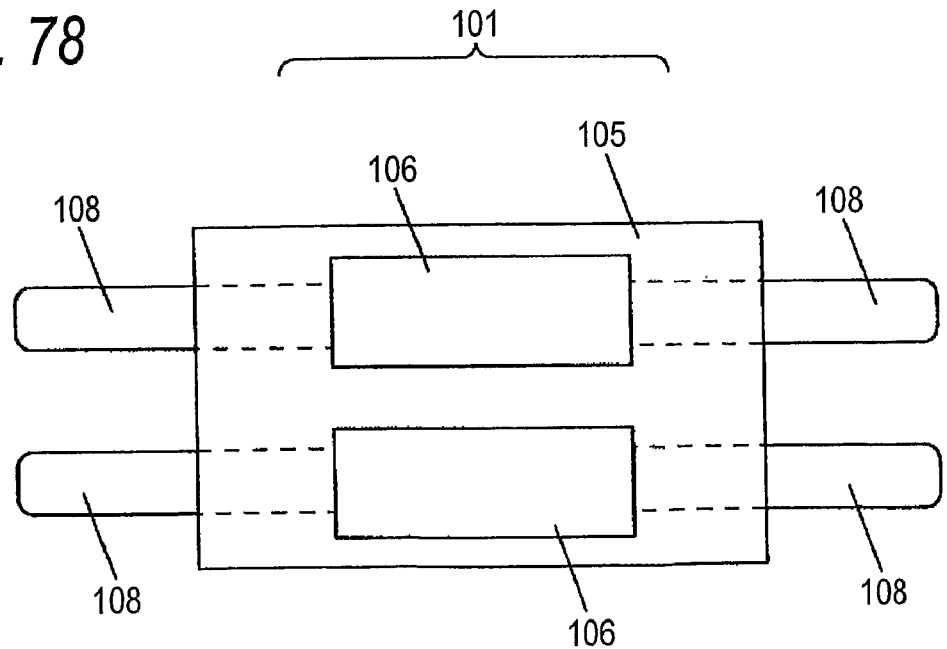
FIG. 78 is a top view of an electronic component in an embodiment of the invention.

FIG. 78 represents such a configuration that a plurality of multilayered capacitors 106 are sealed in an inside of one external covering material 105, and it is possible to configure a composite device easily in a small size, and to save labor hour for mounting.

Figure 79:
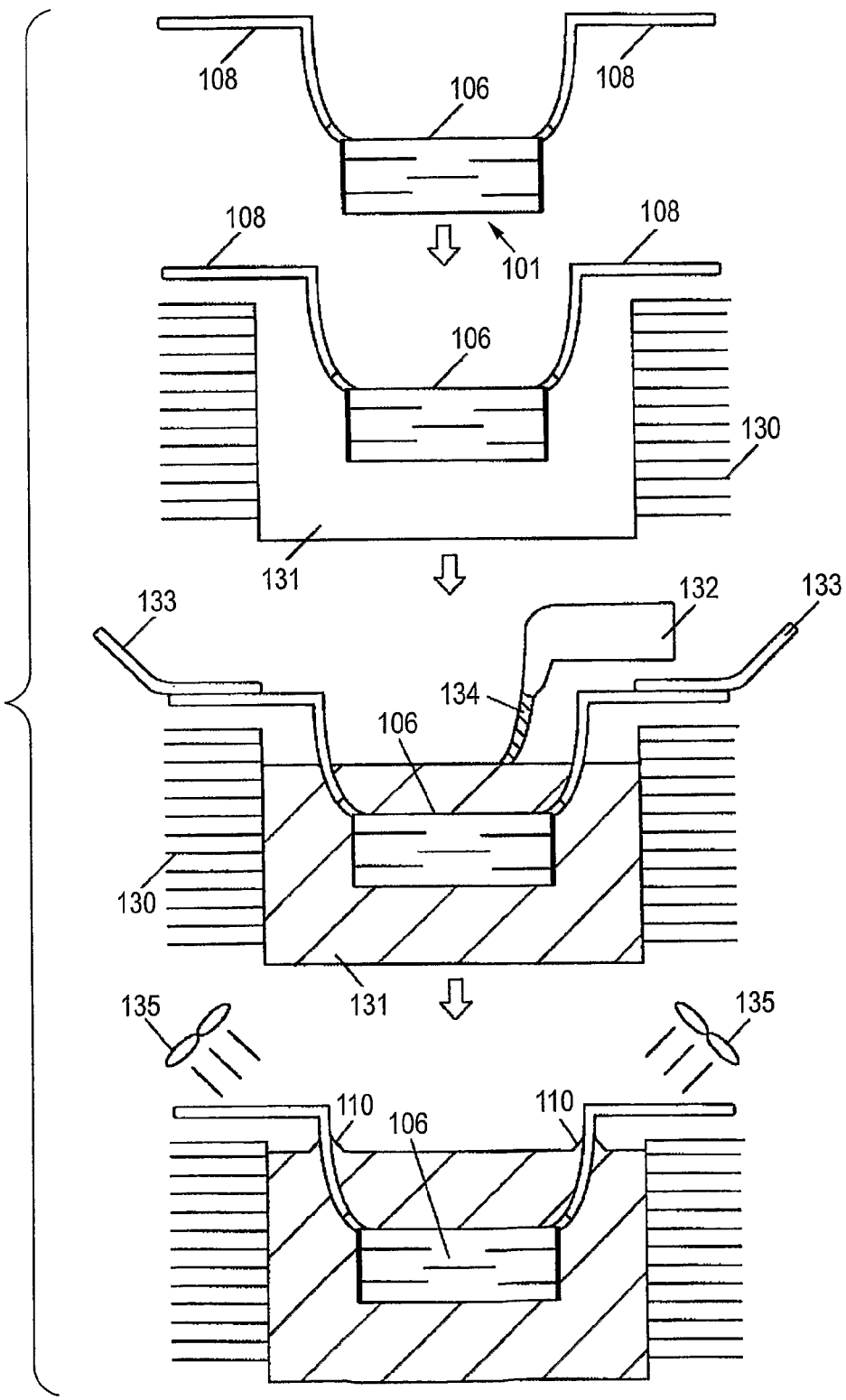
FIG. 79 is a manufacturing process view of an electronic component in an embodiment of the invention.

FIG. 79 represents a manufacturing process of the electronic component 101.

Figure 80:
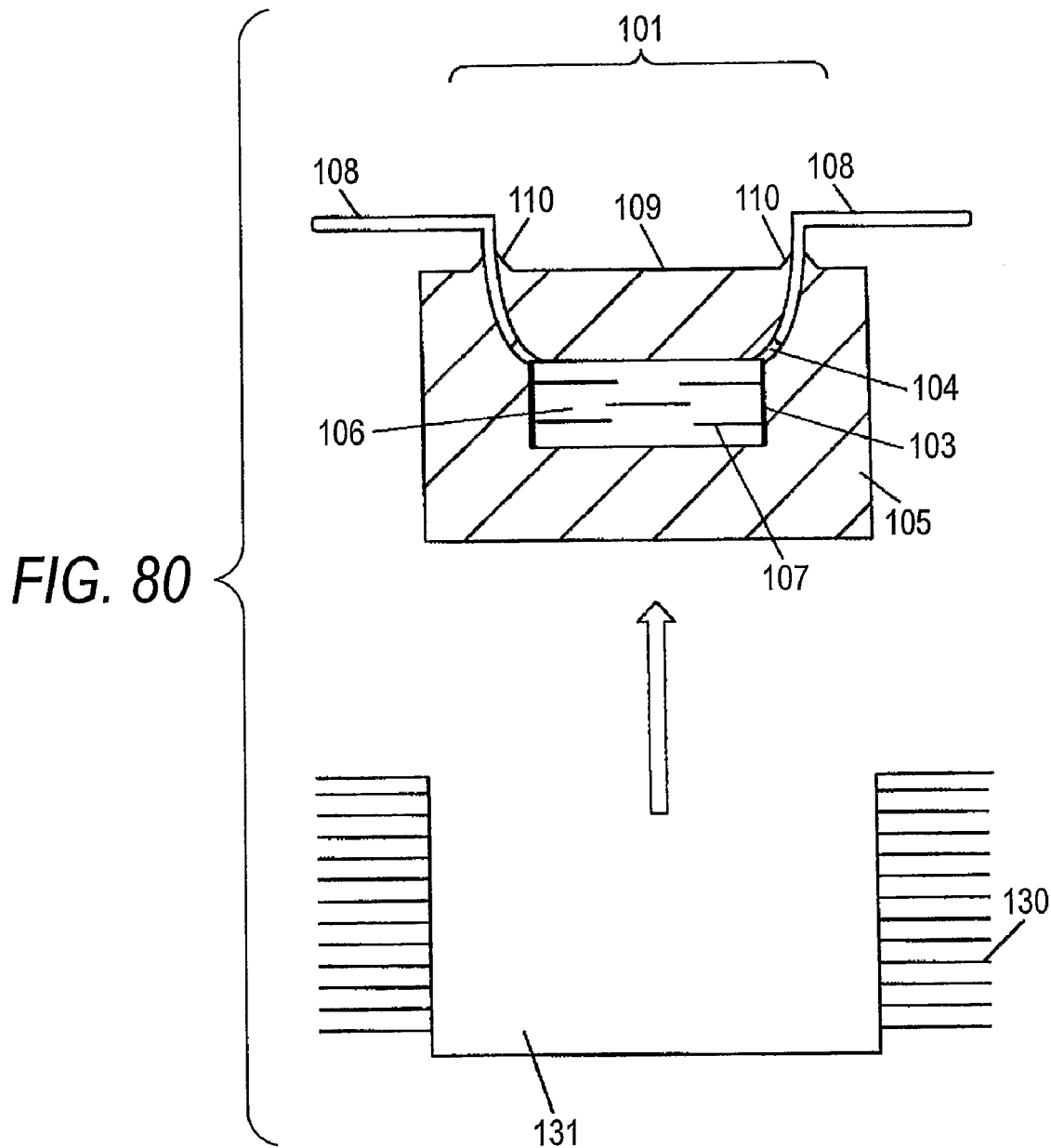
FIG. 80 is a manufacturing process view of an electronic component in an embodiment of the invention.
Figure 81:
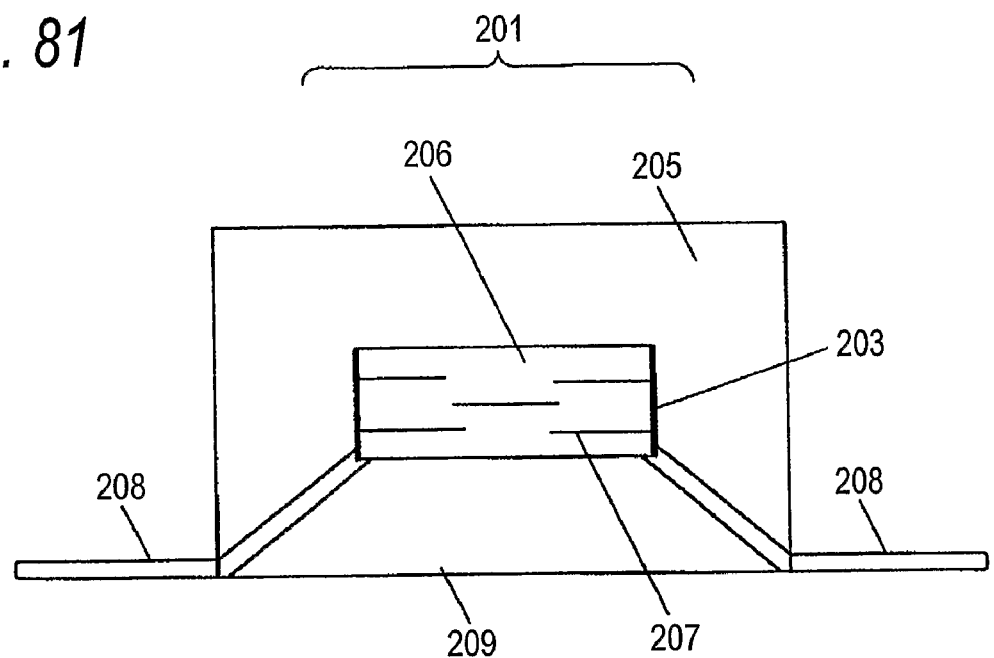
FIG. 81 is a side view of an electronic component in an embodiment of the invention.

FIG. 80 represents the electronic component 101 which was manufactured in accordance with the manufacturing process represented in FIG. 79.

The forgoing is such a thing that an outline of the configuration in each drawing and its point were described.

Meanwhile, by the manufacturing process represented in FIG. 60 etc., the electronic components 101 are manufactured, and thereby, the electronic components 101 are manufactured at low cost and easily, and further, it is possible to manufacture the electronic components 101 in which flexure resistance was improved, by easily forming the convex portions 110 on the bottom surface 109 and securing allowance (margin) of the terminal portions 104 and the lead terminals 108.

Next, detail of each portion will be described.

101 designates an electronic component, and as represented in FIG. 43 etc., an electronic component in which a capacitor, a resistor, an inductor, a filter, and other electronic elements etc. were molded with an external covering material such as resin, and an electronic component having such a feature that, since it was molded with the external covering material, endurance and moisture resistance, shock resistance are heightened, and further, it can also bear with high breakdown voltage.

Next, an element 102 will be described.

102 designates an element, and as the element 102, as described above, any one of a capacitor, a resistor, an inductor, a filter, IC, and other electronic device may be used, and the capacitor may be any capacitor of a single plate capacitor, a multilayered capacitor, an electrolytic capacitor, etc. FIG. 43 represents the single plate capacitor.

Meanwhile, the element 102 (or the multilayered capacitor 106) may be sealed with the external covering material 105 singularly, and a plurality of them may be sealed with the external covering material 105.

Alternatively, it is all right even if a pair of electrodes 103 are disposed on one base body and thereby, it has an operation as one electronic device, or it is also all right even if a plurality of paired electrodes 103 are disposed on one base body, and it has an operation as a plurality of electronic devices.

Such a configuration that a plurality of elements 102 (or multilayered capacitor 106) are sealed is represented in FIG. 78 etc.

Next, the electrode 103 will be described.

The electrodes 103 are electric conductive members which were disposed as a pair on both ends of the element 102 (or multilayered capacitor 106), and realize electric conduction with an external mounting substrate through the terminal portions 104 and the lead terminals 108, to the element 102 (or multilayered capacitor 106). It is common that the electrodes 103 are disposed as a pair on both ends of the element 102 (or multilayered capacitor 106), but it is all right even if they are disposed on midstream portions of the element 102 (or multilayered capacitor 106), but not on both ends. Alternatively, it is all right even if they are disposed on upper and lower surfaces, but not on side surfaces of the element 102 (or multilayered capacitor 106), and it is also all right even if they are disposed across whole surfaces of side surfaces and upper and lower surfaces, and it is also all right even if they are disposed only on a part thereof, and it is also all right even if they are disposed so as to run off the edge to another surface.

As a material of the electrode 103, cited is a metal material which includes at least one of Ni, Ag, Pd, Cu, Au etc. In particular, by using Ni single body or Ni alloy, it becomes advantageous also on the cost phase. In addition, it is all right even if alloy of these materials, and one to which surface plating processing was applied are used. As a matter of course, it is also all right even if alloy etc. are used, and it is all right if it is realized by any one of single layer, multiple layer plating processing, deposition processing, sputter processing, paste coating etc.

In addition, on the occasion of connecting the element 102 and the terminal portions 104, it is carried out through this electrode 103, but it is desirable that solder with melting temperature of 240° C. or more is used for a connecting member in connection. The suchlike solder having high melting temperature is used, and thereby, there occurs no problem that a connecting portion between the element 102 and the terminal portion 104 is melted in an inside of the external covering material 105, by re-flow which is carried out at the time of mounting, and so on, and it is possible to realize the electronic components 101 with high reliability.

Next, the terminal portion 104 will be described.

The terminal portions 104 are connected to the electrodes 103, and disposed as a pair on the element 102 (or multilayered capacitor 106). Normally, there are many cases in which they are disposed on both ends thereof, but it is all right even if they are disposed on places other than the both ends. For example, in case that the electrodes 103 are disposed on upper and lower surfaces, it is also all right even if these electrodes 103, which were formed on upper and lower surfaces, and the terminal portions 104 are connected. In addition, it is also all right even if the terminal portion 104 is configured by a material which includes at least one of Cu, Zn, Ni, Ag, Au etc., and single layer or multiple layer plating processing is applied to surfaces thereof.

In addition, in case that it was formed by a material which consists primarily of copper in particular and alloy, there is such a problem that a wetting characteristic of solder between a mounting substrate and the terminal portion 104 (or lead terminal 108), and therefore, there is need to carry out re-flow under high temperature, but as described above, it is solved by use of solder with melting temperature of 240° C. or more, as a member on a connecting portion between the element 102 and the terminal portion 104.

Alternatively, it is suitable that 42 alloy is used for the terminal portion 104 (lead terminal 108), and thereby, a solder wetting characteristic is heightened, to make mounting easy, and to improve mounting strength.

In addition, it is all right even if the terminal portion 104 is configured by bonding a metal cap to the element 102. Further, it is desirable that a outermost portion (most surface portion) of the terminal portion 104 is configured by an electric conductive material with a melting point of 200 degree or more, and by this configuration, even if high temperature is applied to an electronic component due to re-flow etc., there is no such a case that thermal damage is added to the terminal portion 104, and it is possible to obtain a stable re-flow characteristic.

The terminal portions 104 are connected to the electrodes 103, and processed in a proper shape, arbitrarily, and formed so as to be protruded to an outside of the external covering material 105.

In addition, the external covering material 105, which will be described later, is realized by putting such a thing that the terminal portions 104 (or lead terminals 108) were connected to the element 102 (or multilayered capacitor 106) in a frame, and pouring melted resin in this frame, and therefore, the terminal portions 104 are protruded from the bottom surface of the external covering material.

That is, it is placed in the frame in such a state that the terminal portions 104 were connected to the element 102, and fixed in such a state that these terminal portions 104 were hooked at the metal mold. By pouring melted resin etc. in this metal mold, up to a portion right before a virtual plane which is formed by the terminal portions 104, such a configuration that the terminal portions 4 are protruded from the bottom surface is to be realized easily.

That is, as compared to costly manufacture such as transfer mold, it becomes possible to have the terminal portions 104 protruded from the bottom surface 109, in order to improve flexure resistance, although it is very easy and of low cost.

At this time, a space is generated at any rate between the bottom surface 109 of the external covering material 105 and the terminal portion 104 (lead terminal 108), and therefore, allowance (margin) is generated, and flexure resistance against shock and vibration after mounting is improved. Further, flexure resistance is improved, and thereby, it is possible to prevent damage such as occurrence of cracks to the external covering material 105 and mounting solder, and shock resistance is improved.

Meanwhile, the terminal portion 104 (or lead terminal 108) may be folded back on an inward side as shown in FIG. 46, on the bottom surface 109 of the external covering material 105, and may be folded back on an outward side as shown in FIG. 43. In case that it was folded back on an inward side, a mounting area is reduced, and in case that it was folded back on an outward side, mounting strength is secured.

Next, the external covering material 105 will be described.

The external covering material 105 is, as represented in FIG. 43 etc., molding an electronic device such as a resister and an inductor starting with the element 102 (or multilayered capacitor 106), and a part of the terminal portions 104 (or lead terminals 108) which are connected to it.

As a material of the external covering material 105, epoxy resin such as opto-cresol-novolack series, biphenyl series, and pentadiene series is used preferably.

In addition, a minimum value (the thinnest wall thickness portion of the external covering material 105) of an interval between a surface of the external covering material 105 and a surface of the element 102 (or multilayered capacitor 106) is set to 0.1 mm or more, and thereby, it is possible to improve outer skin breakdown voltage. Further, by setting it to this value or more, it is possible to realize the electronic component 101 which is strong in breakdown voltage, moisture resistance, heat resistance.

In addition, by applying chamfering 112 to the corner portions of the external covering material 105, it becomes possible to improve shock resistance from an outside. At this time, the chamfering 112 may be of a circular arc shape, and may be straight line shaped chamfering.

In addition, as a shape of the external covering material 105, it is all right if it is a commonly used pillar shape, and it is also all right even if it is a roughly cuboid, a roughly cube, of a trapezoid shape, or of other polygonal pillar, but from the cost phase, the roughly cuboid and roughly cube, or such a trapezoid shape that side surfaces become slightly inclined surfaces. In addition, at the time of molding with the external covering material 105, unavoidable unevenness which occurs on a surface, and so on exist.

If it is a roughly cuboid etc., there occur the bottom surface 109 and side surfaces, and by these things, there occur corner portions (it is all right even if they are complete straight line shaped corner portions, and circular arc shaped corner portions).

Next, the multilayered capacitor 106 will be described.

As to the multilayered capacitor 106, a base body, which is configured by a dielectric material, is laminated with a plurality of sheets, and the internal electrodes 107 are formed, and thereby, it is possible to make it larger capacitance with an identical size, as compared to a single plate capacitor.

The dielectric base body is a base body which was configured by a dielectric material, and a dielectric material such as for example, titanium oxide and barium titanate is suitably used. Alternatively, alumina etc. are also used. By use of the suchlike materials, it is arbitrarily formed in necessary shape, size.

The internal electrode 107 is an electrode which was buried in an inside of the dielectric base body, and as a constituent material of the internal electrode 107, cited are a metal material and alloy including at least one of Ni, Ag, Pd, Cu, Au etc. In particular, by using Ni single body or Ni alloy, it becomes advantageous also on the cost phase. In addition, it is all right even if alloy of these materials, and one to which surface plating processing was applied are used. As a matter of course, it is also all right even if alloy etc. are used. In addition, a thickness of the internal electrode 107 is configured so as to be 1 through 5 μm. In addition, it is desirable that a distance between adjacent internal electrodes 107 is set to 15 μm or more.

At this time, in case that, in particular, a material, which consists primarily of Ni, is used for the internal electrode 107, and an anti-reducing material is used for the dielectric base body which becomes stacked sheets, the multilayered capacitor 106 is realized at very low cost.

The internal electrodes 107 are electrically connected to the electrodes 103, and the internal electrode 107, which is connected to only one of the electrodes 103, faces against the internal electrode 107 which is connected to only the other of the electrodes 103, and major capacitance is generated between these facing internal electrodes 107.

Next, the terminal portions 104 are connected to the electrodes 103. The terminal portion 104 is as described above. The terminal portions 104 are connected to the electrodes 103 as a pair together, and a pair of the lead terminals 108 are connected, in tune with these terminal portions 104.

Meanwhile, a size of the multilayered capacitor 106 is configured so as to satisfy, when it is assumed that its length is L1 and height is L2 and width is L3, 3.0 mm≦L1≦5.5 mm
0.5 mm≦L2≦2.5 mm
1.5 mm≦L3≦3.5 mm but as a matter of course, it is all right even if a size other than this is used, and it is also all right even if a plurality of, but not single, multilayered capacitors 106 are sealed with the external covering material 105.

Meanwhile, when L1 through L3 are made smaller than the above-described lower limits, a forming area of the internal electrode 107 becomes insufficient, and a mutual distance between the internal electrodes 107 becomes narrow necessarily, and it must reduce the number of sheets of the internal electrodes 107, and it becomes difficult to obtain a large capacitance value, and it becomes difficult to obtain an electronic component having wide range of capacitance.

In addition, it is preferable that, in order to prevent damage due to shock against the multilayered capacitor 106 at the time of molding the multilayered capacitor 106 with the external covering material 105, chamfering is applied to corner portions of the multilayered capacitor 106, and a circular arc shaped curve curved line is disposed on a part, or all of each side surface.

In addition, it is also preferable that a plurality of the multilayered capacitors 106 are molded, and mounted in parallel signal lines as a composite device, although it is of a small size, and thereby, mounting cost and labor hour for mounting are reduced. It is a configuration represented in FIG. 78.

Next, the lead terminal 108 will be described.

The lead terminals 108 are used as electric terminals for realizing electric conduction between the element 102, the multilayered capacitor 106 in an inside, and a substrate by being connected to a pair of the terminal portions 104, and pulled out to an outside of the external covering material 105, and mounted on a mounting substrate, and are formed as a pair. Meanwhile in response to the number of the multilayered capacitors 106 which are molded in an inside, it is all right even if they are a pair or more, and as to a shape of the lead terminal 108, it is all right even if it is of various shapes such as a rectangle shape, an ellipse shape, a square shape, and a linear shape, and chamfering and curve shape of the corner portion, formation of an inclined portion, or formation of a slit etc., and so on are suitable. In addition, as to its size and width, it is all right if they are arbitrarily decided, in accordance with balance of a mounting area to be required, mounting strength, a size of the element and so on.

The lead terminal 108 is, in the same manner as the terminal portion 104, formed by a dielectric material, and formed by various metals etc. It is all right even if it is configured by a material which includes at least one of Cu, Zn, Ni, Ag, Au etc., and single layer or multiple layer plating processing is applied to its surface. In addition, ally may be available.

In addition, the lead terminals 108 are protruded from the convex portions 110 which were disposed on the bottom surface 109 of the external covering material 105, and therefore, it is the same as description as to the terminal portions 104, and it is possible to improve flexure resistance, with maintaining low cost.

As a matter of course, flexure resistance is improved, and thereby, it is possible to prevent damage such as occurrence of cracks to the external covering material 105 and mounting solder, and shock resistance is also improved.

As to such a matter that the lead terminals 108 may be folded back on an outward side or on an inward side, it is the same as the case which was described as to the terminal portion 104.

Next, the convex portion 10 will be described.

The convex portion 110 is a portion which is disposed on the bottom surface 109 of the external covering material 105, and from which the terminal portion 104 and the lead terminal 108 are protruded.

The convex portion 110 may be formed integrally with the external covering material 105, and may be integrated after they were formed separately. In addition, it may be of a material which is identical to that of the external covering material, and may be of a different material.

However, as represented by manufacturing process views such as FIG. 60, in case that melted resin etc. are poured into a metal mold 130 in which the element 102 was placed, only circumference of the terminal portion 104 and the lead terminal 108 which are protruded from the bottom surface 109, among this melted resin, is raised by surface tension. Further, in case that the poured resin was solidified with maintaining the terminal portion 104 and the lead terminal 108 at lower temperature than ambient one, the external covering material 105 is formed with remaining this raised portion. By this means, the convex portion 110 is automatically formed.

Alternatively, it is also all right even if resin made raised portions are formed at the periphery of the protruded terminal portions 104 and lead terminals 108 separately, after the external covering material 105 was once formed, and they are used as the convex portions 110.

Meanwhile, the convex portion 110 may be a roughly triangular pillar, and may be a semicircular pillar, and in case of going through the manufacturing process shown in FIG. 60, there are many cases that it becomes a shape of widening toward a root of the terminal portion 104 and the lead terminal 108, but as a matter of course, it may be of a shape other than this.

In addition, the convex portion 110 may be formed at an any position on the bottom surface 109, but it is desirable to place it on a more inward side on the bottom surface, than the corner portion where the side surface and the bottom surface 109 of the external covering material 105 intersect. This is because, by this means, it become possible for protrusion of the terminal portion 104 and the lead terminal 108 to secure a fixed distance from side surfaces of the external covering material 105, and it has a relaxation absorbing force against stress etc. from a side surface direction.

The terminal portion 104 and the lead terminal 108 are protruded from this convex portions 110, and thereby, flexure resistance is improved, but this improvement of flexure resistance will be described in detail later.

Next, the reinforcing material 120 will be described.

The reinforcing material 120 is formed on a non-mounting surface of the terminal portion 104 and the lead terminal 108. For example, as represented in FIG. 56, it may be formed in the roughly center of the terminal portion 104, and as represented in FIG. 47, it may be formed along a peripheral portion of the terminal portion 104. In case of the former, although its formation is easy, it is possible to improve shock resistance in a longitudinal direction which is weak against stress, and in case of the latter, it is formed across the peripheral portion, and thereby, it becomes possible to improve shock resistance of the terminal portion 104 very much. This is the same even in case of the lead terminal 108 as represented in FIGS. 75 and 76.

Meanwhile, the reinforcing material 120 may be of another shape, and may be formed at another position.

As a material of the reinforcing material 120, resin and ceramic etc. are used, and epoxy series resin etc. are used suitably in the same manner as the external covering material 105. In addition, even if the same material as the external covering material 105 is used, it is suitable. It is all right even if the reinforcing material 120 is of a bar shape, a pillar shape, and a plate shape, and a plurality of them, but not a single one, are disposed.

In addition, the reinforcing material 120 may be formed only on a front edge or root of the terminal portion 104 or the lead terminal 108.

In case that it is formed on a front edge portion, thereby, it is possible to reduce influence on a front edge of the terminal portion 104 and the lead terminal 108, which is most susceptive to stress due to shock from an external world, and to heighten shock resistance. Furthermore, in case that it is disposed on a front edge portion, thereby, it becomes a weight on the front edge portion, and a pressure crimping force against a mounting substrate is heightened, and mounting reliability, especially endurance against shock etc. is improved, and consequently, there is such a merit that flexure resistance of the terminal portion 104 (or lead terminal 108) is also improved.

Contrarily, in case that it was disposed on a root, it becomes difficult to occur a clinch etc.

Next, the curved surface portion 115, the folded portion 116, and the wavy portion 117 as flexure absorbing portions will be described. The flexure absorbing portion is a portion which mitigates influence of flexure which is generated by vibration, shock etc. applied to the mounted electronic component 101.

The terminal portion (or lead terminal 108) is protruded from the convex portion 110 of the bottom surface 109, and thereby, a space is generated between the bottom surface 109 of the external covering material 105 and the terminal portion 104 (or lead terminal 108), and this space becomes allowance (margin), and flexure resistance is improved. In addition to this, by disposing the flexure absorbing portion, it becomes strong to flexures against vibration etc. particularly in a horizontal direction, and flexure resistance is strengthened in three dimensions.

Meanwhile, as a matter of course, flexure, which is absorbed by the flexure absorbing portion, is not generated only by vibration etc. which are applied in a horizontal direction.

The curved surface portion 115 is a portion which was disposed on the terminal portion 104 and the lead terminal 108 and was bent in a curved surface shape, and as to this portion, it is not solder-mounted on a mounting substrate, and it plays a role of a buffer material, and thereby, flexure resistance is improved.

The folded portion 116 is the same, and its formation is easier than the case of forming the curved surface portion 115. In particular, in case that it is formed in a roughly V-letter shape, thereby, it can be formed easily, and it is not solder-mounted in the same manner as the curved surface portion 115. In case that it is used as a buffer region, thereby, improvement of flexure resistance is realized.

Meanwhile, the curved surface portion 115 and the folded portion 116 may be disposed in a singular form or a plural form, on the terminal portion 104 and the lead terminal 108, and may be disposed at an arbitrary place such as a root, an intermediate portion, and a front edge portion.

The wavy surface 117 is slightly complex in its formation, but as a buffer region which absorbs flexure, most effective, and flexure resistance is improved very much. The wavy surface 117 may be selected arbitrarily and decided in its size etc., in the context of a mounting area (i.e., mounting strength) of the terminal portion 104 and the lead terminal 108 etc. to be mounted.

Alternatively, the curved surface portion 15, the folded portion 116, and the wavy portion 117 etc., may be combined arbitrarily, in accordance with specifications.

In FIGS. 55 and 74, the curved surface portion 115 and the folded portion 116 are disposed in a combined manner. It falls in such a state that respective characteristics of the curved surface portion 115 and the folded portion 116 were mixed, and flexure absorption is improved more.

The suchlike flexure absorbing portion may be disposed according to need, and may be decided from a balance with specifications.

The foregoing is description of each portion of the configuration of the electronic component in this embodiment.

Next, such a matter that improvement of flexure resistance, which is realized from the above-described configurations, is realized regardless of such a configuration that low cost manufacture is possible, will be described in detail.

Firstly, by such a configuration that the terminal portions 104 and the lead terminals 108 are protruded from the convex portions 110 which were disposed on the bottom surface 109, flexure resistance improvement is realized.

That is, as represented in FIGS. 45 and 46 etc., even in case that the terminal portions 104 and the lead terminals 108 are protruded from the convex portions 110 and folded back at front edges of the convex portions 110 to enable mounting, a space is generated between a mounting portion of the terminal portion 104 and the lead terminal 108 and the bottom surface 109 of the external covering material 105 which becomes the electronic component 101 main body, by just a height portion of the convex portion 110. By this space, allowance (margin) is generated between the external covering material 105 and the terminal portion 104 (lead terminal 108), and relaxation absorption is carried out against vibration, shock etc. which are applied to the electronic component 101, and flexure resistance is improved.

Further, as shown in FIGS. 43 and 44 etc., in case that the terminal portions 104 and the lead terminals 108, which were protruded from the convex portions 110, are stretched once to a lower side, and thereafter, folded in a roughly L-letter shape, a space between them and the bottom surface 109 is enlarged. In addition, the protruded terminal portions 104 and the lead terminals 108 have fixed distances in a roughly vertical direction from the convex portions 110, and therefore, have fixed distances with the convex portions 110 themselves, and a relaxation absorbing force against vibration etc. is heightened more, and flexure resistance is improved.

In this manner, simply by disposing the convex portion 110 and having the terminal portion 104 and the lead terminal 108 protruded from this convex portion 110, it is possible to secure margin of the terminal portion 104 and the lead terminal 108, and it is possible to secure flexure resistance easily. Further, low cost manufacture is maintained as it is.

In addition, as stated in description of the flexure absorbing portion, the flexure absorbing portion is disposed on the terminal portion 104 and the lead terminal 108, and thereby, it is possible to carry out relaxation absorption of vibration and shock from an outside, which are applied in three dimensions, including a horizontal direction, and it is possible to realize very strong flexure resistance.

Next, such a matter that flexure resistance and shock resistance are also improved by a feature of shapes of the terminal portion 104 and the lead terminal 108 will be described.

Firstly, FIGS. 49 and 126 represent such a configuration that a thickness increases gradually to a front edge, on a portion where the terminal portion 104, the lead terminal 108 are protruded to an outside of the external covering material 105, respectively. The protruded terminal portion 104 and the lead terminal 108 are in a state which is susceptive to influence of shock from an outside, to front edges, but by making the suchlike configuration that it increases in its thickness to a front edge, this influence is avoided, and it is possible to prevent folding-down, bending of the terminal portion 4 and the lead terminal 108, and it is possible to heighten shock resistance and endurance at the time of manufacture, transport, and mounting, and to improve mounting reliability.

Next, FIGS. 50 and 127 show such a configuration that a thickness becomes thinner gradually to a front edge, on a portion where the terminal portion 104, the lead terminal 108 are protruded to an outside of the external covering material 105, respectively. In such a shape that it becomes thinner to a front edge, elastic forces of the terminal portion 104 and the lead terminal 108 become large, and in case that they were mounted on a mounting substrate, pressure, which is given to the mounting substrate, is heightened, and it becomes strong against flexure due to shock etc. after mounting. In particular, by using metal etc. with high elasticity and spring performance as a material of the terminal portion 104 and the lead terminal 109, flexure resistance is more improved.

Alternatively, it becomes possible to disperse a burden which is applied to the terminal portion 104 and the lead terminal 108, so that shock resistance and stress resistance are heightened.

Next, FIGS. 51 and 70 represent such a configuration that there exists a portion which is thicker that the thickness of the terminal portion 104, the lead terminal 108 which exist in an inside of the external covering material 105, on a portion where the terminal portion 104, the lead terminal 108 are protruded to an outside of the external covering material, respectively. By this means, it is possible to make the electronic component 101 which is protruded and strong against folding-back and twisting, to stress and shock which are applied from an outside.

Meanwhile, these may be used independently, and may be combined arbitrarily.

As above, by artifice of a shape of the terminal portion 104 and the lead terminal 108, it is possible to improve shock resistance, endurance, and flexure resistance.

By such these configurations that the terminal portion 104 and the lead terminal 108 are protruded from the convex portions 110 which were disposed on the bottom surface 109 of the external covering material 105, or by the flexure absorbing portion and the reinforcing material 120 which are disposed on the terminal portion 104 etc., or by artifice of a thickness shape of the terminal portion 104 etc., it becomes possible to improve flexure resistance of the electronic component 101, and further, to improve shock resistance and endurance etc. Further, these configurations and shapes may be combined arbitrarily, according to specifications.

Finally, a manufacturing process of the electronic component 101 will be described.

FIGS. 60, 61, 79, and 80 represent the manufacturing process of the electronic component 101.

FIGS. 60 and 61 represent a manufacturing process of the electronic component 101 using the element 102 commencing with a single plate capacitor etc., and FIGS. 79 and 80 represent a manufacturing process of the electronic component 101 using the multilayered capacitor 106, and in these manufacturing processes, there is no particular different portion, and therefore, by use of the case of FIGS. 60 and 61, it will be described redundantly.

Top of FIG. 60 represents such a state that the terminal portions 104 were connected to the element 102.

Then, as represented secondly from the top, it shows such a state that this element, to which the terminal portions 104 were connected, is placed in an inside 131 of the metal mold 130. At this time, it is desirable that it is placed in such a state that it is protruded from a midstream portion of an opening portion of the inside 131 of the metal mold 120, so as for the terminal portion 104 (or lead terminal 108) to be protruded from the bottom surface of the external covering material 105.

Next, melted resin 134 is poured into the inside 131 of the metal mold 130 from the resin supply section 131. At this time, the cooling section 133 is made to contact the terminal portions 104 (lead terminals 108), and the terminal portions 104 (lead terminals 108) are maintained at lower temperature than ambient one.

Finally, after the melted resin 143 was poured completely, the melted resin is solidified by use of the cooling fan 135 etc., and sealing by use of the external covering material 105 is completed. At this time, the cooling section 133 is contacted to the terminal portions 104 and the lead terminals 108 etc., and lower temperature than ambient one is maintained, and thereby, in the course of solidifying the melted resin 134 which was poured into the metal mold inside 131, it is solidified at the periphery of the terminal portion 104 (lead terminal 108) with remaining raised portions which were generated by surface tension of the melted resin, and the convex portions 110 are to be formed naturally on protruded portions of the terminal portions 104 (lead terminals 108).

Finally, as represented in FIG. 61, the electronic component 101 comes to completion by being pulled out from the metal mold 130. At this time, as represented in FIG. 61, it is clear that the terminal portions 104 are protruded from the convex portions 110 on the bottom surface 109 of the external covering material 105.

These things are the same even in the case of FIGS. 79 and 80 which is the case of using the multilayered capacitor 106.

By the electronic component 101 which has the configurations as above, it becomes possible to realize the electronic component 101 in which flexure resistance is high and a life is long, with maintaining low cost, and it is possible to realize endurance, a longer life performance of an electronic device in which the electronic components 101 were mounted.

Further, with maintaining low cost due to simplification of manufacturing processes, shock resistance, endurance, heat resistance, moisture resistance etc. by which damage to an external covering material is prevented, are improved, and the electronic component 101 which is suitable for practical use, and an electronic device are realized.

Hereinafter, embodiments of the invention will be described by use of drawings.

FIGS. 81, 82, 83, 84, 85, 86, 87, 88, 89, 90, 91, 92, 93, 94, 98, 99, 100, 101, 102, 103, 104, 105, 106, 107, 108, 109, 110, 111, and 112 are side views of electronic components in embodiments of the invention, and FIGS. 95, 96, 97, 113, and 114 are top views of the electronic components in the embodiments of the invention.

201 designates an electronic component, and 203 designates an external electrode, and 205 designates an external covering material, and 206 designates a multilayered capacitor, and 207 designates an internal electrode, and 208 designates a lead terminal, and 209 designates a bottom surface, and 210 designates a reinforcing material, and 211 designates a convex portion type reinforcing material, and 212 designates a bottom surface reinforcing material, and 213 designates a reinforcing material, and 215 designates a curved surface portion, and 216 designates a folded portion, and 217 designates a wavy portion, and 220 designates an inclined portion, and 221 designates chamfering, and 222 designates a dent portion, and 223 designates a convex portion.

Firstly, in a configuration of the electronic component 201, features of the configuration which is represented in each figure respectively and advantages thereof will be briefly described.

FIG. 1 shows such a configuration that a pair of the external electrodes 203 are connected to both ends of the multilayered capacitor 206 in which a laminated sheet which is composed of a plurality of dielectric base bodies, and the internal electrodes 207 were laminated, and a pair of the lead terminals 208 are connected through this external electrode 203, and this multilayered capacitor 206 and a part of the lead terminals 208 are sealed (molded) with the external covering material 205. Further, at this time, the internal electrode 207 is formed by a material which consists primarily of Ag and Pd, and has such an advantage that it is strong against high temperature, and strong against high temperature which is applied at the time of sealing due to the external covering material 205, and high temperature which is applied at the time of re-flow of mounting. Further, the lead terminals 208 are protruded from corner portions of the bottom surface and side surfaces of the external covering material which is a rough cuboid, a rough cube, or a rough square pillar. By this configuration, it is sufficient only to use such a manufacturing process that the multilayered capacitor, to which the lead terminals 208 were connected, is made in a reversed state, and placed in a metal mold in such a state that the lead terminal 208 thereof were hooked at the metal mold, and melted resin is poured into this metal mold and solidified, and therefore, it is possible to realize a very low cost electronic component 201.

Figure 82:
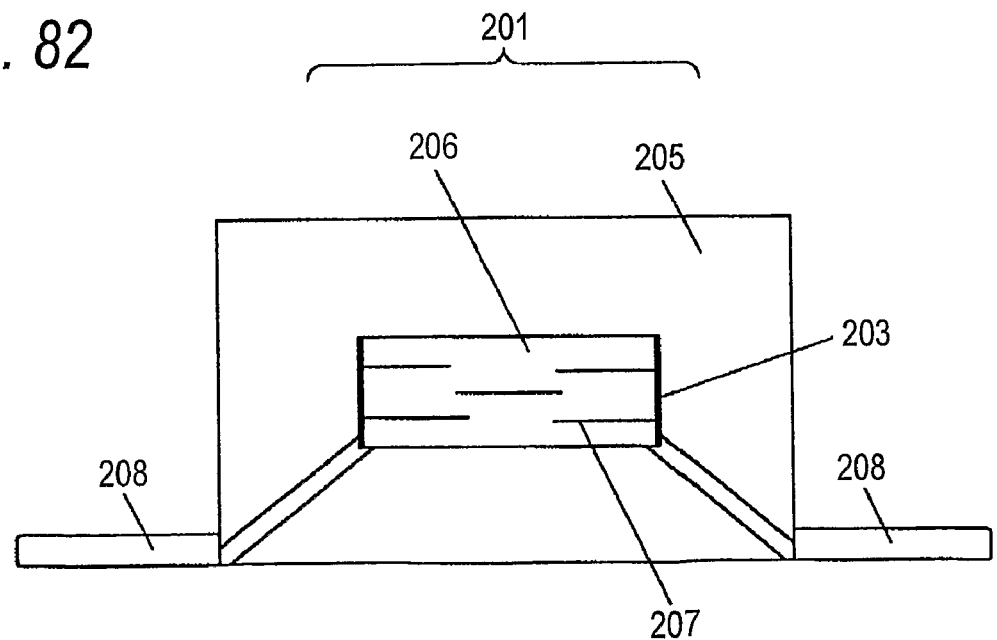
FIG. 82 is a side view of an electronic component in an embodiment of the invention.

FIG. 82 shows such a configuration that the lead terminal 208 has a portion which is thicker than thickness of an inside of the external covering material 205, on an outside of the external covering material. FIG. 82 shows such a configuration that an outside, which is protruded from the external covering material 205, is thick in thickness as a whole, but it is all right even if thickness is thick partially. By this configuration, shock resistance of the lead terminal 208 is heightened.

Figure 83:
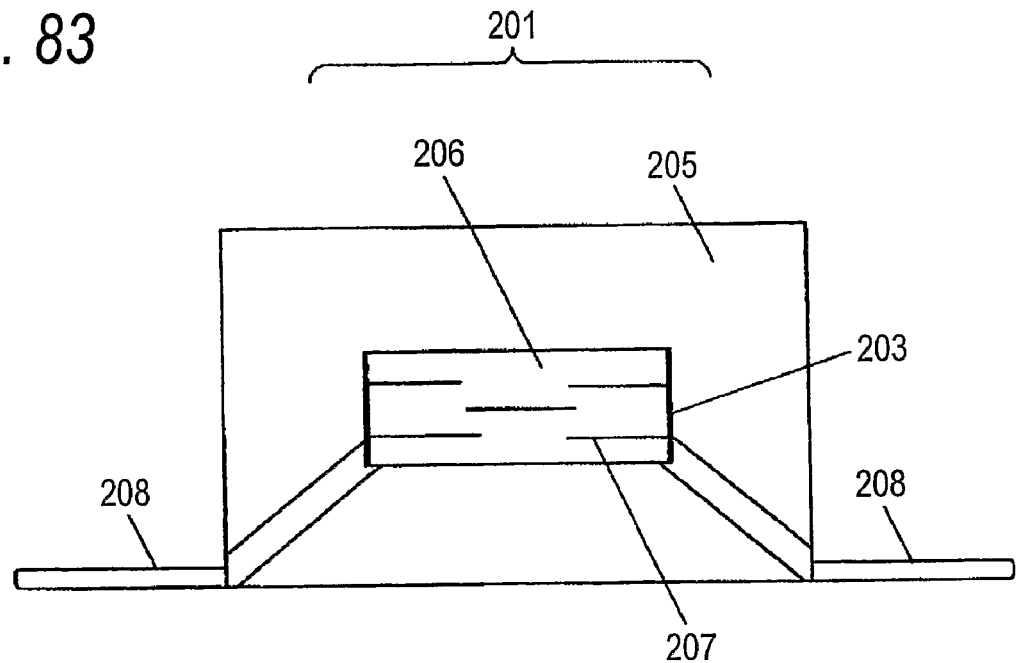
FIG. 83 is a side view of an electronic component in an embodiment of the invention.

FIG. 83 represents such a case that, in reverse to FIG. 82, on an outside of the external covering material 205, there is such a portion that thickness of the lead terminal is thinner than thickness of the lead terminal 208 in an inside of the external covering material 205. By this configuration, elasticity of the lead terminal is heightened, and flexure resistance is improved.

Figure 84:
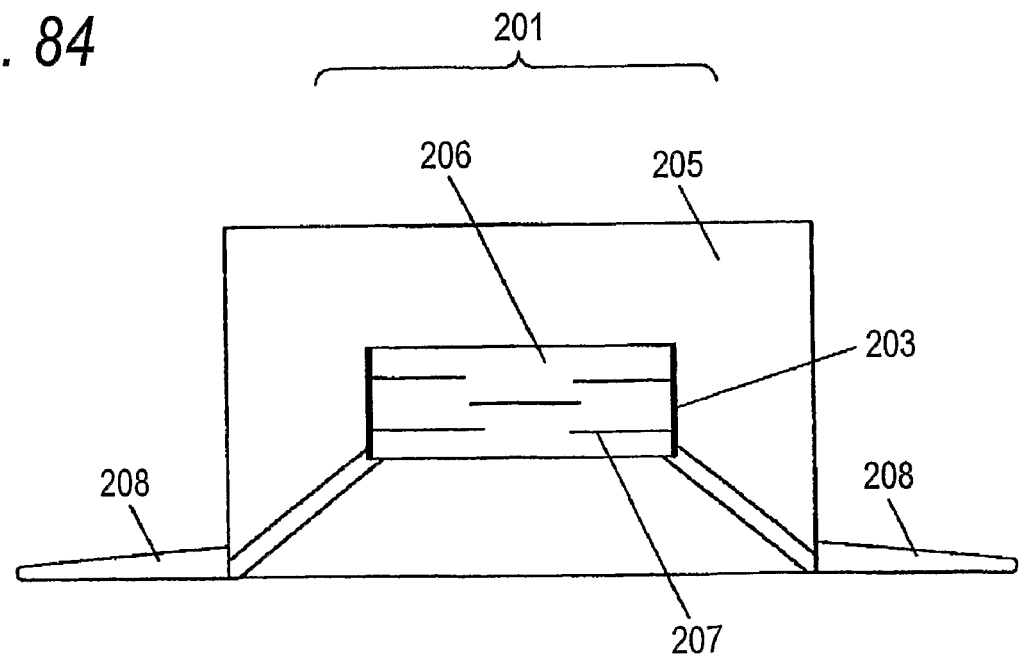
FIG. 84 is a side view of an electronic component in an embodiment of the invention.

FIG. 84 represents such a configuration that the lead terminal 208, which is protruded to an outside of the external covering material 205, becomes thinner in thickness to a front edge. By this configuration, in the same manner as in FIG. 83, elasticity of the lead terminal 208 is improved, and flexure resistance is improved.

Figure 85:
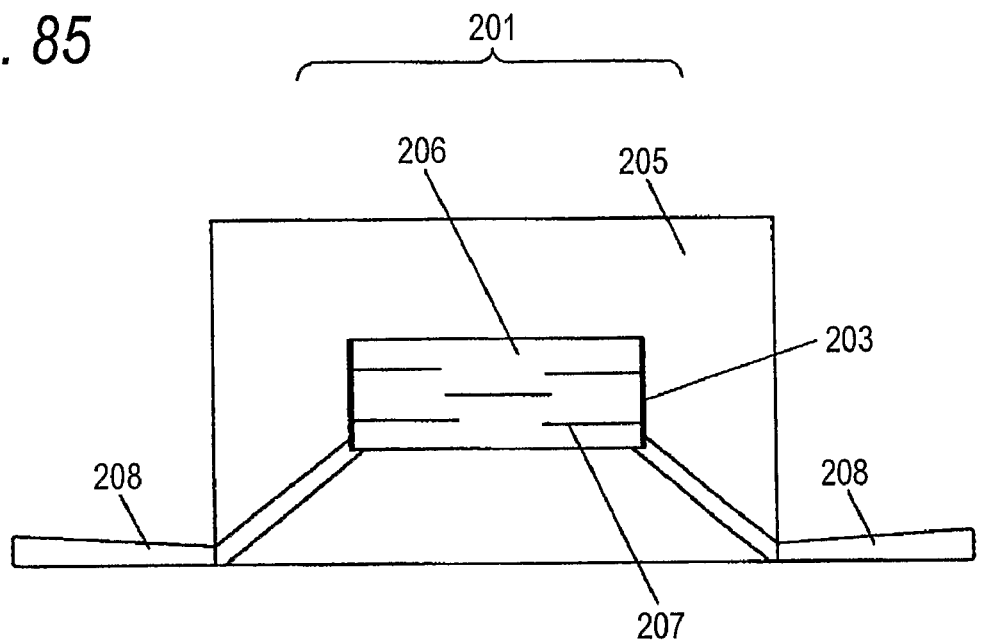
FIG. 85 is a side view of an electronic component in an embodiment of the invention.

FIG. 85 represents such a configuration that the lead terminal 208, which is protruded to an outside of the external covering material 205, increases in thickness to a front edge. By this configuration, it becomes strong against stress such as external shock which is easily applied to the front edge of the lead terminal 208, and shock resistance, such folding-back prevention of the lead terminal 208, is improved.

Figure 86:
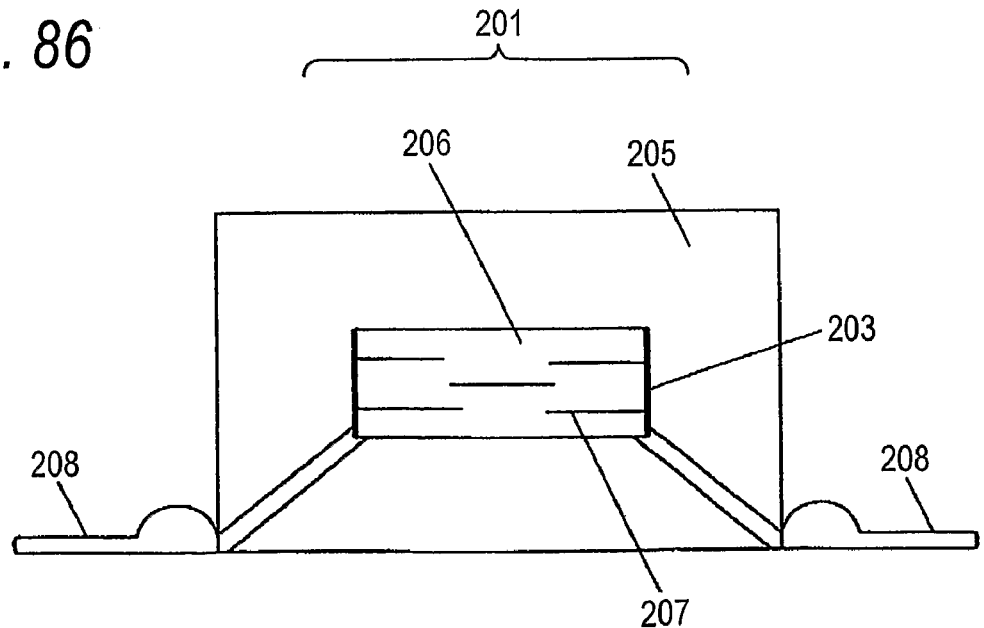
FIG. 86 is a side view of an electronic component in an embodiment of the invention.

FIG. 86 shows such a configuration that, on a protruded root of the lead terminal which is protruded to an outside of the external covering material 205, its thickness is the most thick. By this configuration, it is possible to prevent the lead terminal 208 from being folded down, due to shock which is applied to the root of the lead terminal 208, and it is possible to improve shock resistance and endurance.

Figure 87:
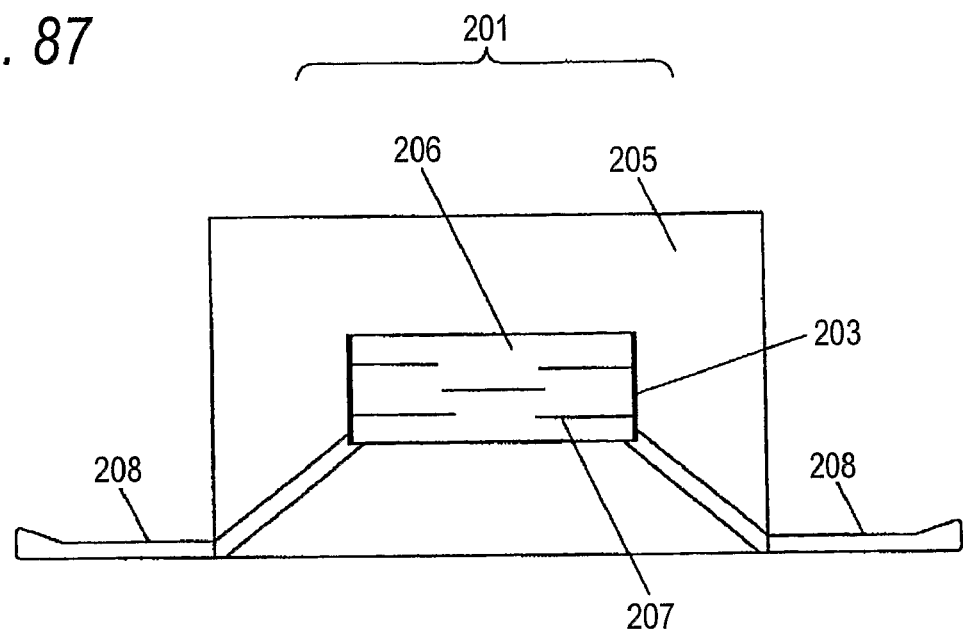
FIG. 87 is a side view of an electronic component in an embodiment of the invention.

FIG. 87 represents such a configuration that, on a front edge portion of the lead terminal 208 which is protruded to an outside of the external covering material 205, its thickness is the most thick. By this configuration, it is possible to prevent stress which is applied strongly to a front edge of the lead terminal 208, and it is possible to improve shock resistance.

Figure 88:
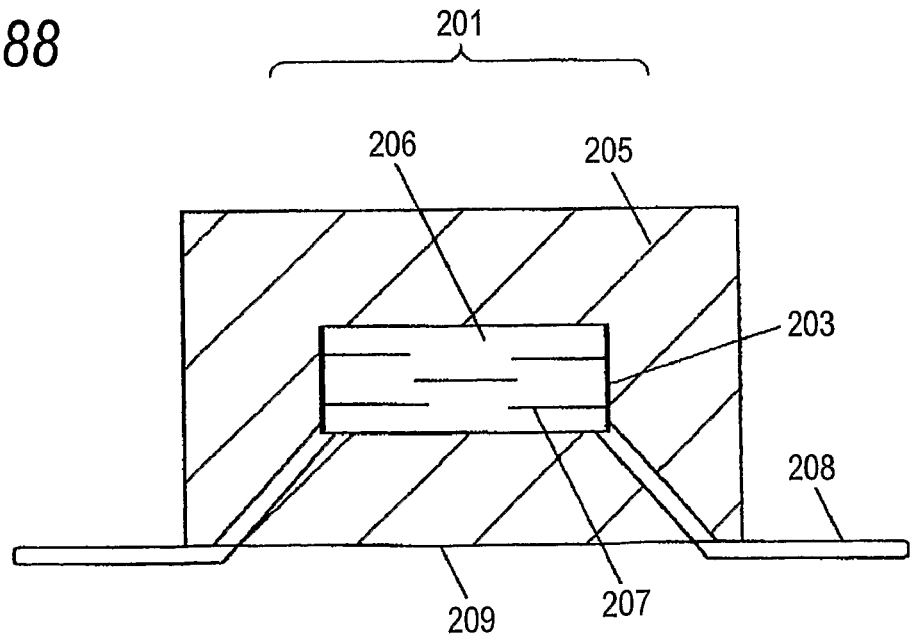
FIG. 88 is a side view of an electronic component in an embodiment of the invention.

FIG. 88 shows such a configuration that the lead terminal 208 is protruded from a position, on the bottom surface of the external covering material 205, which is close to a corner portion of the bottom surface and the side surface of the external covering material 205. By this configuration, a gap is generated between the lead terminal 208 and the external covering material 205, and it is possible to improve flexure resistance.

Figure 89:
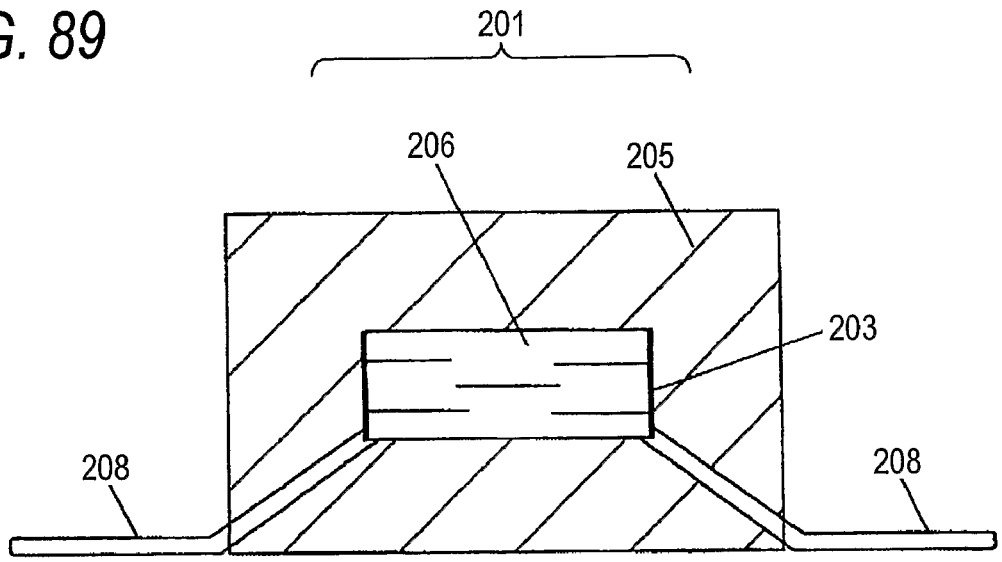
FIG. 89 is a side view of an electronic component in an embodiment of the invention.

FIG. 89 shows such a configuration that the lead terminal 208 is protruded from a position, on the side surface of the external covering material 205, which is close to a corner portion of the bottom surface and the side surface of the external covering material 205. By this configuration, a gap is generated between the lead terminal 208 and the external covering material 205, and it is possible to improve flexure resistance.

Figure 90:
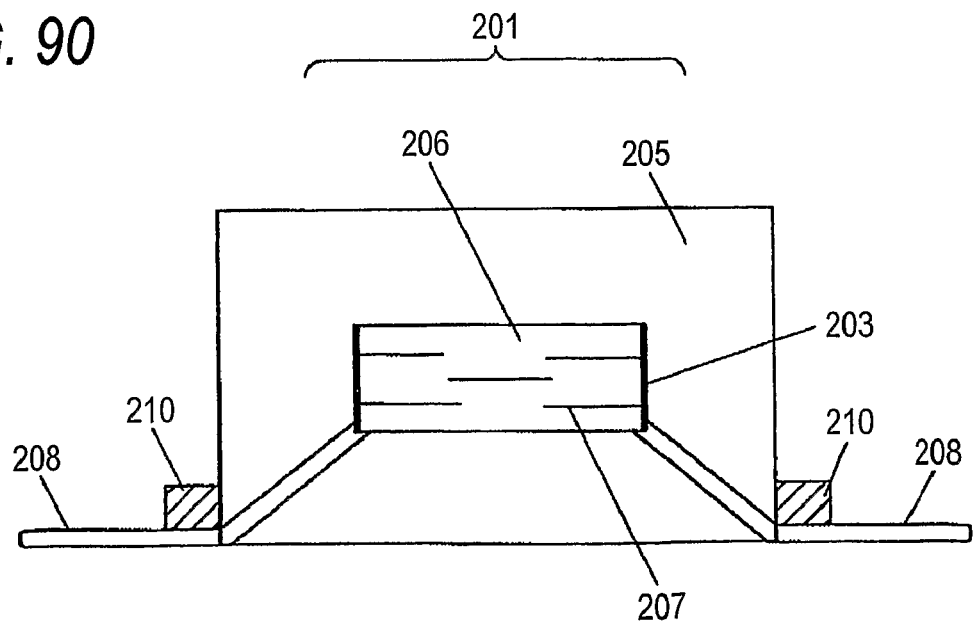
FIG. 90 is a side view of an electronic component in an embodiment of the invention.

FIG. 90 shows such a configuration that the reinforcing material 210 is formed on a part of anyone of the external covering material 205 and the lead terminal 208. In FIG. 90, it is disposed on an intersection portion of the external covering material 205 and a protruded portion of the lead terminal 208, but it may be disposed on a region other than this. By this configuration, shock resistance of the lead terminal 208 and the external covering material 205 is improved.

Figure 91:
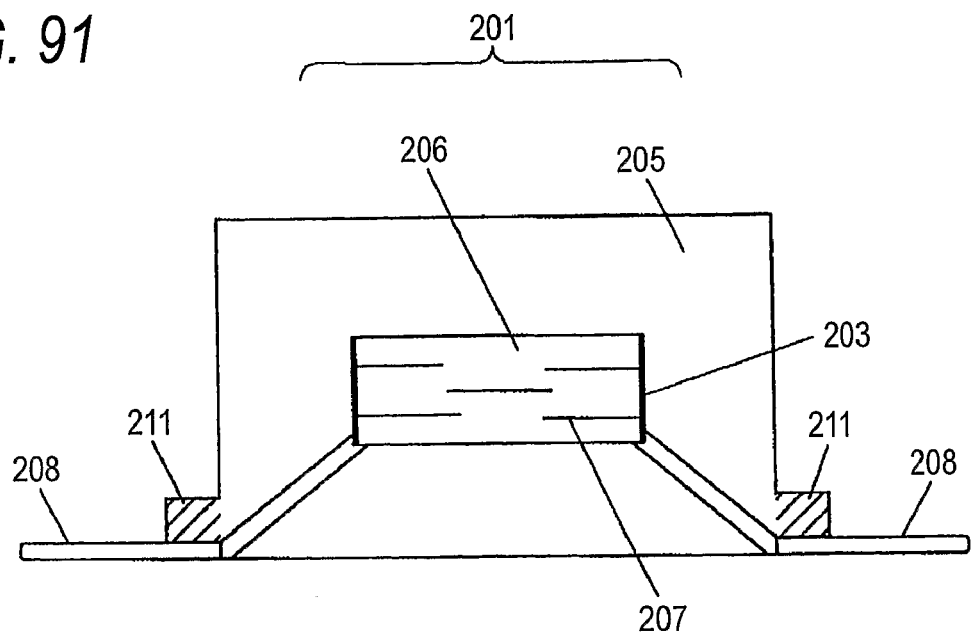
FIG. 91 is a side view of an electronic component in an embodiment of the invention.

FIG. 91 represents such a configuration that the convex portion type reinforcing material 211, which was formed integrally with the external covering material 205, is used as the reinforcing material 210. By this configuration, it is possible to form the reinforcing material 210 easily.

Figure 92:
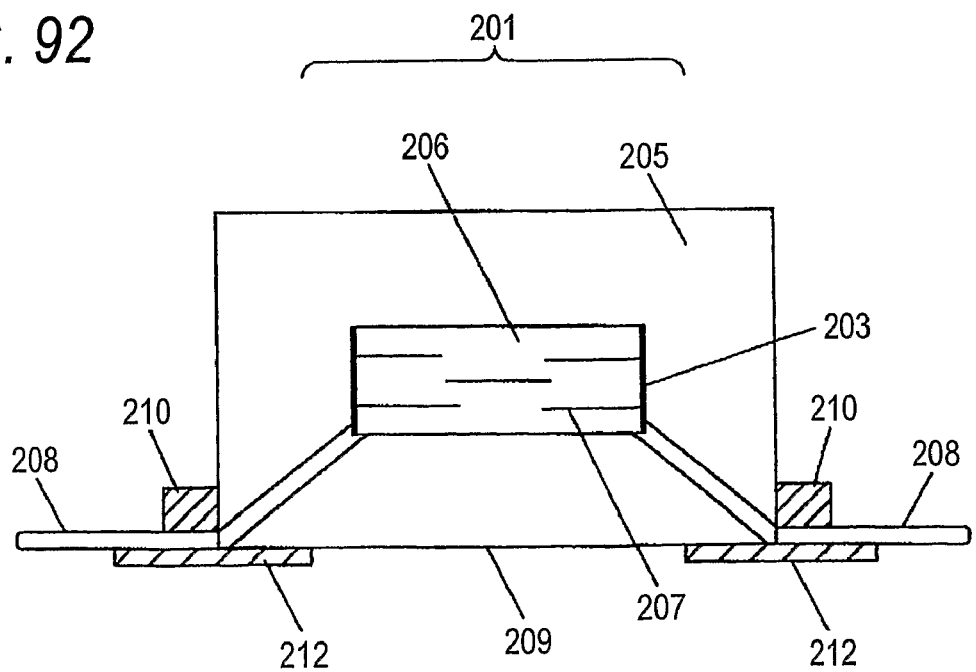
FIG. 92 is a side view of an electronic component in an embodiment of the invention.

FIG. 92 represents such a configuration that the bottom surface reinforcing material 212 is formed. By the bottom surface reinforcing material 212, it is possible to prevent bending etc. due to shock which is applied to the lead terminal 208, and shock resistance is improved.

Figure 93:
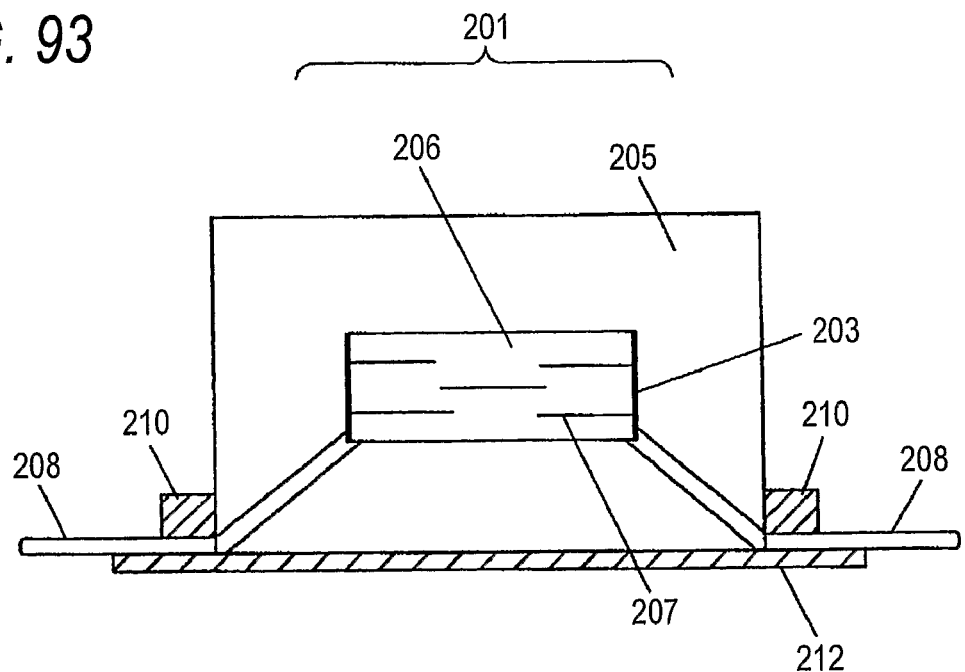
FIG. 93 is a side view of an electronic component in an embodiment of the invention.

FIG. 93 also represents such a configuration that the bottom surface reinforcing material 212 is formed, and it covers an entire bottom surface of the external covering material 205, and thereby, it is possible to improve more shock resistance.

Figure 94:
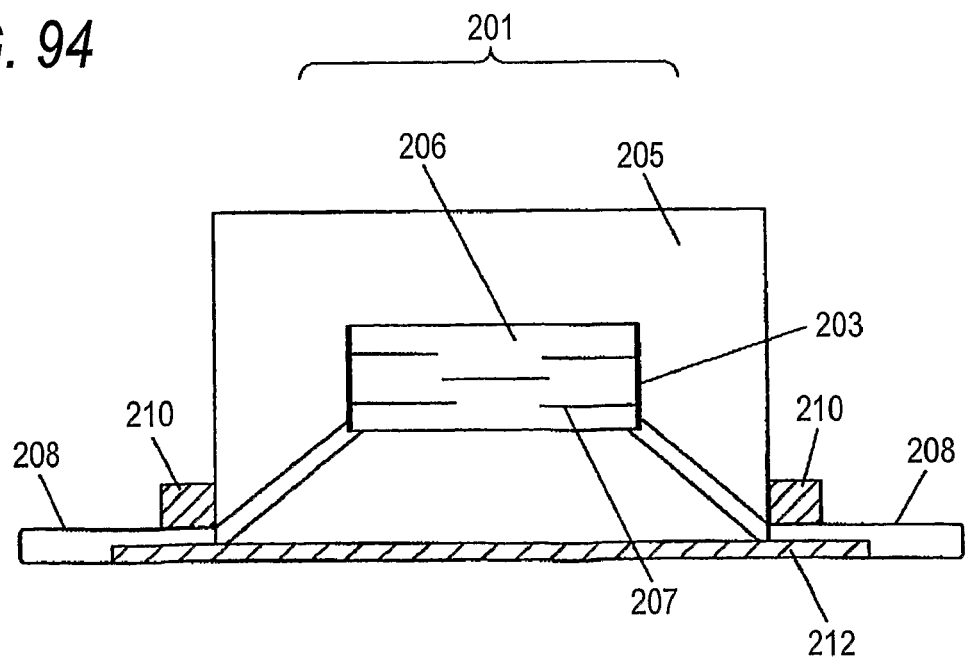
FIG. 94 is a side view of an electronic component in an embodiment of the invention.

FIG. 94 represents such a configuration that the bottom surface reinforcing material 212 is formed, and thereby, the lead terminal 208 is matched with this shape. By this configuration, even in case that the bottom surface reinforcing material 212 was disposed, a gap is eliminated between amounting surface of the lead terminal 208 and a mounting substrate, and a necessity of a solder raise etc. is eliminated, and mounting strength is improved.

Figure 95:
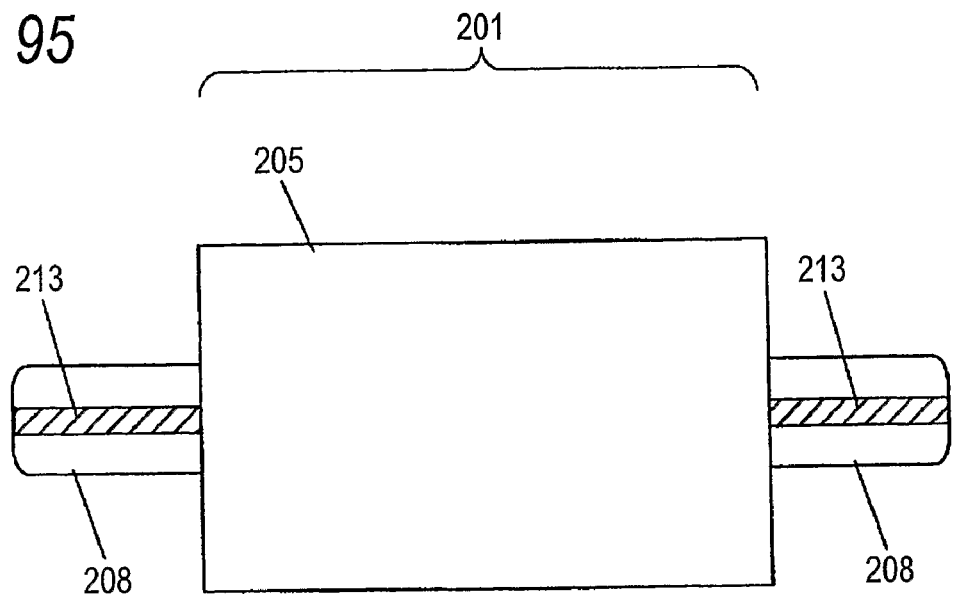
FIG. 95 is a top view of an electronic component in an embodiment of the invention.

FIG. 95 represents such a configuration that the reinforcing material 213 was disposed on a non-mounting surface of the lead terminal 208 at a roughly center in its longitudinal direction. By this configuration, it is possible to prevent folding-back of the lead terminal 208, and it is possible to heighten stress resistance and endurance.

Figure 96:
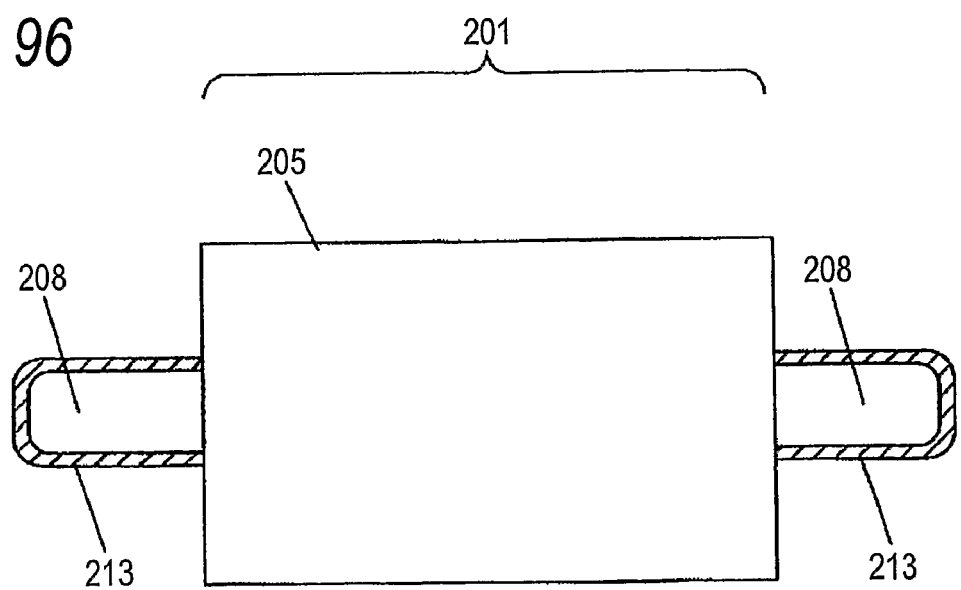
FIG. 96 is a top view of an electronic component in an embodiment of the invention.

FIG. 96 represents such a configuration that the reinforcing material 213 was formed on a non-mounting surface of the lead terminal 208 at its peripheral portion. By this configuration, it is possible to prevent folding-back of the lead terminal 208, and it is possible to heighten stress resistance and endurance.

Figure 97:
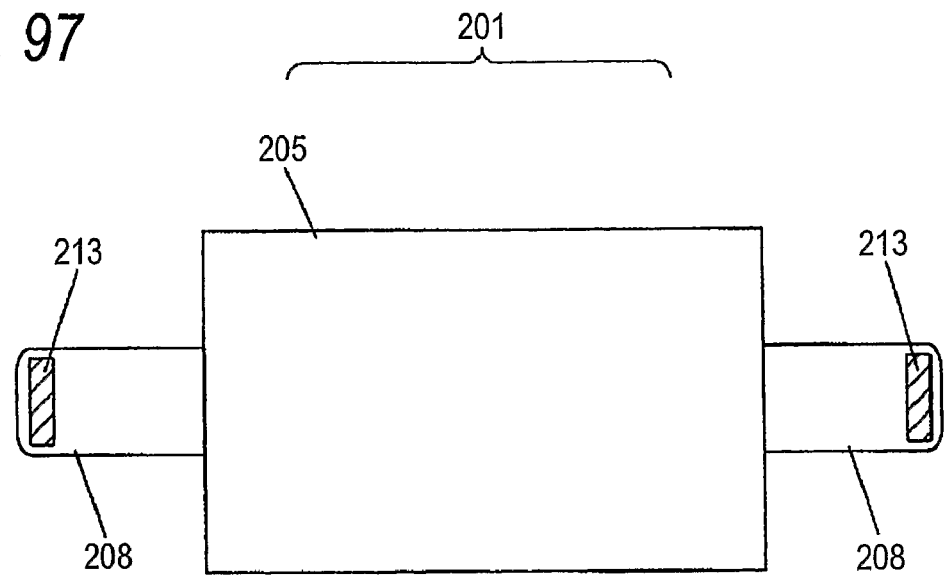
FIG. 97 is a top view of an electronic component in an embodiment of the invention.

FIG. 97 represents such a configuration that the reinforcing material 213 was formed on a non-mounting surface of the lead terminal 208 at its front edge. By this configuration, it is possible to prevent folding-back of the lead terminal 208, and it is possible to heighten stress resistance and endurance.

Figure 98:
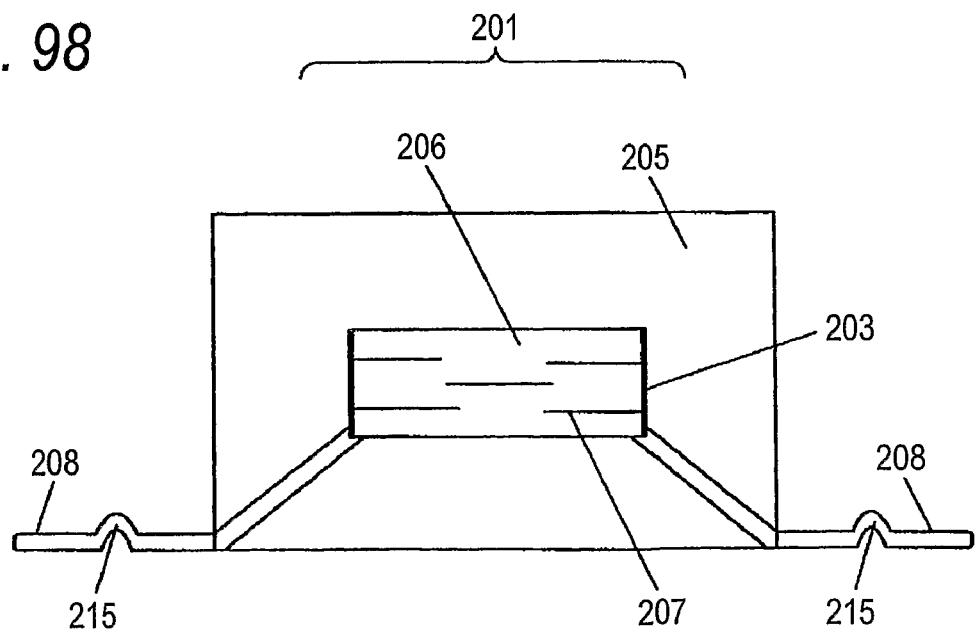
FIG. 98 is a side view of an electronic component in an embodiment of the invention.

FIG. 98 represents such a configuration that the curved surface portion 215 is formed on the lead terminal 208 as an example of a flexure absorbing portion. By this configuration, flexure resistance of the lead terminal 208 is improved.

Figure 99:
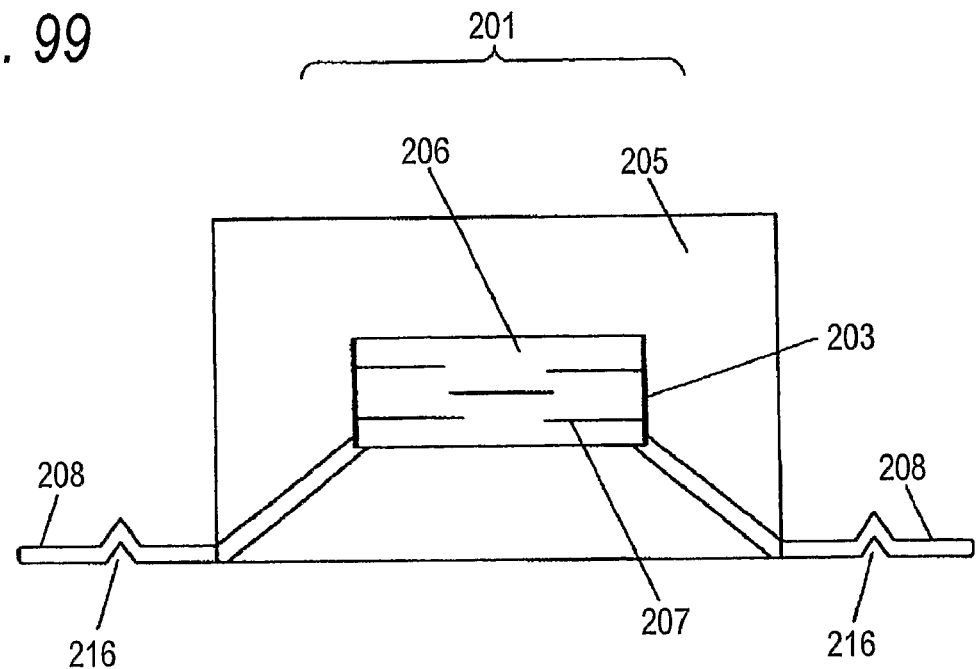
FIG. 99 is a side view of an electronic component in an embodiment of the invention.

FIG. 99 represents such a configuration that the folded portion 216 is formed on a part of the lead terminal 208 as an example of the flexure absorbing portion. By this configuration, a relaxation absorbing force on the lead terminal 208 is generated, and flexure resistance is improved.

Figure 100:
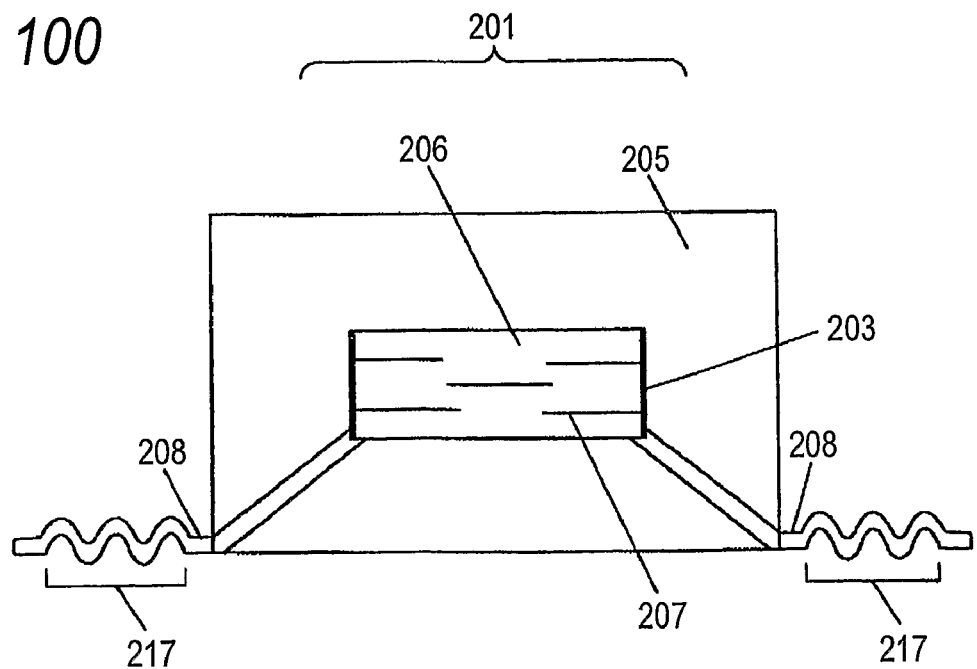
FIG. 100 is a side view of an electronic component in an embodiment of the invention.

FIG. 100 shows such a configuration that the wavy surface 217 is formed on the lead terminal 218 as an example of the flexure absorbing portion. In the same manner as above, a relaxation absorbing force on the lead terminal 208 is generated and flexure resistance is improved.

Figure 101:
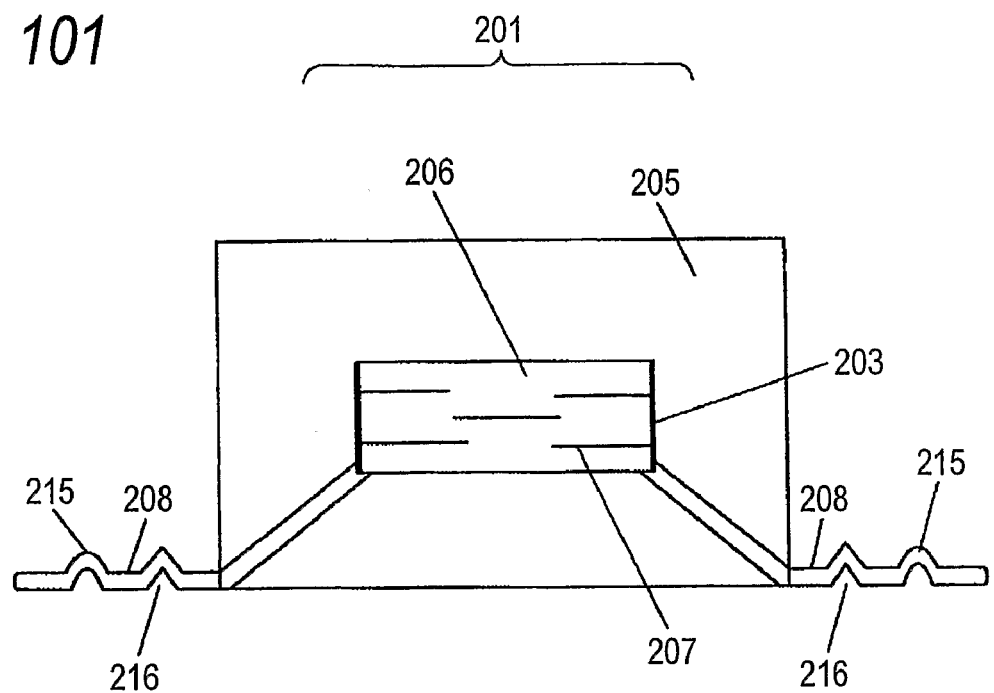
FIG. 101 is a side view of an electronic component in an embodiment of the invention.

FIG. 101 shows such a configuration that the curved surface portion 215 and the folded portion 216 are formed in a combined manner on the lead terminal 208. By this configuration, improvement of flexure resistance increases more. Meanwhile, the combination may be, other than this, various such as a combination of the wavy surface 217 and the folded portion 16.

Figure 102:
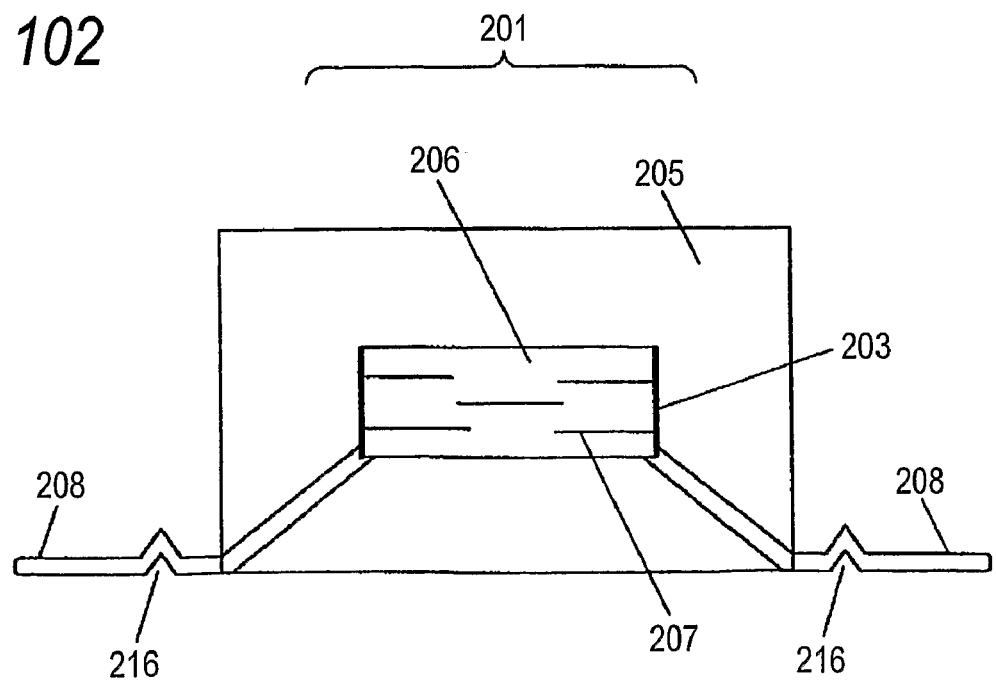
FIG. 102 is a side view of an electronic component in an embodiment of the invention.

FIG. 102 represents such a configuration that the flexure absorbing portion was disposed on a root of the lead terminal 208 which is protruded to an outside of the external covering material 205. By this configuration, it becomes possible to improve flexure resistance against vibration etc. on a portion which is close to the external covering material 205.

Figure 103:
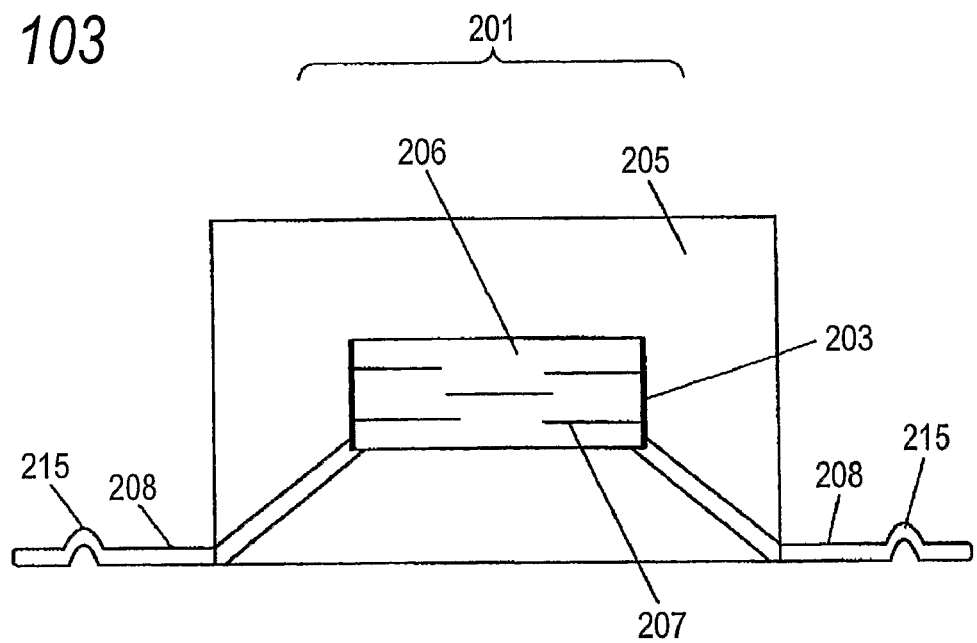
FIG. 103 is a side view of an electronic component in an embodiment of the invention.

FIG. 103 represents such a configuration that the flexure absorbing portion was disposed on a front edge of the lead terminal 108 which is protruded to an outside of the external covering material 105. By this configuration, a virtual range area, which absorbs flexure, is widened, and it becomes possible to respond to large vibration etc.

Figure 104:
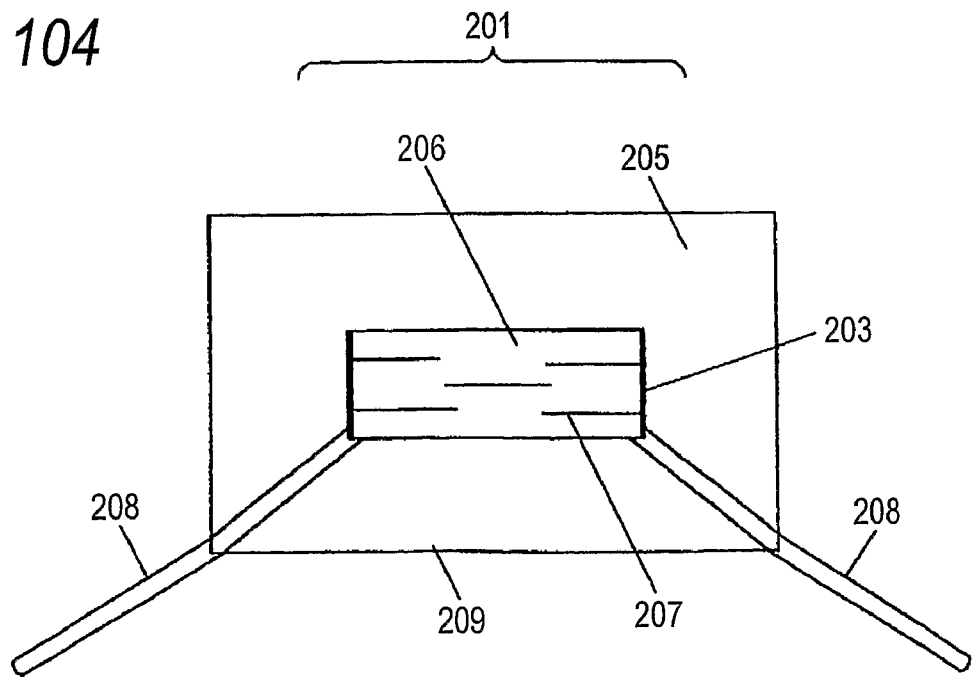
FIG. 104 is a side view of an electronic component in an embodiment of the invention.

FIG. 104 shows such a configuration that the lead terminal 208, which is protruded to an outside of the external covering material 205, is not parallel with the bottom surface 209 of the external covering material 205. By this configuration, the lead terminal 208 has elasticity, and it becomes possible to improve flexure resistance after mounting.

Figure 105:
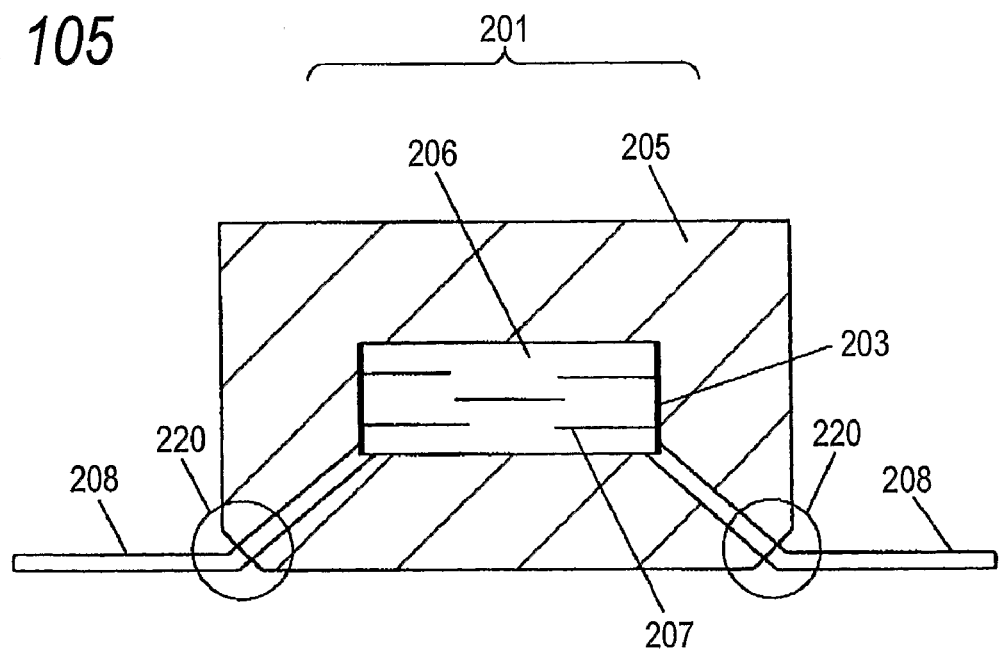
FIG. 105 is a side view of an electronic component in an embodiment of the invention.

FIG. 105 represents such a configuration that the inclined portion 220 is disposed on a corner portion from which the lead terminal 208 is protruded. By this configuration, it is possible to avoid influence to a protruded portion which is the weakest portion in the external covering material 205, and it is possible to improve shock resistance.

Figure 106:
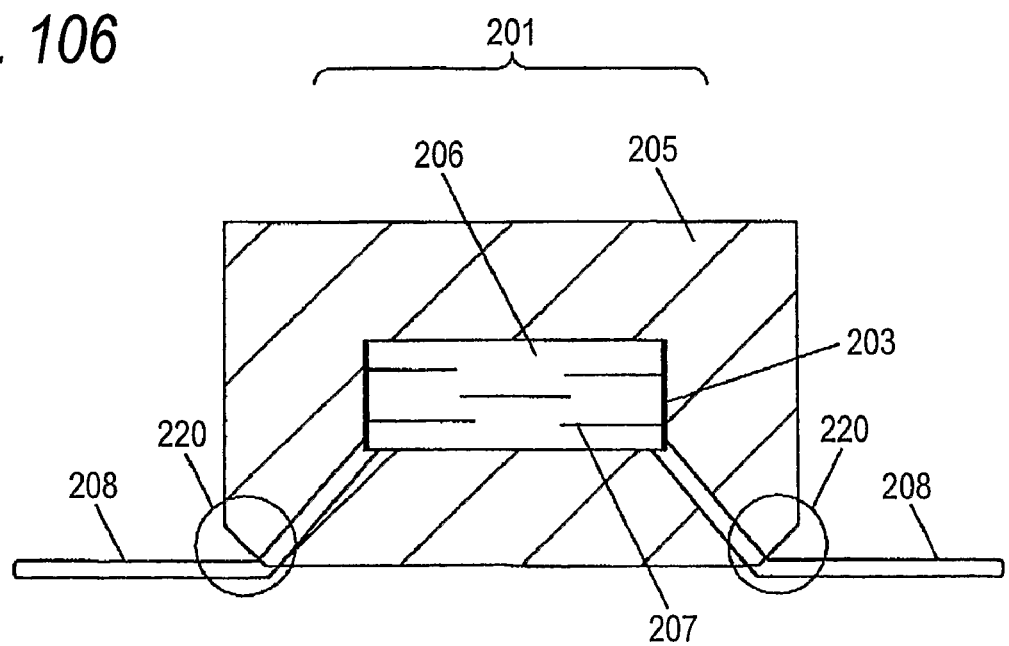
FIG. 106 is a side view of an electronic component in an embodiment of the invention.

FIG. 106 represents such a configuration that the lead terminal 208 is protruded from a corner portion where the inclined portion 220 and the bottom surface of the external covering material 205 intersect. By this configuration, shock resistance to the external covering material is improved, and it is possible to improve flexure resistance by heightening freedom degree between the external covering material 205 and the lead terminal 208.

Figure 107:
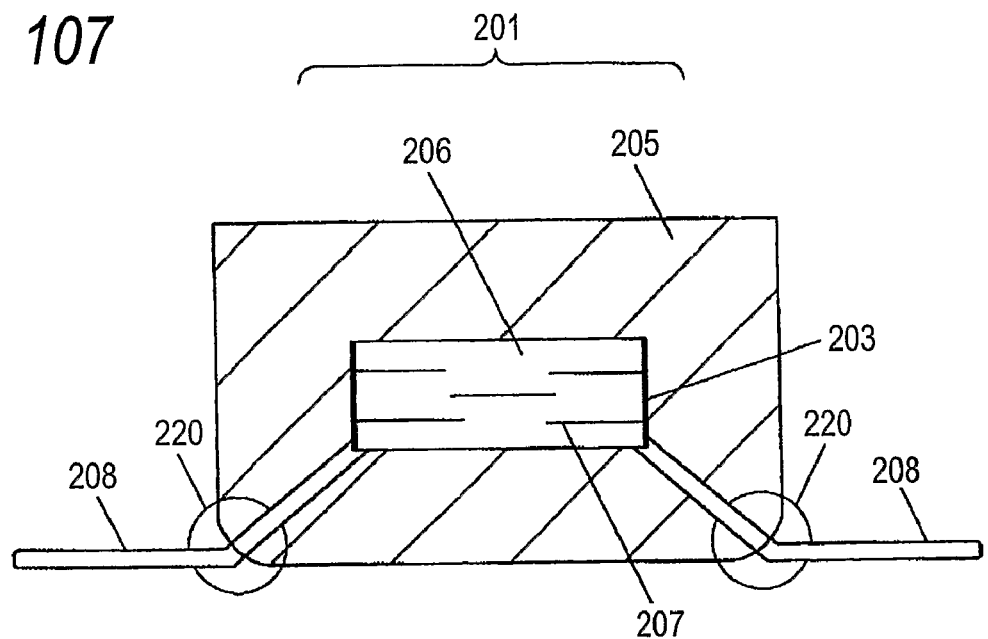
FIG. 107 is a side view of an electronic component in an embodiment of the invention.

FIG. 107 represents such a configuration that the incline portion 220 is of a roughly circular arc surface shape. A surface of the inclined portion 220 is a circular arc surface, and thereby, there is such a merit that it becomes strong against shock to the weakest protruded portion of the external covering material 205.

Figure 108:
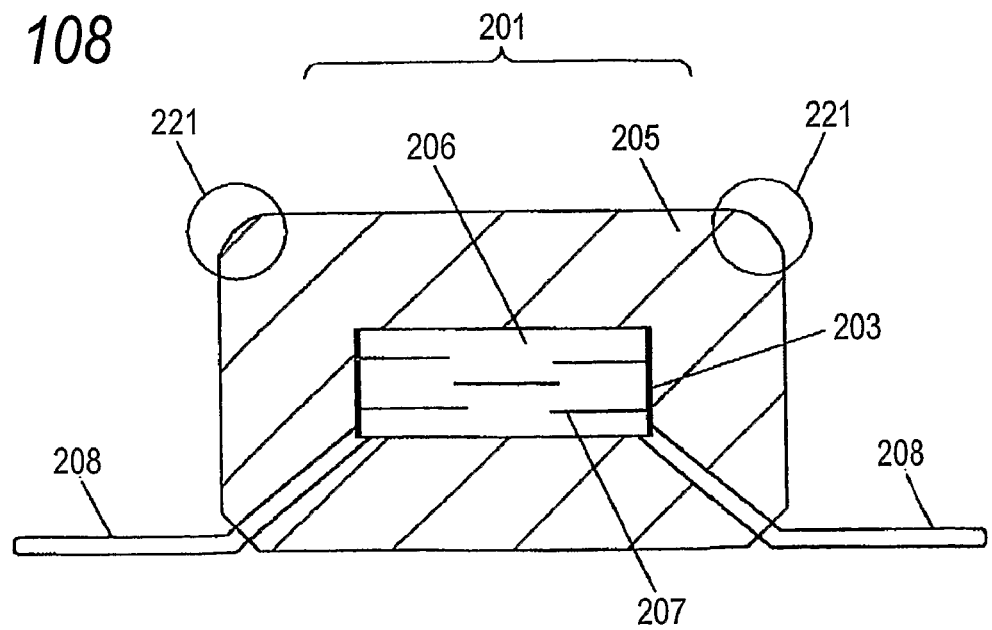
FIG. 108 is a side view of an electronic component in an embodiment of the invention.

FIG. 108 represents such a configuration that chamfering 221 is formed on a corner portion of the external covering material 205 and on a corner portion other than a protruded portion of the lead terminal 208. By this configuration, shock resistance and endurance of the external covering material 205 are improved.

Figure 109:
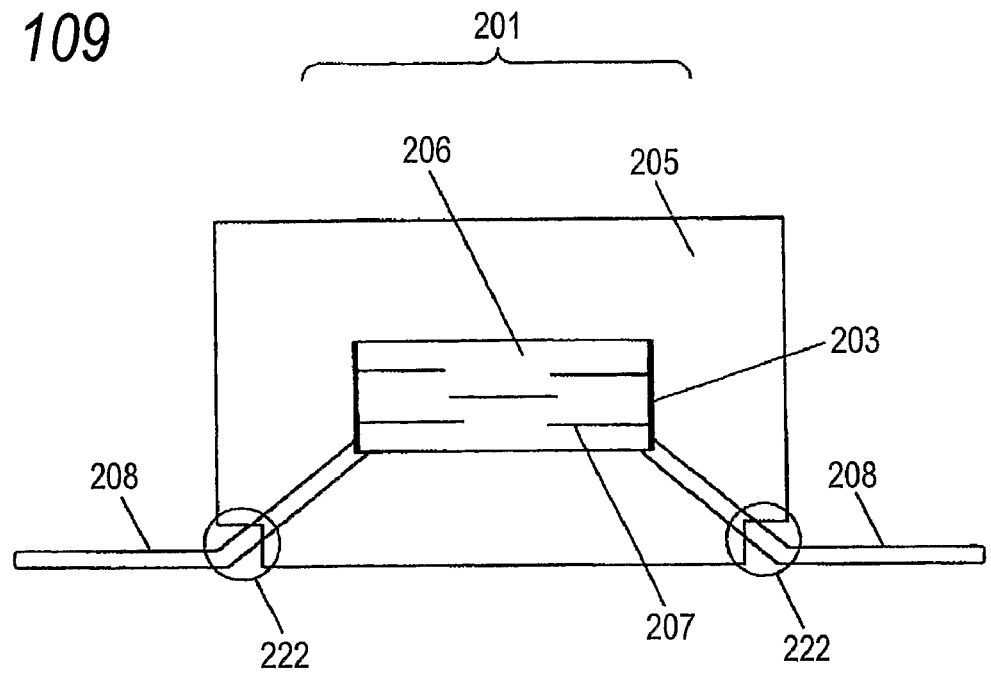
FIG. 109 is a side view of an electronic component in an embodiment of the invention.

FIG. 109 represents such a configuration that the dent portion 222 was disposed on the external covering material 205 and on a protruded portion of the lead terminal 208. By this dent portion 222, a space is generated between the external covering material 205 and the lead terminal 208, and a relaxation absorbing force of the lead terminal 208 is generated, and flexure resistance is improved.

Figure 110:
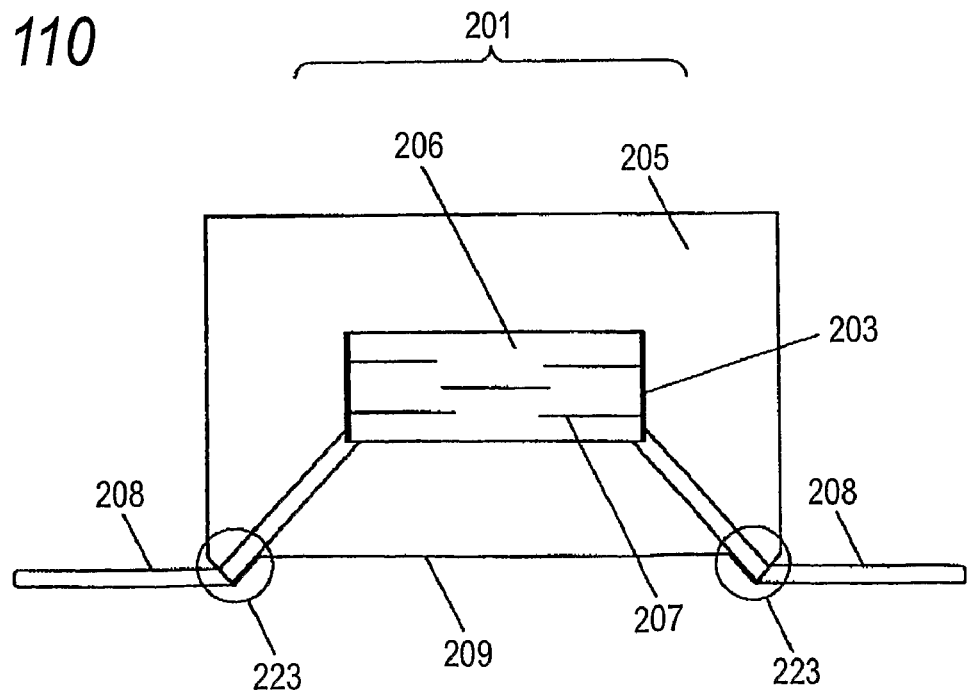
FIG. 110 is a side view of an electronic component in an embodiment of the invention.

FIG. 110 represents such a configuration that the convex portion 223 is formed on the bottom surface of the external covering material 205, and the lead terminal 208 is protruded from this convex portion 223. By this configuration, a space is generated between the lead terminal 208 and the bottom surface 209 of the external covering material 205, and flexure resistance is improved.

Figure 111:
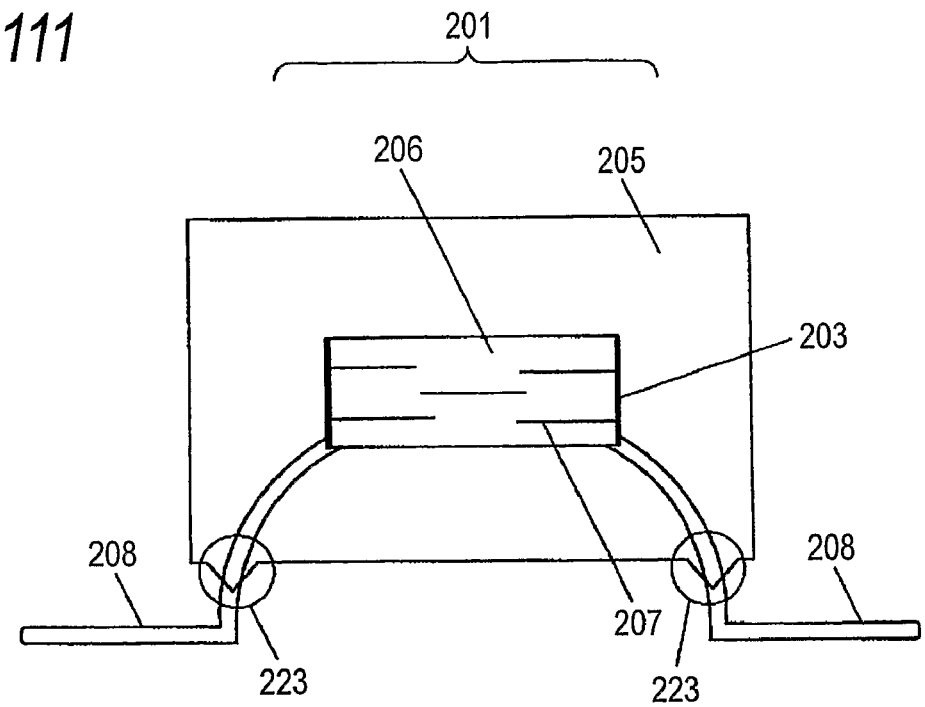
FIG. 111 is a side view of an electronic component in an embodiment of the invention.

FIG. 111 shows such a configuration that the lead terminal is protruded from a front edge of the convex portion 123, and stretched to a lower side of the bottom surface 109, and thereafter, folded back in a roughly L-letter shape. By this configuration, a space amount between the bottom surface 109 of the external covering material 105 and the lead terminal 108 becomes very large, and flexure resistance improvement is heightened very much.

Figure 112:
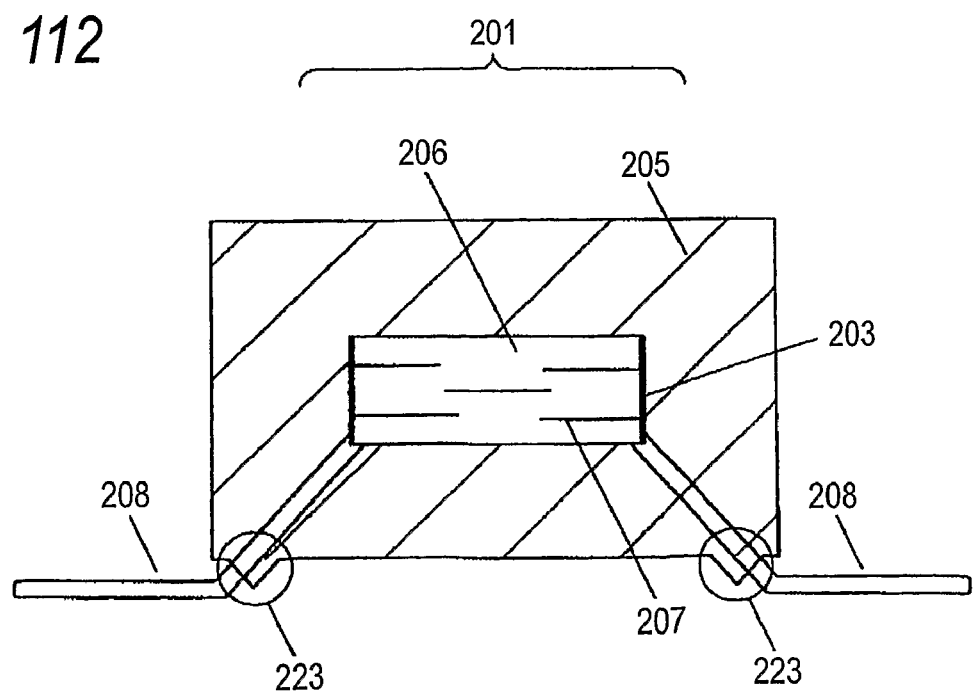
FIG. 112 is a side view of an electronic component in an embodiment of the invention.

FIG. 112 represents such a configuration that the lead terminal 208 is protruded from an any region such as a side surface of the convex portion 223, other than the front edge, and structural strength of the convex portion 223 and a protruded portion of the lead terminal 208 is improved, and flexure resistance is also improved.

Figure 113:
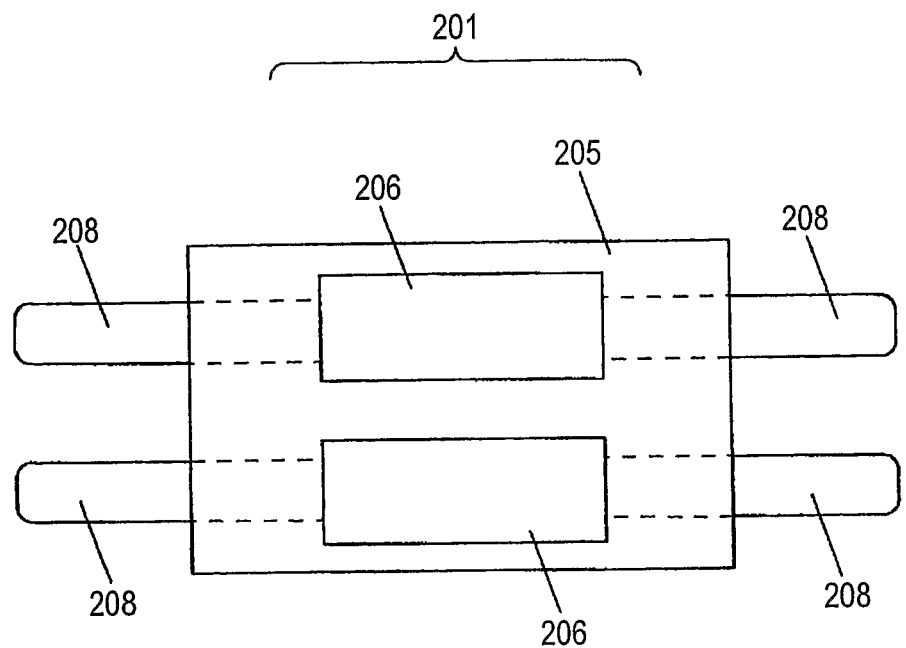
FIG. 113 is a top view of an electronic component in an embodiment of the invention.

FIG. 113 represents such a configuration that a plurality of the multilayered capacitors 206 are sealed in an inside of the external covering material 205, and by this configuration, it is possible to form a composite electronic component easily, and it is further possible to save labor hour for mounting on a composite line.

Figure 114:
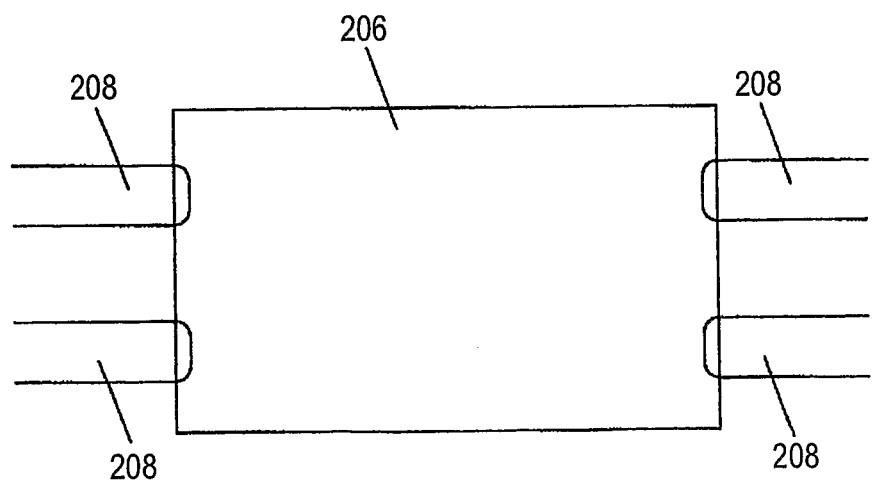
FIG. 114 is a top view of an electronic component in an embodiment of the invention.

FIG. 114 represents such a configuration that the lead terminals 208, which become a plurality of pairs, were connected to the multilayered capacitor 206 as one base body, and by this means, it is possible to form a composite electronic component easily.

Next, detail of each portion will be described.

201 designates an electronic component, and is one in which the multilayered capacitor 206 was molded, but there is no limitation to the multilayered capacitor 206, but it may be any one of a resistor, an inductor, a filter, IC, and another electronic element.

Next, the multilayered capacitor 206 will be described.

The multilayered capacitor 206 is configured in such a manner that a base body, which is configured by a dielectric material, is laminated with a plurality of sheets and the internal electrodes 207 are formed, and thereby, it is possible to make it larger capacitance with an identical size, as compared to a single plate capacitor.

Further, for the purpose of electrically connecting this multilayered capacitor 206 to the lead terminals 208, a pair of the external electrodes 203 are disposed.

The dielectric base body is a base body which was configured by a dielectric material, and a dielectric material such as for example, titanium oxide and barium titanate is suitably used. Alternatively, alumina etc. are also used. By use of the suchlike materials, it is arbitrarily formed in necessary shape, size.

The internal electrode 207 is an electrode which was buried in an inside of the dielectric base body, and as a constituent material of the internal electrode 207, cited are a metal material and alloy including at least one of Ni, Ag, Pd, Cu, Au etc.

Here, by forming this internal electrode 207 through the use of a metal material which consists primarily of Ag and Pd, there is such a merit that endurance to high temperature is heightened, and damage of the internal electrode 207 due to high temperature at the time of pouring of melted resin which becomes the external covering material 205 and at the time of re-flow on mounting is few, and therefore, it is desirable to use Ag and Pd as main ingredients.

In addition, it may be one which surface plating processing was applied. In addition, a thickness of the internal electrode 207 is configured so as to be 1 through 5 μm. In addition, it is desirable that a distance between adjacent internal electrodes 207 is set to 15 μm or more.

Some of the internal electrodes 207 are electrically connected to the external electrodes 203, and the internal electrode 207, which is connected to only one of the electrodes 203, faces against the internal electrode 207 which is connected to only the other of the electrodes 203, and major capacitance is generated between these facing internal electrodes 207.

Meanwhile, the lead terminal 208 is electrically connected to the multilayered capacitor 206 through this external electrode 203, and at the time of connecting, a material, which consists primarily of copper, is used, and thereby, high temperature endurance is heightened.

Meanwhile, a size of the multilayered capacitor 206 is configured so as to satisfy, when it is assumed that its length is L1 and height is L2 and width is L3, 3.0 mm≦L1≦5.5 mm
0.5 mm≦L2≦2.5 mm
1.5 mm≦L3≦3.5 mm but as a matter of course, it is all right even if a size other than this is used, and it is also all right even if a plurality of, but not single, multilayered capacitors 206 are sealed with the external covering material 205. It is such a case represented in FIG.

113. Alternatively, a plurality of the paired external electrodes 203 are disposed separately on one multilayered capacitor 206, and the lead terminals 208 are connected to these separated external electrodes 203 respectively, and thereby, a plurality of elements are to be formed on one base body, and it is possible to configure a composite component easily. It is a case represented in FIG. 114.

Meanwhile, when L1 through L3 are made smaller than the above-described lower limits, a forming area of the internal electrode 207 becomes insufficient, and a mutual distance between the internal electrodes 207 becomes narrow necessarily, and it must reduce the number of sheets of the internal electrodes 207, and it becomes difficult to obtain a large capacitance value, and it becomes difficult to obtain an electronic component having wide range of capacitances.

In addition, it is preferable that, in order to prevent damage due to shock against the multilayered capacitor 206 at the time of molding the multilayered capacitor 6 with the external covering material 205, chamfering is applied to corner portions of the multilayered capacitor 206, and a circular arc shaped curve curved line is disposed on a part, or all of each side surface.

Next, the external electrode 203 will be described.

The external electrode 203 is an electrically conductive member which was disposed as a pair on both ends of the multilayered capacitor 206 as described above, and one which electrically connects the multilayered capacitor 206 and the lead terminal 208. It is common that the external electrode 203 is disposed as a pair on both ends of the multilayered capacitor 206, but it is all right even if it is disposed on a midstream portion of the multilayered capacitor 206, but on the both ends. Alternatively, it is all right even if it is disposed on upper and lower surfaces, but not on side surfaces of the multilayered capacitor 206, and it is also all right even if it is disposed across a whole surface of side surfaces and upper, lower surfaces, and it is also all right even if it is disposed only on a part thereof, and it is also all right even if it is disposed so as to be protruded to another surface.

As a material of the external electrode 203, cited is a metal material which includes at least one of Ni, Ag, Pd, Cu, Au etc. In addition, it is all right even if alloy of these materials, and one to which surface plating processing was applied are used. As a matter of course, it is also all right even if alloy etc. are used, and it is all right if it is realized by any one of single layer, multiple layer plating processing, deposition processing, sputter processing, paste coating etc.

In addition, on the occasion of connecting the multilayered capacitor 206 and the lead terminal 208, this external electrode 203 is used, but it is desirable that solder, which consists primarily of tin, is used for this connection. Since tin is used as a major ingredient, it is possible to eliminate a challenging agent against environment, and in addition, it is possible to heighten a melting point, and therefore, it is possible to prevent melt and damage in re-flow etc. at the time of mounting, and it is possible to configure the electronic component 201 with high reliability. In particular, it is desirable that solder with a melting point of 240° C. or more is used. Further, at this time, it is desirable that the lead terminal 208 is formed by a material which consists primarily of copper. By this means, as to the lead terminal 208 itself, heightened is endurance against high temperature at the time of pouring of melted resin, and high temperature at the time of re-flow, and it is possible to realize the electronic component 201 with high reliability.

Next, the lead terminal 208 will be described.

The lead terminals 208 are disposed as a pair and connected to the multilayered capacitor 206 through the external electrodes 203. Normally, there are many cases that they are disposed on both ends thereof, but it is all right even if they are disposed on places other than the both ends. For example, in case that the external electrodes 203 were disposed on upper and lower surfaces of the multilayered capacitor 206, it is all right even if the lead terminals 208 are connected to the upper and lower surfaces in tune with this. In addition, the lead terminal 208 is configured by a material which includes at least one of Cu, Zn, Ni, Ag, Au, etc., and single layer or multiple layer plating processing may be applied to its surface.

At this time, as described above, in case that it was formed by the material which consists primarily of copper or alloy, as high temperature countermeasure, there is such a problem that a wetting characteristic of solder between a mounting substrate and the lead terminals 208 becomes weak, and there is need to carryout re-flow under high temperature, but as described above, it is solved by using solder with melting temperature 240° C. or more, as solder which is used for the external electrodes 203.

Alternatively, it is desirable that, by using 42 alloy for the lead terminal 208, the solder wetting characteristic is heightened to make mounting easy.

Next, the lead terminal 208 is connected to the external electrode 203, and arbitrarily processed in an appropriate shape, and formed so as to be protruded to an outside of the external covering material 205.

In addition, by such pouring type mold that the multilayered capacitor 206, to which the lead terminals 208 were connected, is placed in a metal mold in such a state that these lead terminal 208 were hooked at the metal mold, and melted resin is poured into this metal mold to form the external covering material 205, it is possible to simplify a manufacturing process, and to manufacture the electronic component 201 at very low cost.

Next, such a matter that, by a configuration of the lead terminal 208, shock resistance and flexure resistance thereof are heightened, regardless of the suchlike easy and low cost manufacture, will be described.

As shown in FIG. 82, in case of such a configuration that the lead terminal 208 has a portion which is thicker in thickness on an outside of the external covering material 205, than thickness in an inside of the external covering material 205, it is possible to prevent influence from shock etc. which are applied to the lead terminals 208 on an outside, and it is possible to heighten shock resistance.

Alternatively, as shown in FIG. 83, in case of such a configuration that the lead terminal 208 has a portion which is thinner in thickness on an outside of the external covering material 205, than thickness in an inside of the external covering material 205, it is possible to improve elasticity of the lead terminal 208, and therefore, it is possible to improve flexure resistance.

Alternatively, as shown in FIG. 84, in case of such a shape that its thickness becomes thinner to a front edge, just the same, it is possible to improve elasticity of the lead terminal 208, and to improve flexure resistance.

Conversely, as shown in FIG. 85, in case of such a configuration that it increases in thickness to a front edge, there is such a merit that it is possible to heighten shock resistance at a front edge portion to which shock and stress are applied substantially.

In addition, as shown in FIG. 86, by making a root portion of protrusion more thick, it is possible to prevent folding-back at the root portion.

Conversely, as shown in FIG. 87, by making a front edge portion most thick, it is made so as to be strong against stress which is applied to the front edge portion, and further, by making weight of a front edge heavier, it is possible to improve mounting strength.

Next, as shown in FIG. 88, in case that it was configured in such a manner that the lead terminal 208 is protruded from the bottom surface 209 which is adjacent to a corner portion, but not from the corner portion of the bottom surface 209 and the side surface of the external covering material 205, a gap is generated between it and the bottom surface 209, and a relaxation absorbing force is generated, and flexure resistance is improved.

Alternatively, as shown in FIG. 89, in case that was configured in such a manner that the lead terminal 208 is protruded from a side surface which is adjacent to the corner portion of the bottom surface 209 and the side surface of the external covering material 205, a gap is generated between it and the side surface, and a relaxation absorbing force is generated, and flexure resistance is improved.

Next, the reinforcing material 210, the convex portion type reinforcing material 211, and the bottom surface reinforcing material 212 will be described.

The reinforcing material 210 is disposed on at least one of the external covering material 205 and the lead terminal 209, and for example, as shown in FIG. 90, it is disposed on a portion where the external covering material 205 and the lead terminal 208 intersect. By such a matter that the suchlike reinforcing material 210 is disposed, it is possible to prevent shock to the lead terminal 208, or to prevent shock to the external covering material 205 itself.

Meanwhile, the reinforcing material 210 may be bonded after it was formed as a separate body which is separated from the external covering material 205, and may be formed integrally like the convex portion type reinforcing material 11.

As to the convex portion type reinforcing material 211, a portion, which becomes a convex portion, is disposed in advance on the external covering material 205, and it is used as the reinforcing material, and at this time, it is possible to improve shock resistance to the lead terminal 208, by bonding it to the lead terminal 208 etc.

The bottom surface reinforcing material 212 is a reinforcing material which was disposed on a mounting surface, so as to be overlapped with at least a part of each of the external covering material 205 and the lead terminal 208, and as represented in FIG. 92, by forming it to support a bottom surface side of a protruded portion of the lead terminal 208, shock resistance of the lead terminal 208 is heightened.

At this time, it is all right if the bottom surface reinforcing material 212 is disposed so as to support the bottom surface 209 and a part of the lead terminal 208, and it is also all right even if, as shown in FIG. 93, one sheet of the bottom surface reinforcing material 212 is formed so as to be overlapped with a part of the lead terminal 208, in addition to an area which is surrounded by a width of the lead terminal 208, on the bottom surface 209. By the suchlike configuration, there is such a merit that formation of the bottom surface reinforcing material 212 becomes easy.

In addition, it is all right even if the bottom surface reinforcing material 212 and the reinforcing material 210 or the convex portion type reinforcing material 11 are arbitrarily disposed in a combined manner. By using it in a combined manner, strength securement is realized more.

In addition, by such a matter that the bottom surface reinforcing material 212 is disposed, apart of a mounting surface of the lead terminal 208 has a distance with a mounting substrate, and therefore, as shown in FIG. 94, a concave portion is disposed in the lead terminal 208, and the bottom surface reinforcing material 212 is placed in tune with the concave portion, and thereby, it eliminates to enlarge a distance between the mounting substrate and the mounting surface of the lead terminal 208, and it is possible to strengthen mounting strength.

In addition, as shown in FIGS. 95 through 97, it is desirable to dispose the reinforcing material 213 on a non-mounting surface of the lead terminal 208. By such a matter that the reinforcing material 213 is disposed on a non-mounting surface of the lead terminal 208, improved is shock resistance by which it is possible to prevent influence from shock, such as folding-down and bending of the lead terminal 208.

This reinforcing material 213, which is formed on a non-mounting surface of the lead terminal 208, may be formed at an any position of the non-mounting surface of the lead terminal 208, and it is all right even if it is formed at a roughly center in a longitudinal direction of the lead terminal 208 as shown in FIG. 95, and it is also all right even if it is formed at a peripheral portion of the lead terminal 208 as shown in FIG. 96, and it is also all right even if it is formed on a front edge portion of the lead terminal 208 as shown in FIG. 97. As a matter of course, it may be disposed on a root of the lead terminal 208, or may be disposed on a root and a front edge, or may be disposed at a center and a front edge, or may be disposed in various formed.

Next, the flexure absorbing portion will be described.

The flexure absorbing portion is one which was disposed on the lead terminal 208, and has a relaxation absorbing force of vibration and shock which are applied to the electronic component 201 after mounting, and improve flexure resistance of the lead terminal 208. As this flexure absorbing portion, there is such a shape of the curved surface portion 215, the folded portion 216, the wavy portion 217 or the same, and it is all right if any one of them is arbitrarily selected and formed, and it is also all right even if they are combined arbitrarily and formed. In addition, a plurality of them may be formed, or it may be formed singularly. In addition, it is also all right even if it is of a shape other than the curved surface portion 215 etc.

The folded portion 216 may be formed in a roughly V-letter shape in its side cross section, and in this case, manufacture is easy. In addition, the wavy surface 217 is realized by arbitrarily forming a wavy shape by flatting with pressure at the time of manufacturing of the lead terminal 208.

Each of the curved surface portion 215, the folded portion 216, and the wavy surface 217 may be selected arbitrarily, and for example in case that the lead terminal 208 is very long, when the wavy surface 217 is formed, a balance of mounting strength and flexure resistance becomes optimum.

In addition, the curved surface portion 215 is one which can optimize a balance of easiness of manufacture and strength securement of the lead terminal 208 itself. The folded portion 216 is one which is desirable because of easiness of manufacture.

Meanwhile, in order to have a relaxation absorbing force, the flexure absorbing portion has such a state that it is not soldered at the time of mounting, and it is floated from a mounting substrate. In addition, if these things are combined arbitrarily, it is possible to mix good natures of them, and therefore, it is possible to fit improvement of flexure resistance in various levels.

By the suchlike form, a relaxation absorbing force is heightened, and flexure resistance is improved.

In addition, the flexure absorbing portion may be disposed on a root of the lead terminal 208, may be disposed on a front edge, or may be disposed between them. In case that it was disposed on a root, a front edge amount of the flexure absorbing portion of the lead terminal 208 is enlarged, and mounting strength is improved. Conversely, in case that the flexure absorbing portion was disposed on a front edge of the lead terminal 208, a virtual space, which is surrounded by the flexure absorbing portion, is widened, and therefore, a flexure absorbing force against larger vibration is heightened.

Meanwhile, as shown in FIG. 104, even in case that the flexure absorbing portion is not disposed, and in case that the lead terminal 208 and the bottom surface 209 of the external covering material 205 were made to be in non-parallel, it is possible to generate elasticity on the lead terminal 208, and it is all right even if flexure resistance is improved by this elasticity.

Next, the inclined portion 220 will be described.

The inclined portion 220 is an inclined portion which was disposed on a corner portion where the lead terminal 208 is protruded from the external covering material 205, and has such a shape that the corner portion was cut out, and it is all right even if the inclined portion 220 is formed in advance in case of forming the external covering material 205, and it is also all right even if it is cut out after the external covering material 205 was formed.

In addition, as to this inclined portion 220, as described in FIG. 105, its inclined surface may be a roughly straight plane, and may be a roughly circular arc surface as in FIG. 107, and if it is the roughly straight plane, formation is easy, and if it is the roughly circular arc surface, shock resistance against shock which is applied to the external covering material 205 is improved.

By such a matter that the lead terminal 208 is protruded from this inclined portion 220, improved is shock resistance on a region which is the weakest to shock from an outside, on the external covering material 205, and in which occurrence of cracks etc. is easy to occur, and by strength of this shock resistance, occurrence etc. of cracks are eliminated, and moisture resistance is improved and reliability is also improved. In addition, by such a matter that the lead terminal 208 is protruded from the inclined portion 220, margin is generated between the external covering material 205 and the lead terminal 208, and a relaxation absorbing force is generated, and flexure resistance is improved.

In addition, by such a matter that the lead terminal 208 is protruded from the corner portion where the inclined portion 220 and the bottom surface 209 intersect as represented in FIG. 106, margin between it and the external covering material 205 is enlarged more, and flexure resistance is improved more.

Meanwhile, it is all right even if the inclined portion 220 is not formed across a whole surface of the corner portion from which the lead terminal 208 is protruded, or is formed in tune with a width of the lead terminal 208 which is protruded, or across a width larger than it.

Next, the dent portion 222 will be described.

The dent portion 222 is a dent portion which was disposed on the corner potion where the lead terminal 208 is protruded from the external covering material 205, and by the existence of this dent portion 222, a space is generated between the protruded lead terminal 208 and the external covering material, and this becomes margin so that flexure resistance of the lead terminal 208 is improved.

Meanwhile, the dent portion 222 may be formed in advance integrally by a metal mold which is used on the occasion of forming the external covering material 205, or may be formed by chipping off etc. after the external covering material 205 was formed.

In addition, the dent portion 222 may be formed across the entire corner portion, or may be formed only on a width portion where the lead terminal 208 is protruded. Further, the dent portion 222 may be a rectangular shaped dent portion 222, may be a semicircular shaped dent portion 222, may be in other shapes, and may be in various forms.

Next, the chamfering 272 will be described.

The chamfering 221 is disposed on a corner portion other than the corner portion of the external covering material 205 where the lead terminal 208 is protruded, and may be one which is of a circular arc shape and R, or a cut-out shape by a roughly straight plane. In addition, at the time of forming the external covering material 205, the chamfer 221 may be formed integrally in tune with its metal mold, or may be processed after formation of the external covering material 205.

By such a matter that the suchlike chamfering 221 is formed, shock resistance of the corner portion, which is weak against shock, is heightened, and improvement of endurance of the external covering material, improvement of moisture resistance in tune with this, and so on are realized.

Next, the convex portion 223 will be described.

The convex portion 223 is one which is disposed on the bottom surface 209 of the external covering material 205, and from which the lead terminal 208 is protruded.

The convex portion 223 may be formed integrally with the external covering material 205, and may be integrated after they were formed separately. In addition, it may be of a material which is identical to that of the external covering material, and may be of a different material.

However, for example, in case that melted resin etc. are poured into a metal mold in which the multilayered capacitor 206 was placed, only circumference of the lead terminal 208, which is protruded from the bottom surface 209, among this melted resin, is raised by surface tension. Further, in case that the poured resin was solidified with maintaining the lead terminal 208 at lower temperature than ambient one, the external covering material 205 is formed with remaining this raised portion. By this means, the convex portion 223 is automatically formed.

Alternatively, it is also all right even if a resin made raised portion is formed at the periphery of the protruded lead terminals 208, after the external covering material 205 was once formed, and it is used as the convex portions 223.

Meanwhile, the convex portion 223 may be a roughly triangular pillar, and may be a semicircular pillar, and in case that it was formed by use of surface tension at the time of solidification of melted resin as described above, there are many cases that it becomes a shape of widening toward a root of the lead terminal 208, but as a matter of course, it may be of a shape other than this.

In addition, the convex portion 223 may be formed at an any position on the bottom surface 209, but it is desirable to place it on a more inward side on the bottom surface 209, than the corner portion where the side surface and the bottom surface 209 of the external covering material 205 intersect. This is because, by this means, it become possible for protrusion of the lead terminal 208 to secure a fixed distance from side surfaces of the external covering material 205, and it has a relaxation absorbing force against stress etc. from a side surface direction.

In addition, by such a matter that the lead terminal 209 is protruded from the convex portion 223, a space is naturally generated between the lead terminal 208 and the external covering material 205, and this space becomes margin as it is, and flexure resistance against vibration etc., which are applied to the electronic component 201, is improved. Further, in case that the convex portion 223 is disposed on the bottom surface 209 at a position which entered on a more inner side than the corner portion of the side surface and the bottom surface as described above, a distance between it and the side surface is generated, and it becomes possible to respond three-dimensional vibration of vibration which is applied in a horizontal direction, vibration which is applied in a vertical direction, and such vibration that they were combined, and flexure resistance of the lead terminal 208 becomes very strong so as to be able to respond to a three-dimensional one.

In addition, as represented in FIG. 31, the lead terminal 209 is once stretched to a lower side of the bottom surface 209 and protruded, and after that, folded back in a roughly L-letter shape, and thereby, flexure resistance is improved more.

Meanwhile, regardless of whether there is the convex portion 223 or not, the lead terminal 208 may be folded back to an outside or to an inside, after it was protruded. In case that it was folded back to an outside, it is possible to improve mounting strength, and in case that it was folded back to an inside, it is possible to reduce a mounting area.

In addition, the lead terminal 208 may be protruded from a front edge of the convex portion 223, and may be protruded from a side surface portion.

By the electronic component 201 which has the configurations as above, it becomes possible to realize the electronic component 201 in which flexure resistance is high and a life is long, with maintaining low cost, and it is possible to realize endurance, a longer life performance of an electronic device in which the electronic components 201 were mounted.

In particular, by such a matter that a material, which consists primarily of Ag and Pd, is used for the internal electrode of the multilayered capacitor, it is possible to realize one which excels in heat resistance, and therefore, it becomes possible to endure high temperature at the time of pouring of melted resin which forms the external covering material 205 and at the time of re-flow upon mounting, and it becomes possible to form by a simple manufacturing process, and it is possible to realize the molded electronic component 201 with high capacitance and high breakdown voltage, which was sealed with an external covering material with high shock resistance, endurance and flexure resistance, although it is of low cost, and it contributes to realization of longer life and improvement of reliability of an electronic device to which this was applied.

INDUSTRIAL APPLICABILITY

The invention is an electronic component which has an element, a pair of terminal portions which were disposed on the element, and an exterior covering member which covers a part of the terminal portions and the element, and by such a configuration that inclined portions are disposed on corner portions on a bottom surface and side surfaces of the external covering material, and the terminal portions are protruded from the corner portions where the inclined portions and the bottom surface of the external covering material intersect, is applicable to an application requiring electronic components with high flexure resistance against shock and vibration from an outside, which occur at the time of manufacture, transport and mounting, to terminal portions, or lead terminals which are protruded to an outside of the external covering material, with maintaining low cost as usual in manufacture of electronic components.

The invention is an electronic component which has an element, a pair of terminal portions which were disposed on the element, and an exterior covering member which covers a part of the terminal portions and the element, and by such a configuration that inclined portions are disposed on corner portions on a bottom surface and side surfaces of the external covering material, and the terminal portions are protruded from the corner portions where the inclined portions and the bottom surface of the external covering material intersect, is applicable to an application requiring electronic components with high flexure resistance against shock and vibration from an outside, which occur at the time of manufacture, transport and mounting, to terminal portions, or lead terminals which are protruded to an outside of the external covering material, with maintaining low cost as usual in manufacture of electronic components.

The invention is an electronic component which has a multilayered capacitor having a dielectric base body in which an internal electrode was buried, a pair of lead terminals which were disposed on the multilayered capacitor, and an external covering material which covers a part of the lead terminals, and the multilayered capacitor, and by such a configuration that the internal electrode is formed by a material which includes Ag and Pd, and the external covering material is any one of a roughly cuboid, a roughly cube, and a roughly square pillar, and the lead terminals are protruded from corner portions of a bottom surface and side surfaces of the external covering material, or the vicinity thereof, it is applicable to an application which requires an electronic component I which shock resistance, moisture resistance, endurance, and flexure resistance are high, over maintaining low cost in manufacture.

This application based upon and claims the benefit of priority of Japanese Patent Application No2004-165279 filed on Apr. 6, 2003, Japanese Patent Application of the No2004-184737 filed on Apr. 6, 1923, and Japanese Patent Application No2004-184738 filed on Apr. 6, 1923, the contents of which are incorporated herein by reference in its entirety.

The invention claimed is:

1. An electronic component, comprising:
an element;
a pair of terminal portions, which are disposed on the element and folded back so as to enable surface mounting; and
an external covering material, which covers both the element and a part of the terminal portions,
wherein the pair of terminal portions are protruded from a bottom surface of the external covering material, respectively, and
wherein a distance from a corner portion where an extended surface of a side surface of the external covering material and an extended surface of the bottom surface of the external covering material intersect, to a position where the terminal portion is protruded from the external covering material 0.1 mm or more.

2. The electronic component according to claim 1, wherein the pair of terminal portions increase in thickness to front edges.

3. The electronic component according to claim 1, wherein the pair of terminal portions decrease in thickness to front edges.

4. The electronic component according to claim 1, wherein the pair of terminal portions have reinforcing materials on non-mounting surfaces which are not surface-mounted.

5. The electronic component according to claim 4, wherein the pair of terminal portions have the reinforcing materials on peripheral portions of the non-mounting surfaces which are not surface-mounted.

6. The electronic component according to claim 1, wherein the element includes a dielectric body.

7. The electronic component according to claim 6, wherein the dielectric body is a plurality of multilayered dielectric base bodies, and an internal electrode is buried in the dielectric base body.

8. The electronic component according to claim 7, wherein the internal electrode includes at least one of silver and palladium.

9. The electronic component according to claim 8, wherein the internal electrode substantially includes nickel, and the dielectric base body is an anti-reducing material.

10. The electronic component according to claim 1, wherein the element is of plurality.

11. The electronic component according to claim 1, wherein the terminal portion has a flexure absorbing portion.

12. The electronic component according to claim 11, wherein the flexure absorbing portion is any shape of a curved surface, a wavy surface, and a folded portion, or a combination of these things.

13. The electronic component according to claim 1, wherein the external covering material is the shape of a roughly cuboid or a roughly cube.

14. The electronic component according to claim 1, wherein the external covering material has a convex portion on the bottom surface, and the pair of terminal portions are protruded from the convex portions, respectively.

15. The electronic component according to claim 1, wherein the convex portion is of a roughly circular pillar shape.

16. The electronic component according to claim 1, wherein the terminal portion substantially includes copper; and both the element and the terminal portion are connected by solder of which a melting point is 240 C or more.

17. The electronic component according to claim 1, wherein the terminal portion includes 42 alloy.

18. An electronic component, comprising:
an element;
a pair of terminal portions, which are disposed on the element and folded back so as to enable surface mounting; and
an external covering material, which covers both the element and a part of the terminal portions,
wherein the pair of terminal portions are protruded from a bottom surface of the external covering material, respectively,
wherein the bottom surface of the external covering material has an inclined portion for connecting an arbitrary position on a side surface of the external covering material and an arbitrary position on the bottom surface of the external covering material; and
wherein the pair of terminal portions are protruded from the inclined portions or boundaries of the inclined portions and the bottom surface, respectively.

19. The electronic component according to claim 18, wherein the inclined portion has a shape of a curved surface.

20. An electronic component, comprising:
an element;
a pair of terminal portions, which are disposed on the element and folded back so as to enable surface mounting; and
an external covering material, which covers both the element and a part of the terminal portions,
wherein the pair of terminal portions are protruded from a bottom surface of the external covering material, respectively, and
wherein the bottom surface of the external covering material has dent portion, and the pair of terminal portions are protruded from the dent portion, respectively.

21. The electronic component according to claim 20, wherein the dent portion is a cut-in portion which is formed after both the element and the part of the terminal portions are covered with the external covering material.

22. An electronic component, comprising:
an element;
a pair of terminal which are disposed on the element and folded back so as to enable surface mounting; and
an external covering material, which covers both the clement and a part of the terminal portions,
wherein the pair of terminal portions are protruded from a bottom surface of the external covering material, respectively, and
wherein the pair of terminal portions are thick in such a manner that thickness on an outside of the external covering material is thicker than thickness in an inside of the external covering material.

23. A manufacturing method of an electronic component, comprising:
placing an element;
connecting a pair of terminal portions to the element;
placing the element to which the terminal portions are connected, in a metal mold;
pouring a melted external covering material into the metal mold, up to such level that the terminal portions are protruded from a bottom surface of the external covering material; and
solidifying the poured external covering material.

24. The manufacturing method of the electronic component according to claim 23, wherein the external covering material is solidified with maintaining temperature of the terminal portion at lower temperature than ambient temperature.

* * * * *